United States Patent
Vellianitis

(10) Patent No.: US 11,289,580 B2
(45) Date of Patent: Mar. 29, 2022

(54) SEMICONDUCTOR DEVICE

(71) Applicant: TAIWAN SEMICONDUCTOR MANUFACTURING CO., LTD., Hsinchu (TW)

(72) Inventor: Georgios Vellianitis, Heverlee (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/902,072

(22) Filed: Jun. 15, 2020

(65) Prior Publication Data

US 2020/0312974 A1  Oct. 1, 2020

Related U.S. Application Data

(63) Continuation of application No. 16/415,557, filed on May 17, 2019, now Pat. No. 10,686,050.
(Continued)

(51) Int. Cl.
*H01L 21/00* (2006.01)
*H01L 29/00* (2006.01)
(Continued)

(52) U.S. Cl.
CPC .... *H01L 29/4908* (2013.01); *H01L 21/02181* (2013.01); *H01L 21/02192* (2013.01);
(Continued)

(58) Field of Classification Search
CPC ......... H01L 21/02192; H01L 21/02356; H01L 21/02271; H01L 21/28194; H01L 21/28176; H01L 21/28088; H01L 21/76224; H01L 21/02181; H01L 21/28185; H01L 21/02603; H01L 21/02532; H01L 21/28255;
(Continued)

(56) References Cited

U.S. PATENT DOCUMENTS 6,124,627 A * 9/2000 Rodder ............ H01L 21/28114
257/616
7,384,481 B2  6/2008 Atanackovic
(Continued)

FOREIGN PATENT DOCUMENTS

CN   101517717 A   8/2009
CN   101569005 A   10/2009
(Continued)

OTHER PUBLICATIONS

M.D. McDaniel et al., "A chemical route to monolithic integration of crystalline oxides on semiconductors," Advanced Materials Interfaces 1, 1400081 (8 pages) (2014).
(Continued)

*Primary Examiner* — Nikolay K Yushin
(74) *Attorney, Agent, or Firm* — McDermott Will & Emery LLP

(57) ABSTRACT

In a method of manufacturing a semiconductor device, a single crystal oxide layer is formed over a substrate. After the single crystal oxide layer is formed, an isolation structure to define an active region is formed. A gate structure is formed over the single crystal oxide layer in the active region. A source/drain structure is formed.

20 Claims, 51 Drawing Sheets

Related U.S. Application Data

(60) Provisional application No. 62/736,684, filed on Sep. 26, 2018.

(51) Int. Cl.

| | | |
|---|---|---|
| *H01L 29/49* | (2006.01) | |
| *H01L 29/786* | (2006.01) | |
| *H01L 21/02* | (2006.01) | |
| *H01L 21/28* | (2006.01) | |
| *H01L 29/66* | (2006.01) | |
| *H01L 29/06* | (2006.01) | |
| *H01L 29/423* | (2006.01) | |
| *H01L 29/51* | (2006.01) | |
| *H01L 21/762* | (2006.01) | |

(52) U.S. Cl.
CPC .................. *H01L 21/02194* (2013.01); *H01L 21/02532* (2013.01); *H01L 21/02603* (2013.01); *H01L 21/28088* (2013.01); *H01L 21/28176* (2013.01); *H01L 21/28194* (2013.01); *H01L 21/76224* (2013.01); *H01L 29/0653* (2013.01); *H01L 29/0673* (2013.01); *H01L 29/42392* (2013.01); *H01L 29/4966* (2013.01); *H01L 29/517* (2013.01); *H01L 29/66545* (2013.01); *H01L 29/66742* (2013.01); *H01L 29/78696* (2013.01)

(58) Field of Classification Search
CPC ......... H01L 21/02194; H01L 29/42392; H01L 29/66742; H01L 29/0673; H01L 29/4966; H01L 29/517; H01L 29/66545; H01L 29/78696; H01L 29/4908; H01L 29/165; H01L 29/0653; H01L 29/66628
See application file for complete search history.

(56) References Cited

U.S. PATENT DOCUMENTS

| | | | |
|---|---|---|---|
| 8,129,247 B2 | 3/2012 | Bangsaruntip et al. | |
| 8,362,567 B2 * | 1/2013 | Ohmi ................ | H01L 21/02057 257/368 |
| 10,263,100 B1 * | 4/2019 | Bi ......................... | B82Y 10/00 |
| 2006/0060131 A1 | 3/2006 | Atanackovic | |
| 2008/0121932 A1 | 5/2008 | Ranade | |
| 2010/0006954 A1 * | 1/2010 | Huang .............. | H01L 21/31645 257/410 |
| 2010/0059830 A1 * | 3/2010 | Ohmi ................ | H01L 29/41766 257/377 |
| 2016/0204218 A1 * | 7/2016 | Grass .............. | H01L 21/823857 257/288 |
| 2017/0170267 A1 | 6/2017 | Rosenblatt et al. | |
| 2018/0197886 A1 | 7/2018 | Cheng et al. | |

FOREIGN PATENT DOCUMENTS

| | | |
|---|---|---|
| CN | 102640270 A | 8/2012 |
| CN | 107346782 A | 11/2017 |
| CN | 108074983 A | 5/2018 |
| CN | 108242470 A | 7/2018 |
| JP | 2009-538542 A | 11/2009 |
| WO | 2007/140037 A2 | 12/2007 |

OTHER PUBLICATIONS

Takanori Kiguchi et al., "Solid state epitaxy of (Hf,Zr)O2 thin films with orthorhombic phase," Journal of the Ceramic Society of Japan, 124 (6): 689-693 (2016).

S.R. Bakaul, "Single crystal functional oxides on silicon,". Nature Communications, 7: 10547 (5 pages) (2016).

A. Dimoulas et al., "La2 Hf2 O7 La2Hf2O7 high-k gate dielectric grown directly on Si(001) by molecular-beam epitaxy," Applied Physics Letters, vol. 85, Issue 15, pp. 3205-3207 (2004).

R. A. McKee et al., "Crystalline Oxides on Silicone: The First Five Monolayers," Physical Review Letters, vol. 81, No. 14, pp. 3014-3017 (1998).

Notice of Allowance issued in U.S. Appl. No. 16/415,557, dated Feb. 5, 2020.

Non-Final Office Action issued in U.S. Appl. No. 16/415,557, dated Sep. 3, 2019.

Liu Yu-Rong et al., "Low-operating-voltage polymer thin-film transistors based on poly (3-hexylthiophene)", ACTA Physica Sinica, vol. 59, No. 11 (Nov. 2010).

\* cited by examiner

SEMICONDUCTOR DEVICE

CROSS REFERENCE TO RELATED APPLICATIONS

This application is continuation of U.S. patent application Ser. No. 16/415,557 filed May 17, 2019, now U.S. Pat. No. 10,686,050, which claims priority of U.S. Provisional Patent Application No. 62/736,684 filed on Sep. 26, 2018, each of which disclosure is entirely incorporated herein by reference.

BACKGROUND

A dielectric layer for field effect transistors or ferroelectric devices is one of the key element of highly reliable semiconductor devices. In future semiconductor devices, crystalline oxides might be needed to be used as a gate dielectric layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
FIG. 1 shows one of the various stages of manufacturing a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

For a FET or a ferroelectric device according to embodiments of the present disclosure, a crystalline dielectric layer is mono-crystalline and has specific crystal phase, symmetry and abrupt interfaces to a channel. When crystalline oxides are needed as a gate dielectric layer, an oxide layer is deposited on the channel by various methods, such as chemical vapor deposition (CVD) or atomic layer deposition (ALD) in an amorphous or polycrystalline phase. When a gate replacement technology is employed for a FET device, this deposition is performed in the back-end (or middle end depending on process), after an interlayer dielectric (ILD) layer is formed, followed by chemical mechanical polishing (CMP) and dummy gate removal. After the deposition, a high temperature anneal is used to crystallize the oxide to the targeted phase. In a gate replacement technology, the oxide layer for a gate dielectric layer is formed over a narrow space formed by sidewall spacers after a dummy gate electrode and a dummy gate dielectric layer are removed.

Usually the crystallization temperature which is required to convert an amorphous oxide layer to a single crystal oxide layer is very high taking into account that this thermal treatment is performed at the back-end (or middle-end) process, which does not allow temperature higher than, for example, 400° C. This limits choices of materials to oxides which can be crystallized at lower temperature. In some cases, the annealing process for crystallization does not necessarily realize full crystallization of the oxide or to realize desired crystallization phase (e.g., orthorhombic, monoclinic, cubic or tetragonal). In addition, crystallization of oxide through annealing may result in a dielectric having a part of which total thickness (e.g., a region close to the channel) is a transition region with non-ideal crystallization and properties. Further, when an oxide film is formed over a non-flat, uneven surface, e.g., a gate space after a dummy (sacrificial) gate is removed, and/or over an amorphous layer, such as sidewall spacers, the oxide may not be formed as a single crystal.

In the present disclosure, a single crystal oxide layer is formed at an early stage of the semiconductor manufacturing operations. More specifically, the crystalline oxide is formed over a large, flat surface on which no etching operation or patterning operation has been performed. In some embodiments, the single crystal oxide layer is formed over a device region of the substrate before a shallow trench isolation (STI) as an isolation insulating layer is formed or fin structures are formed. In some embodiments, the single crystal oxide layer is formed after alignment marks or other non-circuitry elements are formed in a scribe lane of the substrate.

FIGS. 1-14 show various stages of manufacturing a semiconductor FET device according to an embodiment of the present disclosure. It is understood that additional operations can be provided before, during, and after the operations shown by FIGS. 1-14, and some of the operations described below can be replaced or eliminated, for additional embodiments of the method. The order of the operations/processes may be interchangeable. Further, in the present disclosure, a source and a drain refer are interchangeably used and a source/drain refers to at least one of a source and a drain.

As shown in FIG. 1, a substrate 10 is provided. In some embodiments, the substrate 10 includes a single crystal semiconductor layer on at least its surface portion. The substrate 10 may comprise a single crystal semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si, SiGe or Ge. The substrate 10 may include in its surface region, one or more buffer layers (not shown) in some embodiments. The buffer layers can serve to gradually change the lattice constant from that of the substrate to that of the source/drain regions. The buffer layers may be formed from epitaxially grown single crystal semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The crystal orientation of the major surface of the substrate, on which a semiconductor device is formed, is (100), (110) or (111), depending on the kind of a crystalline oxide formed thereon.

Figure 2:
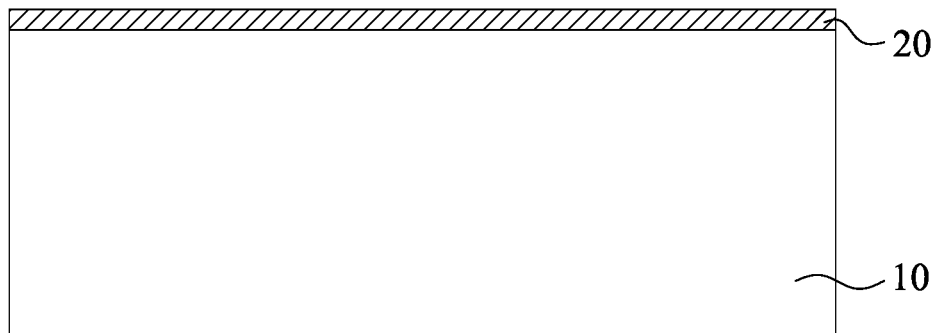
FIG. 2 shows one of the various stages of manufacturing a semiconductor FET device according to an embodiment of the present disclosure.

As shown in FIG. 2, a single crystal oxide layer 20 is formed over the substrate 10. As set forth above, the single crystal oxide layer 20 is formed on a large and flat surface. In particular, no etching or patterning operations to generate uneven topography have been performed on at least a device region, in which a semiconductor circuit is formed, of the substrate, and the single crystal oxide layer 20 is formed over such a flat device region. In some embodiments, the single crystal oxide layer 20 is formed directly on the substrate 10.

In some embodiments, the single crystal oxide layer is made of one selected from the group consisting of $HfO_2$, $La_2Hf_2O_7$, $Y_2O_3$, $SrTiO_3$ and $HfZrO_2$. In certain embodiments, $La_2Hf_2O_7$ or $Y_2O_3$ is formed on a (100) Si substrate. In other embodiments, $SrTiO_3$ is formed on a (100) Ge substrate. Oxides of lanthanides and actinides or ternary combinations thereof can be used as long as the oxides have substantially similar lattice constants to the substrate (lattice match).

In some embodiments, a thickness of the single crystal oxide layer 20 is in a range from about 0.5 nm to about 10 nm, and is in a range from about 1 nm to 5 nm in other embodiments. The single crystal oxide layer 20 can be formed by CVD, ALD, molecular beam epitaxy (MBE) or other suitable epitaxial film formation methods. In some embodiments, the growth temperature (e.g., substrate temperature) is in a range from about 650° C. to about 1000° C. In some embodiments, after the single crystal oxide layer 20 is formed, an annealing operation at a temperature in a range from about 650° C. to about 1000° C. to improve crystallinity.

In other embodiments, an amorphous or polycrystalline oxide layer is formed over the substrate 10, and then an annealing operation at a temperature in a range from about 650° C. to about 1000° C. is performed to convert the amorphous or polycrystalline oxide layer into a single crystal oxide layer 20. In some embodiments, the temperature is in a range from about 300° C. to about 650° C.

Figure 3:
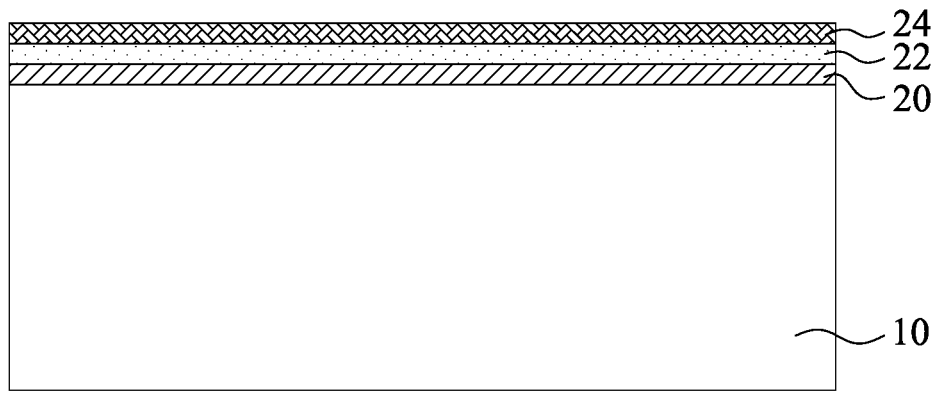
FIG. 3 shows one of the various stages of manufacturing a semiconductor FET device according to an embodiment of the present disclosure.

Then, as shown in FIG. 3 a hard mask layer including a lower layer 22 and an upper layer 24 is formed on the single crystal oxide layer 20. In some embodiments, the lower layer 22 is silicon oxide and the upper layer 24 is silicon nitride. The hard mask layers can be formed by CVD.

Figure 4:
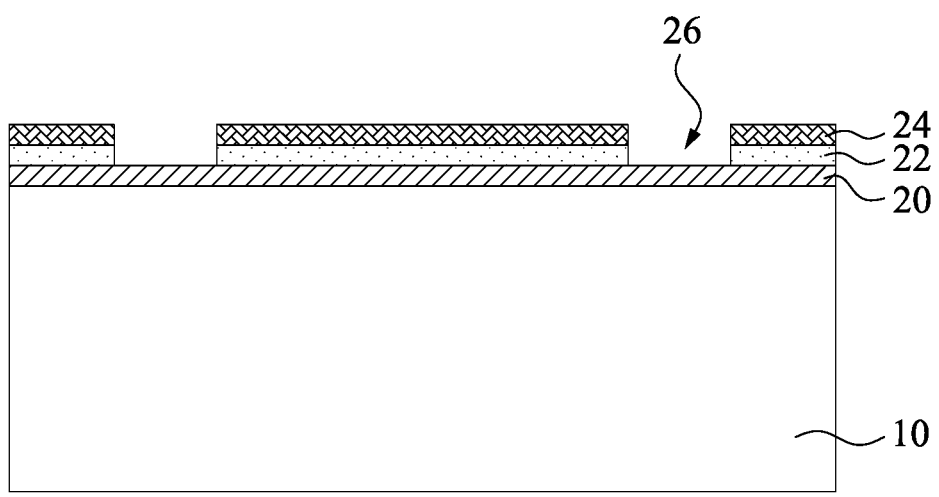
FIG. 4 shows one of the various stages of manufacturing a semiconductor FET device according to an embodiment of the present disclosure.
Figure 5:
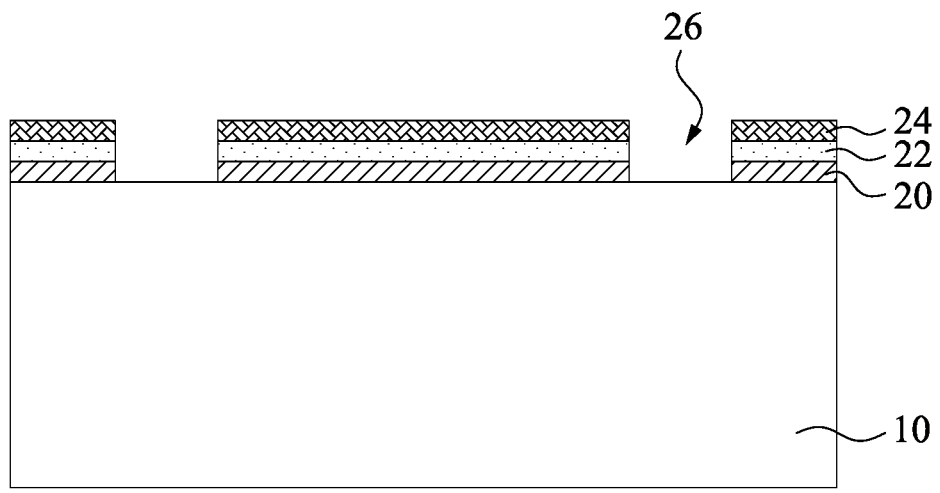
FIG. 5 shows one of the various stages of manufacturing a semiconductor FET device according to an embodiment of the present disclosure.

Next, as shown in FIG. 4, the hard mask layer is patterned by one or more lithography and etching operations to form spaces 26. Further, as shown in FIG. 5, the single crystal oxide layer 20 is etched by using the patterned hard mask layer. In some embodiments, etching of the hard mask layer and etching of the single crystal oxide layer 20 are continuously performed.

Figure 6:
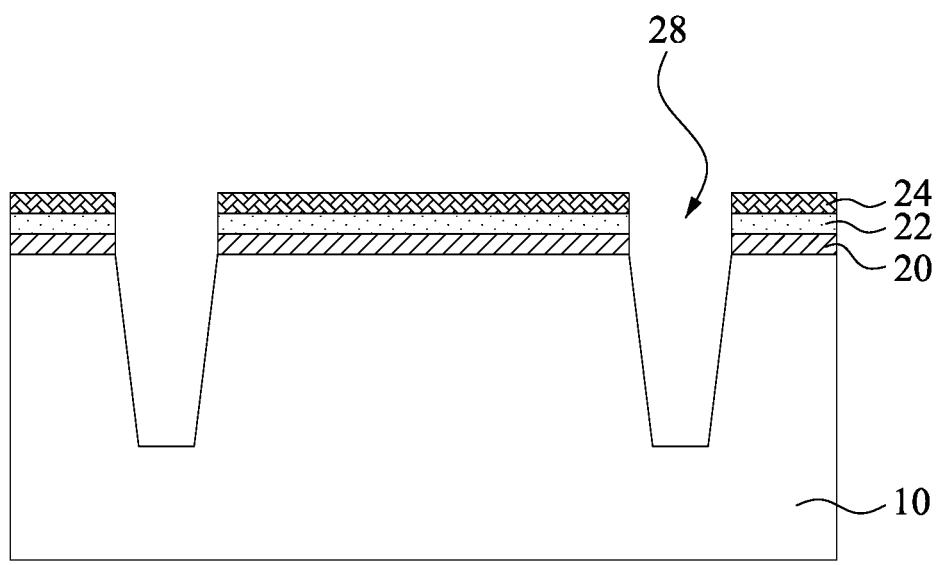
FIG. 6 shows one of the various stages of manufacturing a semiconductor FET device according to an embodiment of the present disclosure.
Figure 7:
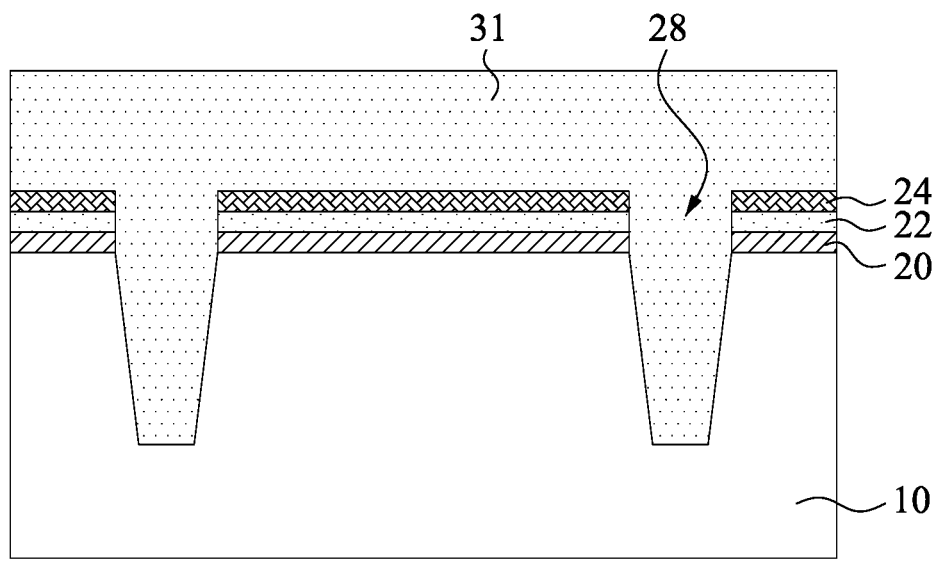
FIG. 7 shows one of the various stages of manufacturing a semiconductor FET device according to an embodiment of the present disclosure.
Figure 8:
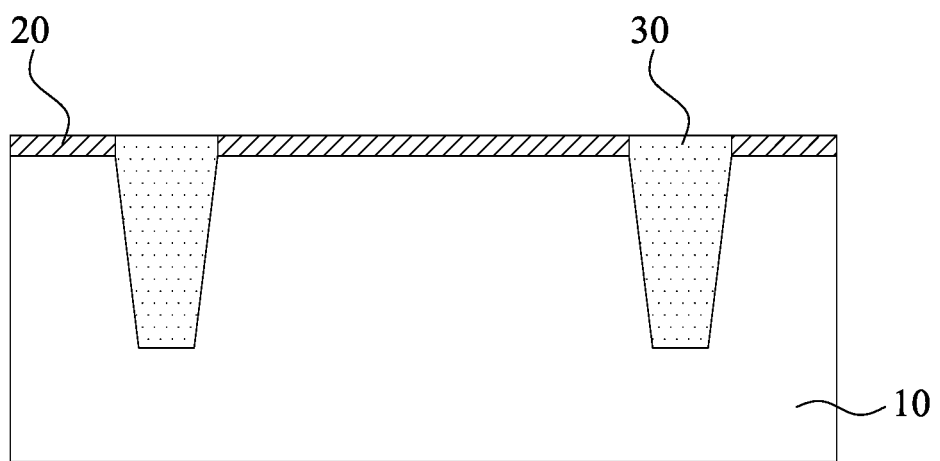
FIG. 8 shows one of the various stages of manufacturing a semiconductor FET device according to an embodiment of the present disclosure.

Then, as shown in FIG. 6, the substrate 10 is trench-etched to form trenches 28. Subsequently, an insulating material layer 31 including one or more layers of insulating material is formed over the substrate, as shown in FIG. 7. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the single crystal oxide layer 20 is exposed from the insulating material layer and shallow trench isolation (STI) regions 30 are formed, as shown in FIG. 8. In some embodiments, the planarization operation stops at one of the lower hard mask layer 22 or the upper hard mask layer 24, and then the remaining hard mask layer is removed by suitable wet and/or dry etching operations.

Figure 9:
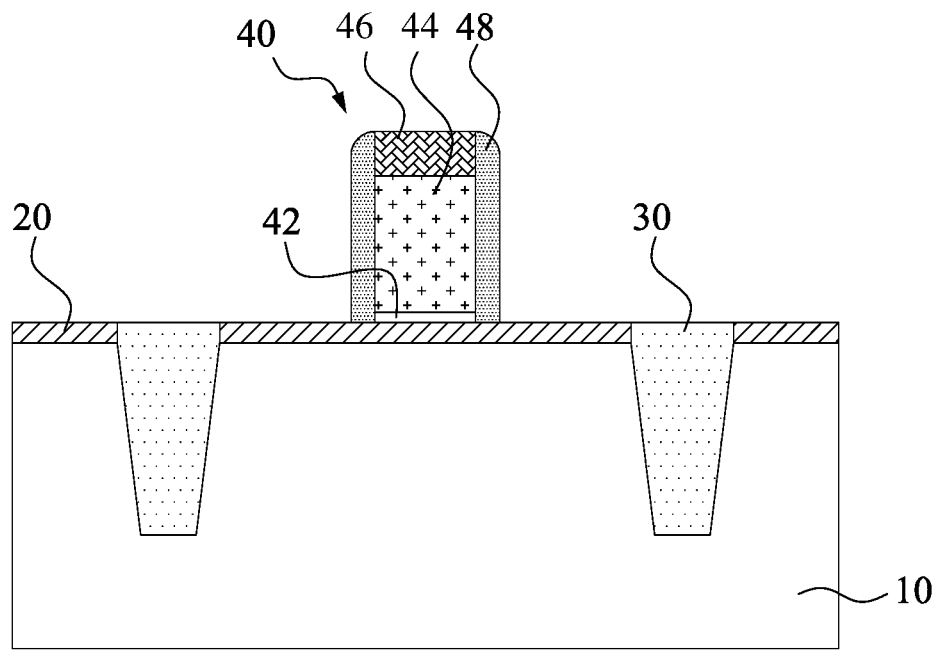
FIG. 9 shows one of the various stages of manufacturing a semiconductor FET device according to an embodiment of the present disclosure.

Then, a sacrificial (dummy) gate structure 40 is formed, as shown in FIG. 9. The sacrificial gate structure 40 includes a sacrificial gate dielectric layer 42, a sacrificial gate electrode layer 44 and a residual hard mask layer 46 in some embodiments. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments. The sacrificial gate structure 40 is formed by first blanket depositing the sacrificial gate dielectric layer 42 over the single crystal oxide layer 20 and STI 30. A sacrificial gate electrode layer 44 is then blanket deposited on the sacrificial gate dielectric layer and a hard mask layer 46 is formed over the sacrificial gate electrode layer 44. The sacrificial gate electrode layer 44 includes silicon such as polycrystalline silicon or amorphous silicon. The thickness of the sacrificial gate electrode layer 44 is in a range from about 100 nm to about 200 nm in some embodiments. In some embodiments, the sacrificial gate electrode layer 44 is subjected to a planarization operation. The sacrificial gate dielectric layer and the sacrificial gate electrode layer are deposited using CVD, including LPCVD and PECVD, PVD, ALD, or other suitable process. Subsequently, the hard mask layer 46 is formed over the sacrificial gate electrode layer. The hard mask layer 46 includes one or more layers, such as a pad SiN layer and a silicon oxide mask layer. Next, a patterning operation is performed on the mask layer and sacrificial gate electrode layer is patterned. Further, sidewall spacers 48 are formed on opposite side faces of the sacrificial gate electrode layer 44 and the hard mask layer 46, as shown in FIG. 9.

Figure 10:
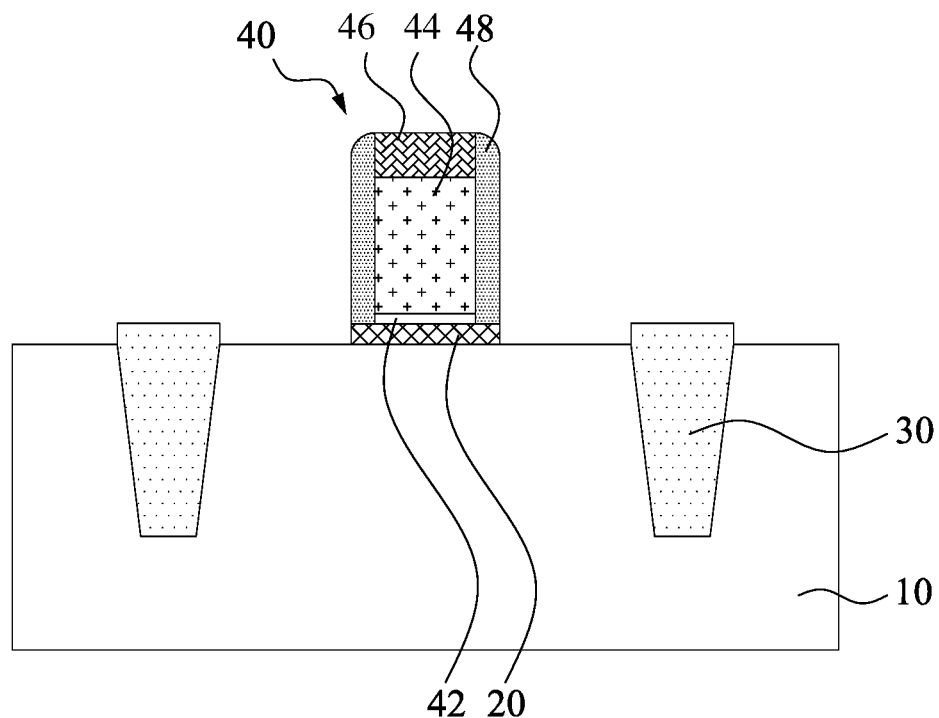
FIG. 10 shows one of the various stages of manufacturing a semiconductor FET device according to an embodiment of the present disclosure.
Figure 11:
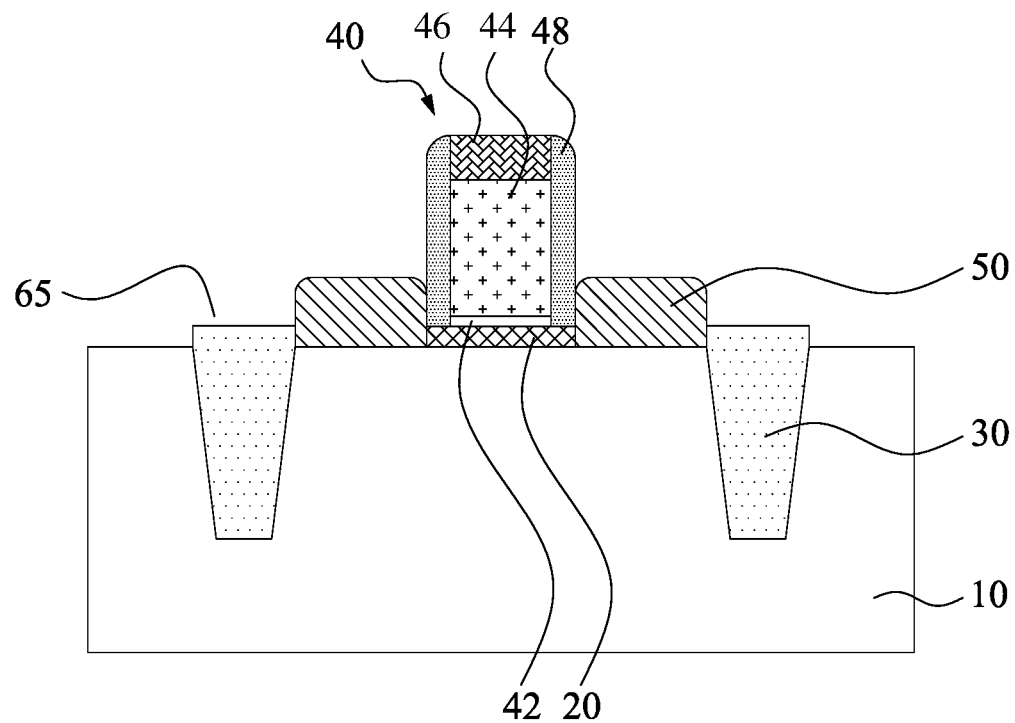
FIG. 11 shows one of the various stages of manufacturing a semiconductor FET device according to an embodiment of the present disclosure.

Further, as shown in FIG. 10, the single crystal oxide layer 20 not covered by the sacrificial gate structure 40 is removed by a suitable etching operation. Further, as shown in FIG. 11, one or more layers of semiconductor material, as a source/drain epitaxial layer 50, are formed over source/drain regions as shown in FIG. 11. The source/drain epitaxial layer 50 includes one or more layers of Si, SiP, SiC and SiCP for an n-channel FET or Si, SiGe, Ge for a p-channel FET. For the P-channel FET, boron (B) may also be contained in the source/drain region. The source/drain epitaxial layer 50 is formed by an epitaxial growth method using CVD, ALD or MBE.

Figure 12:
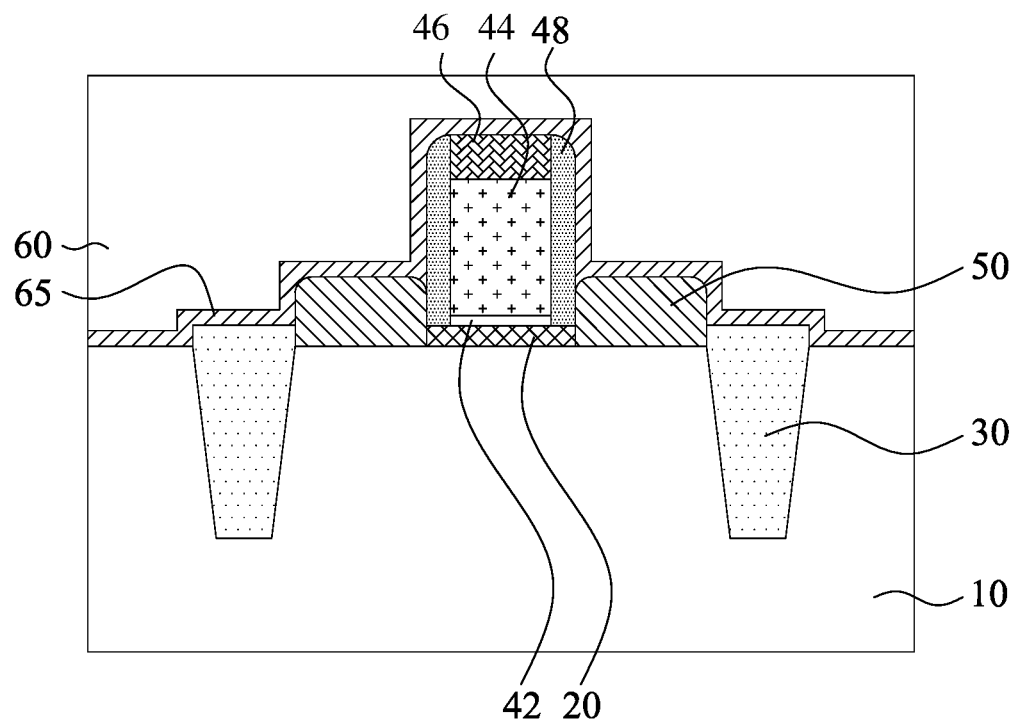
FIG. 12 shows one of the various stages of manufacturing a semiconductor FET device according to an embodiment of the present disclosure.
Figure 13:
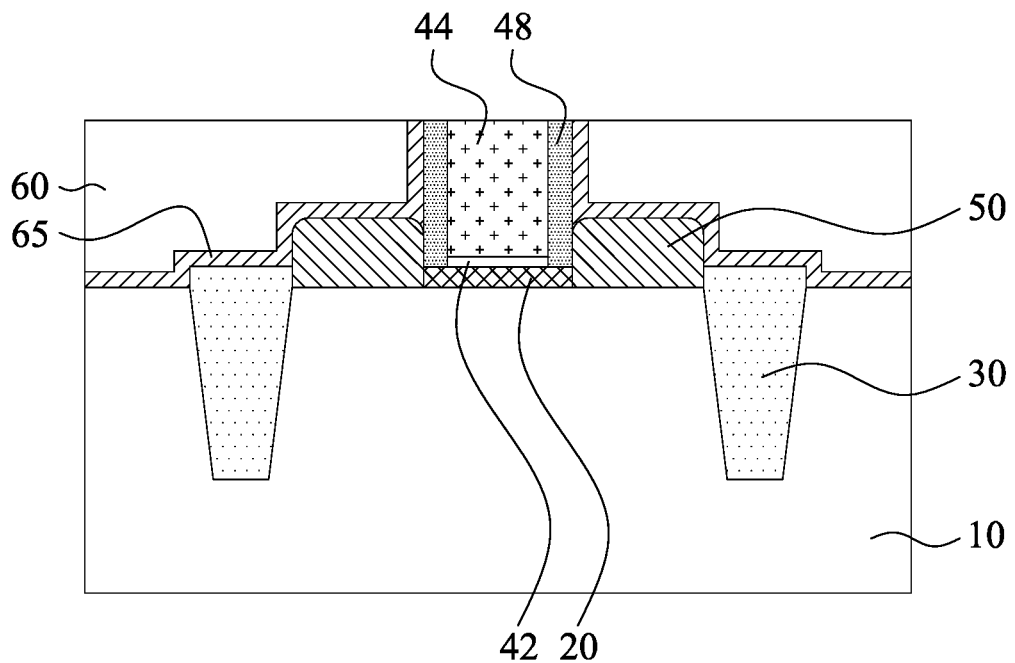
FIG. 13 shows one of the various stages of manufacturing a semiconductor FET device according to an embodiment of the present disclosure.

Then, as shown in FIG. 12, an interlayer dielectric (ILD) layer 60 is formed over the S/D epitaxial layer 50 and the sacrificial gate structure 40. The materials for the ILD layer 60 include compounds comprising Si, O, C and/or H, such as silicon oxide, SiCOH and SiOC. Organic materials, such as polymers, may be used for the ILD layer 60. After the ILD layer 60 is formed, a planarization operation, such as CMP, is performed, so that the top portion of the sacrificial gate electrode layer 44 is exposed, as shown in FIG. 13. In some embodiments, before the ILD layer 60 is formed, a contact etch stop layer 65, such as a silicon nitride layer or a silicon oxynitride layer, is formed as shown in FIG. 13.

Then, the sacrificial gate electrode layer 44 and the sacrificial gate dielectric layer 42 are removed, thereby forming a gate space. The sacrificial gate structures can be removed using plasma dry etching and/or wet etching. When the sacrificial gate electrode layer 44 is polysilicon and the ILD layer 60 is silicon oxide, a wet etchant such as a TMAH solution can be used to selectively remove the sacrificial gate electrode layer 44. The sacrificial gate dielectric layer 42 is thereafter removed using plasma dry etching and/or wet etching.

Figure 14:
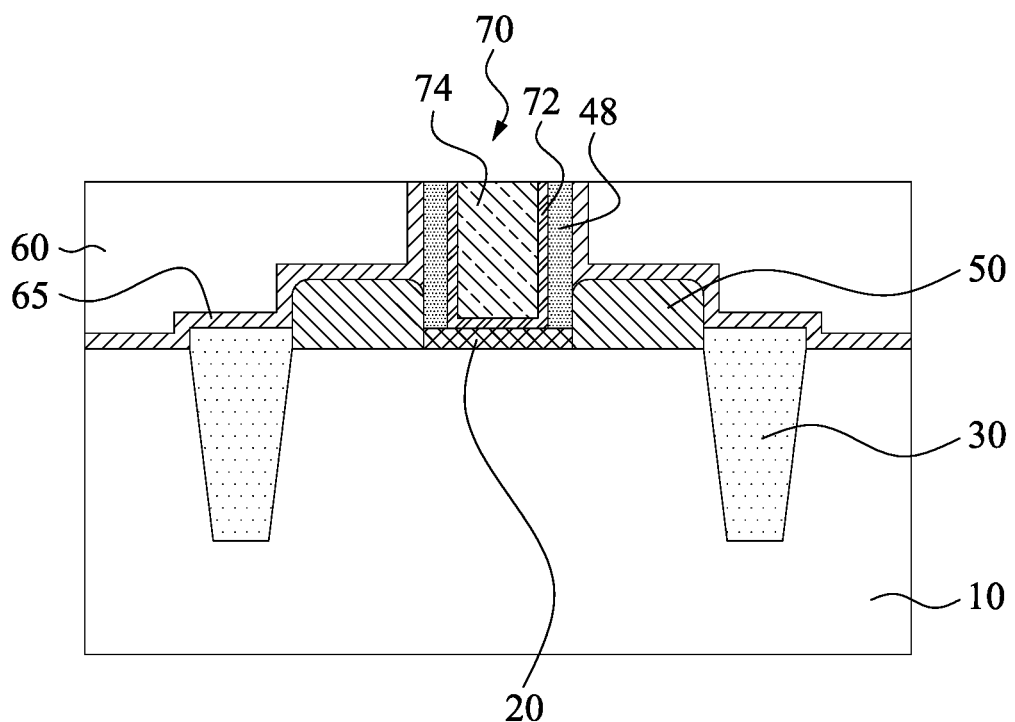
FIG. 14 shows one of the various stages of manufacturing a semiconductor FET device according to an embodiment of the present disclosure.

After the sacrificial gate structures are removed, a metal gate electrode 70 is formed on the single crystal oxide layer 20 as a gate electrode layer in the gate space, as shown in FIG. 14. The metal gate electrode layer 70 includes one or more layers of a work function adjustment material 72 and a body gate electrode layer 74.

The work function adjustment layers 72 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer 72 may be formed by ALD, PVD, CVD, e-beam evaporation, or other suitable process. Further, the work function adjustment layer 72 may be formed separately for the n-channel FET and the p-channel FET which may use different metal layers.

The body gate electrode layer 74 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The body gate electrode layer 74 may be formed by CVD, ALD, electroplating, or other suitable method. The metal gate electrode layer is also deposited over the upper surface of the ILD layer 60. The metal gate electrode layer formed over the ILD layer 60 is then planarized by using, for example, CMP, until the top surface of the ILD layer 60 is revealed. In some embodiments, after the planarization operation, the metal gate electrode layer 70 is recessed and a cap insulating layer (not shown) is formed over the recessed gate electrode layer. The cap insulating layer includes one or more layers of a silicon nitride-based material, such as SiN. The cap insulating layer can be formed by depositing an insulating material followed by a planarization operation.

It is understood that the FET undergoes further CMOS processes to form various features such as contacts/vias, interconnect metal layers, dielectric layers, passivation layers, etc.

As shown in FIG. 14, a single crystal oxide layer as a gate dielectric layer is first formed on a flat substrate and then a gate replacement operation to form a metal gate electrode is performed. Accordingly, the gate dielectric layer is not formed in the gate space formed by removing the sacrificial gate structure. In this configuration, the single crystal oxide layer 20 is disposed between bottoms of the sidewall spacers 48 and the substrate 10. Further, there is no single crystal oxide layer between the sidewall spacers 48 and the metal gate electrode 70, and thus, the work function adjustment layer 72 is in direct contact with the sidewall spacers 48. Thus, it is possible to increase an effective gate length under the metal gate electrode 70 because there is no insulating layer between the sidewall spacers 48 and the metal gate electrode 70.

FIGS. 15-28D show various stages of manufacturing a semiconductor FET device according to an embodiment of the present disclosure. It is understood that additional operations can be provided before, during, and after processes shown by FIGS. 15-28D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-14 may be employed in the embodiment of FIGS. 15-28D, and detailed explanation thereof may be omitted.

Figure 15:
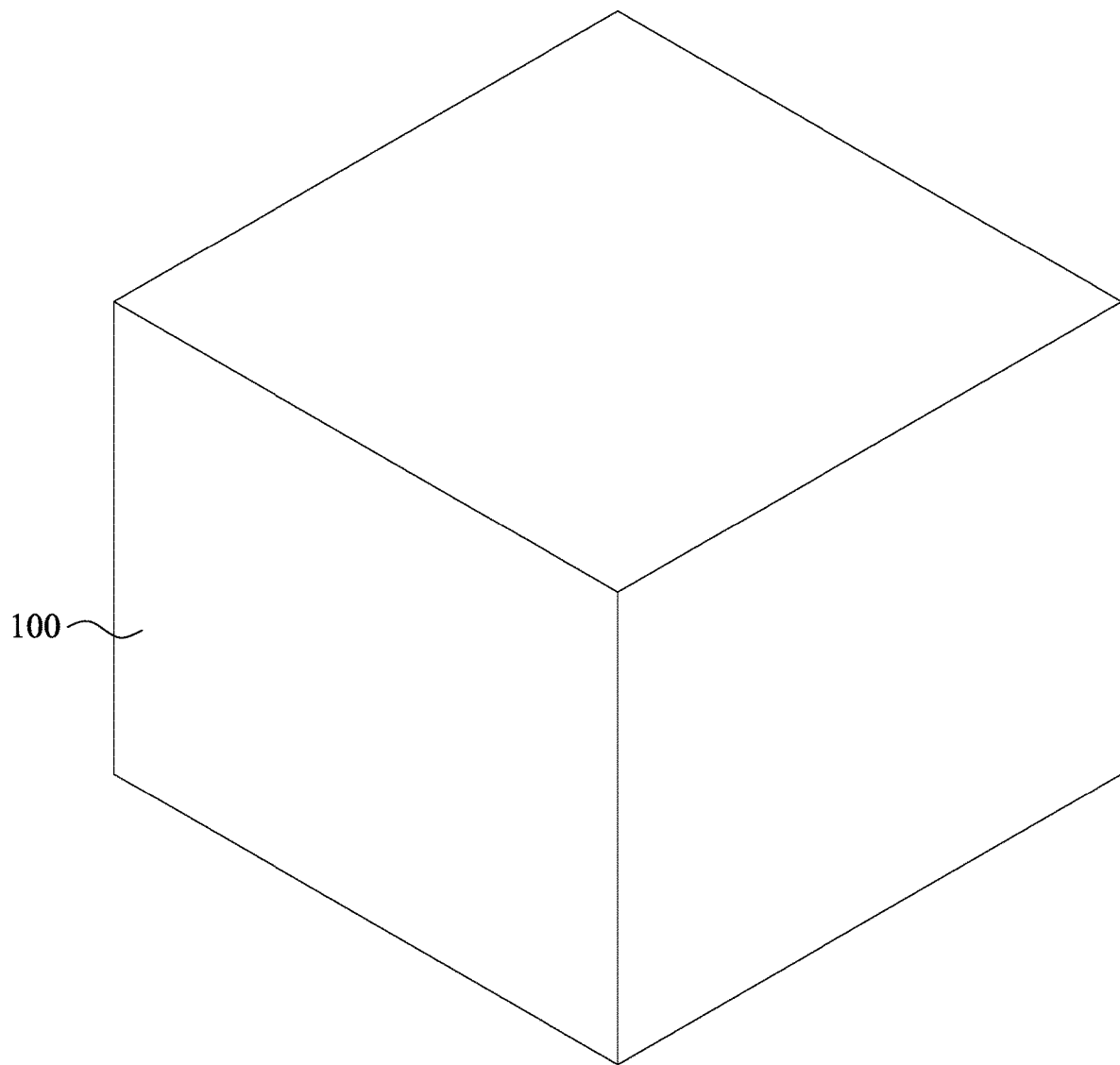
FIG. 15 shows one of the various stages of manufacturing a semiconductor FET device according to another embodiment of the present disclosure.

As shown in FIG. 15, a substrate 100 is provided. In some embodiments, the substrate 100 includes a single crystal semiconductor layer on at least its surface portion. The substrate 100 may comprise a single crystal semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si, SiGe or Ge.

Figure 16:
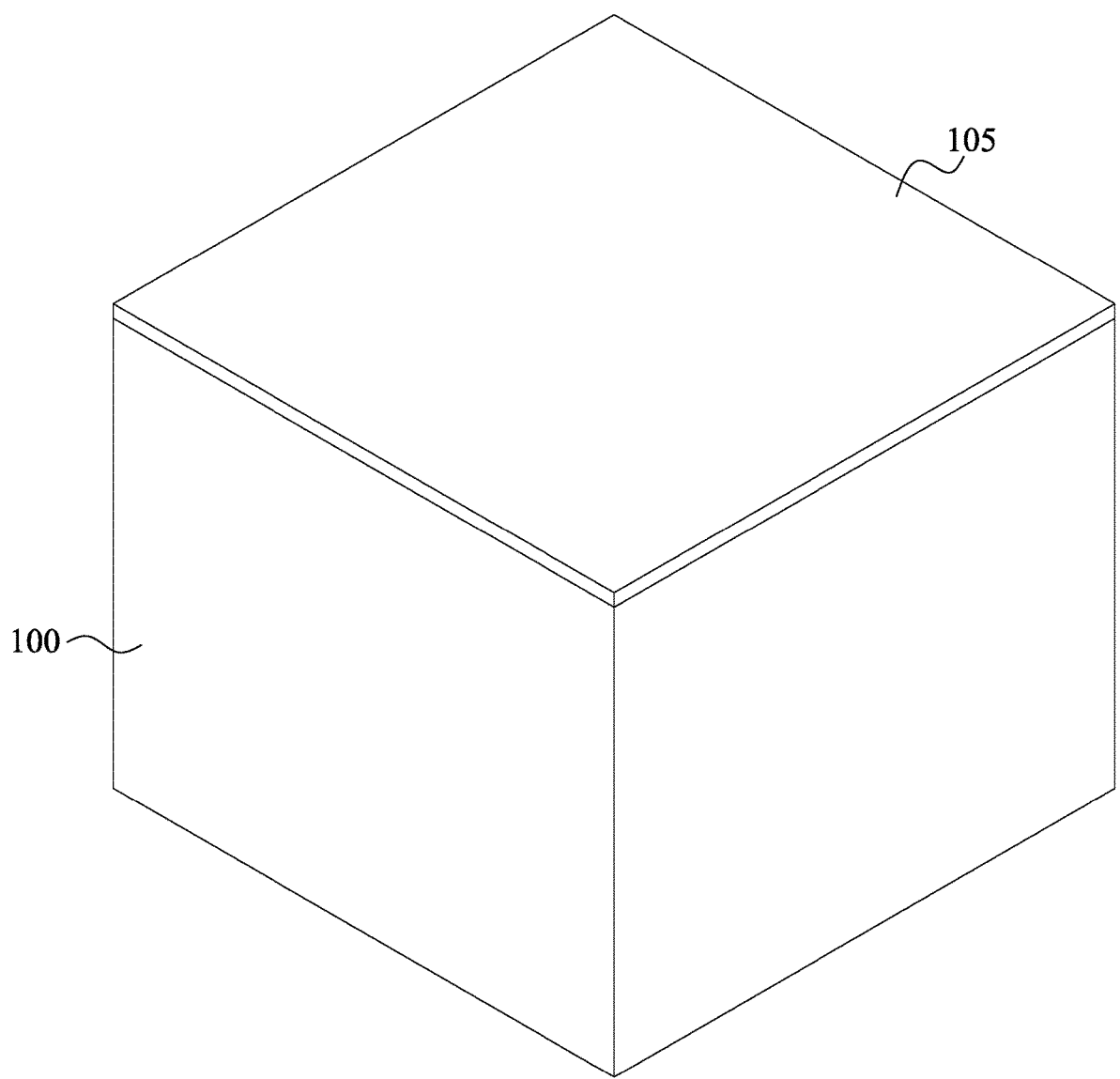
FIG. 16 shows one of the various stages of manufacturing a semiconductor FET device according to another embodiment of the present disclosure.

As shown in FIG. 16, a first semiconductor layer 105 as a sacrificial layer is formed over the substrate 100. The first semiconductor layer 105 can function as a buffer semiconductor layer in some embodiments. The first semiconductor layer may be formed from epitaxially grown single crystal semiconductor materials such as, but not limited to Si, Ge, GeSn, SiGe, GaAs, InSb, GaP, GaSb, InAlAs, InGaAs, GaSbP, GaAsSb, GaN, GaP, and InP. In some embodiments, the substrate 100 is single crystal silicon, and the first semiconductor layer 105 is single crystal silicon germanium (SiGe) epitaxially grown on the silicon substrate 100. The germanium concentration of the SiGe layer may increase from 30 atomic % germanium for the bottom-most buffer layer to 70 atomic % germanium for the top-most buffer layer. In some embodiments, the first semiconductor layer is made of $Si_xGe_{1-x}$ and the substrate is made of $Si_zGe_{1-z}$, where $x<z\leq1$. In certain embodiments, $0.2<x\leq0.6$ and $0.7<z\leq1$. The thickness of the first semiconductor layer 105 is in a range from about 5 nm to about 30 nm in some embodiments. The first semiconductor layer 105 is formed by an epitaxial growth method using CVD, ALD or MBE.

Figure 17A:
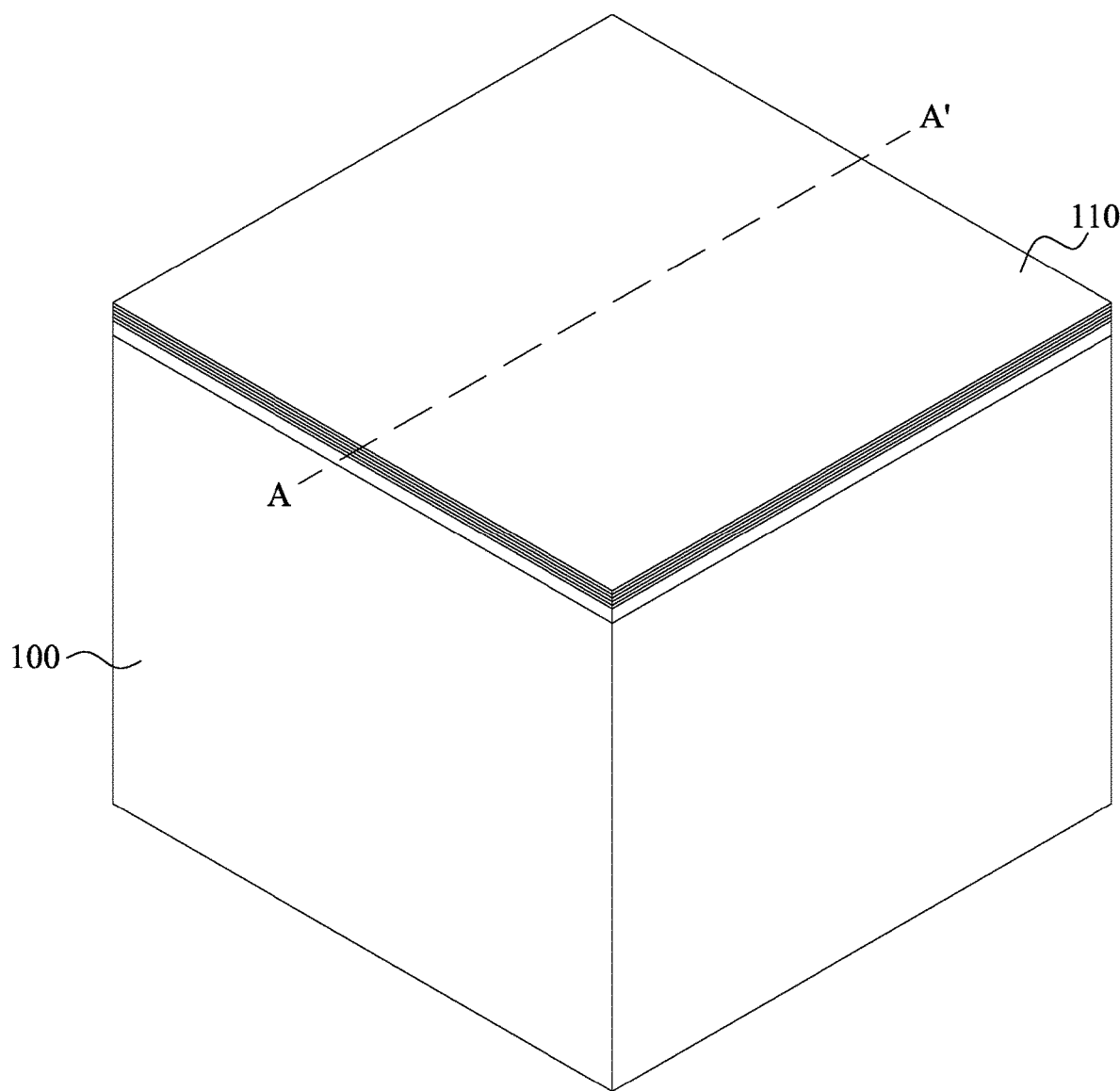
FIGS. 17A and 17B show one of the various stages of manufacturing a semiconductor FET device according to another embodiment of the present disclosure.
Figure 17B:

Then, as shown in FIGS. 17A and 17B, one or more pairs of layers of a single crystal oxide layer 110 and a second semiconductor layer 120 on the single crystal oxide layer 110 are formed on the first semiconductor layer 105, followed by forming a top single crystal oxide layer 110. The formation of the single crystal oxide layer 110 is the same as or similar to the formation of the single crystal oxide layer 20 as set forth above. The second semiconductor layer 120 is formed by an epitaxial growth method using CVD, ALD or MBE. In FIGS. 17A and 17B, two pairs of the single crystal oxide layer 110 and the second semiconductor layer 120 are formed. However, the number of the pairs is not limited thereto, and it can be one or more than two. In some embodiments, the number of the pairs is up to 20.

The thickness of each of the single crystal oxide layer 110 in the pairs and the top single crystal oxide layer is in a range from about 0.5 nm to about 10 nm, and is in a range from about 1 nm to 5 nm in other embodiments. In some embodiments, the thickness of the top single crystal oxide layer 110 is greater or smaller than the thickness of the single crystal oxide layer 110 in the pairs of layers. In some embodiments, the thickness of the single crystal oxide layer 110 varies among the pairs of layer.

In some embodiments, the first semiconductor layer 105 is made of $Si_xGe_{1-x}$ and the second semiconductor layer 120 is made of $Si_yGe_{1-y}$, where $x<y\leq1$. In certain embodiments, $0.2<x<0.6$ and $0.7<y\leq1$. In some embodiments, the second semiconductor layer 120 is same material as the substrate 100. The thickness of the second semiconductor layer 120 is in a range from about 5 nm to about 40 nm, and is in a range from about 10 nm to 30 nm in other embodiments.

Figure 18:
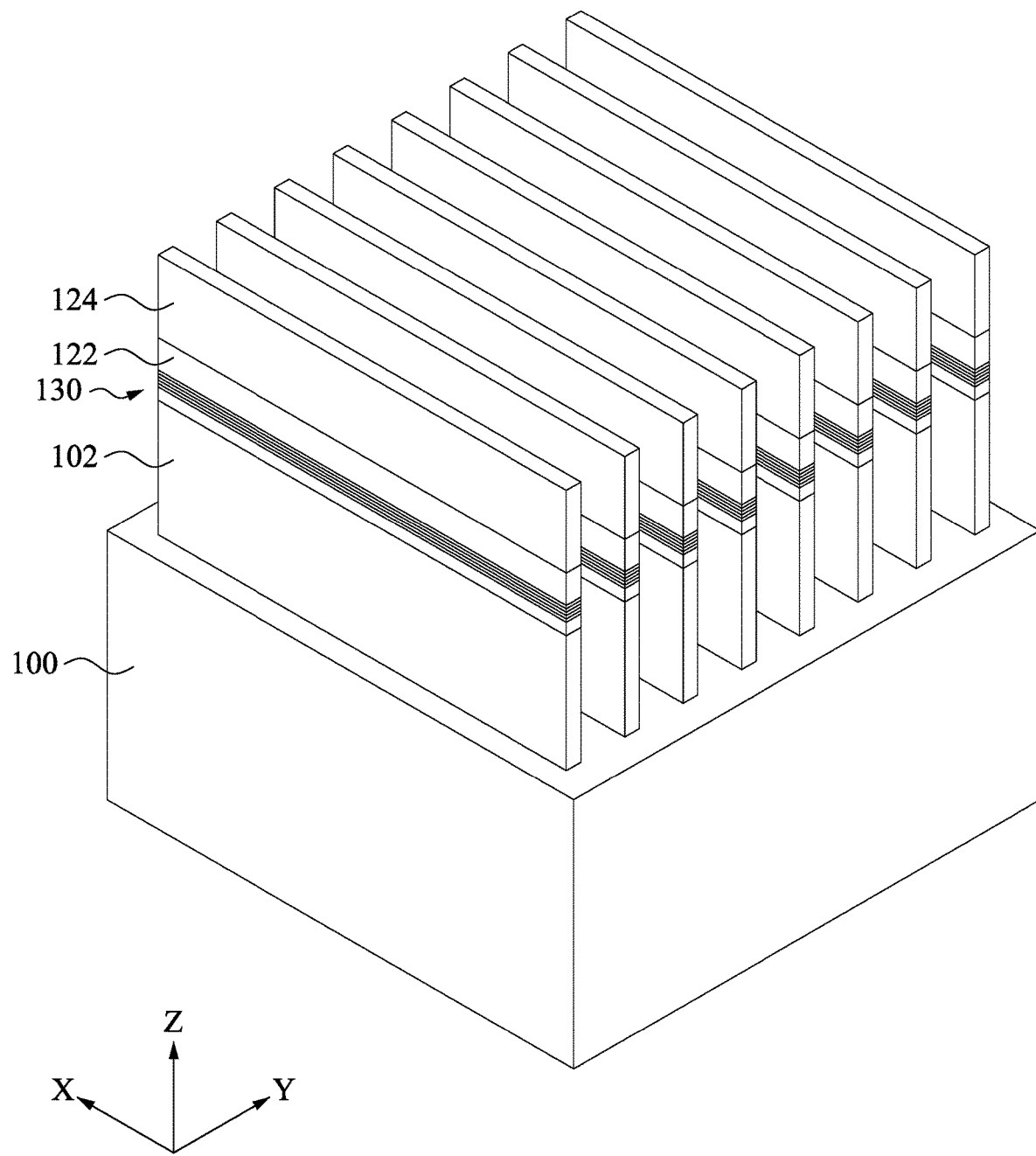
FIG. 18 shows one of the various stages of manufacturing a semiconductor FET device according to another embodiment of the present disclosure.

Then, the top crystalline oxide layer, the one or more pairs of layers of the crystalline oxide 110 and the second semiconductor layer 120, the first semiconductor layer 105 and a part of the semiconductor substrate 100 are patterned into one or more fin structures 130 by using one or more lithography and etching operations, as shown in FIG. 18.

In some embodiments, a first mask layer 122 and a second mask layer 124 are formed over the top single crystal oxide layer 110. The first mask layer 122 is a pad oxide layer made of a silicon oxide, which can be formed by a thermal oxidation. The second mask layer 124 is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layers are patterned into a mask pattern by using patterning operations including photo-lithography and etching.

Then, the stacked layers of the top crystalline oxide layer, the one or more pairs of layers of the crystalline oxide 110 and the second semiconductor layer 120, the first semiconductor layer 105 and a part of the semiconductor substrate 100 are patterned by using the patterned mask layers 122, 124, thereby forming fin structures 130 extending in the X direction. In FIG. 18, eight fin structures 130 are arranged in the Y direction. But the number of the fin structures is not limited to eight, and may be 1-7 or more than 8. In some embodiments, one or more dummy fin structures are formed on both sides of the fin structures 130 to improve pattern fidelity in the patterning operations. As shown in FIG. 18, the fin structures 130 have upper portions constituted by the top crystalline oxide layer, the one or more pairs of layers of the crystalline oxide 110 and the second semiconductor layer 120 and the first semiconductor layer 105, and a bottom fin structure 102 constituted by the part of the semiconductor substrate 100. The width of the upper portion of the fin structure 130 along the Y direction is in a range from about 5 nm to about 40 nm in some embodiments, and is in a range from about 10 nm to about 25 nm in other embodiments.

The fin structures 130 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structure 130.

Figure 19A:
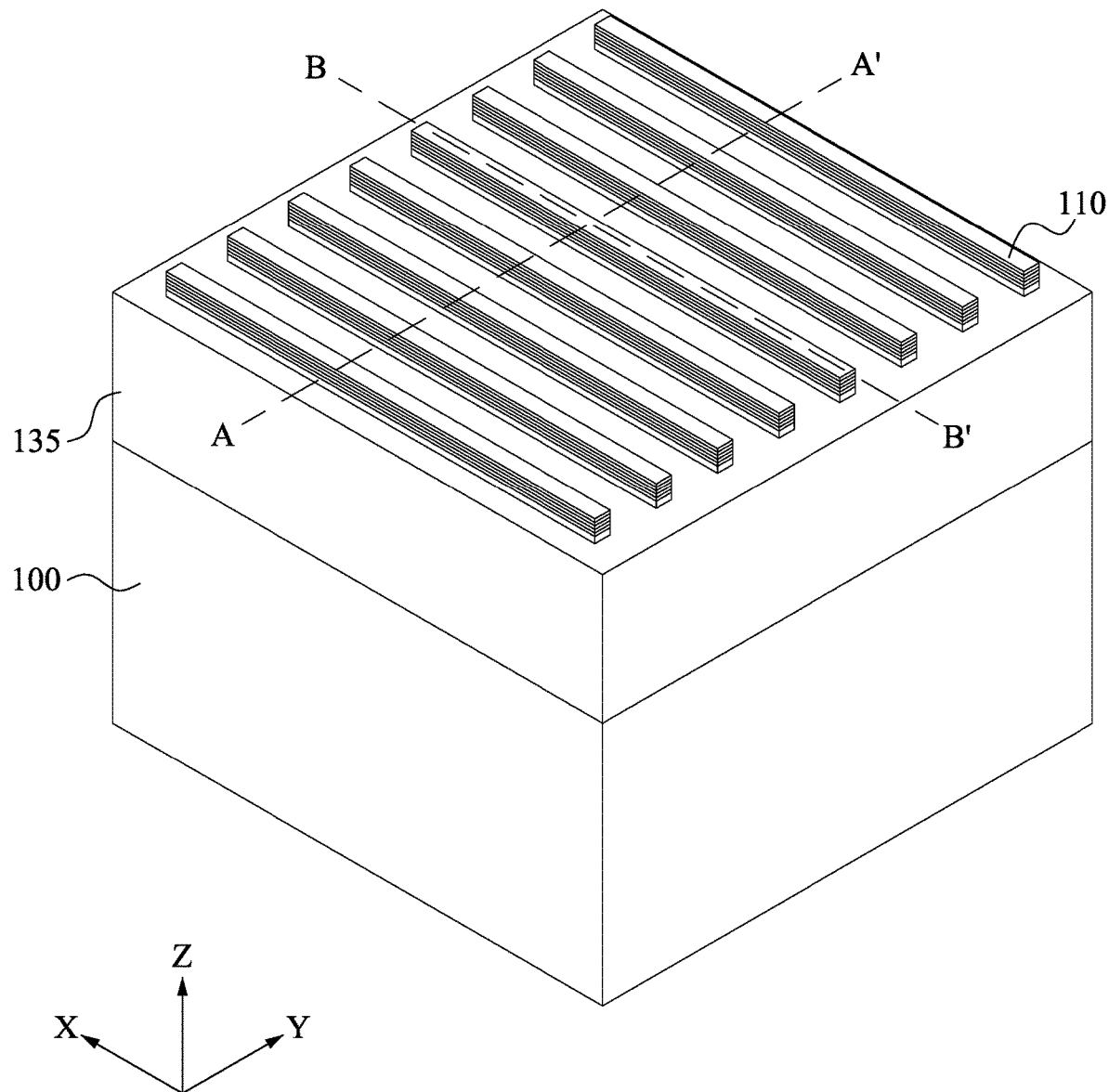
FIGS. 19A, 19B and 19C show one of the various stages of manufacturing a semiconductor FET device according to another embodiment of the present disclosure.
Figure 19B:
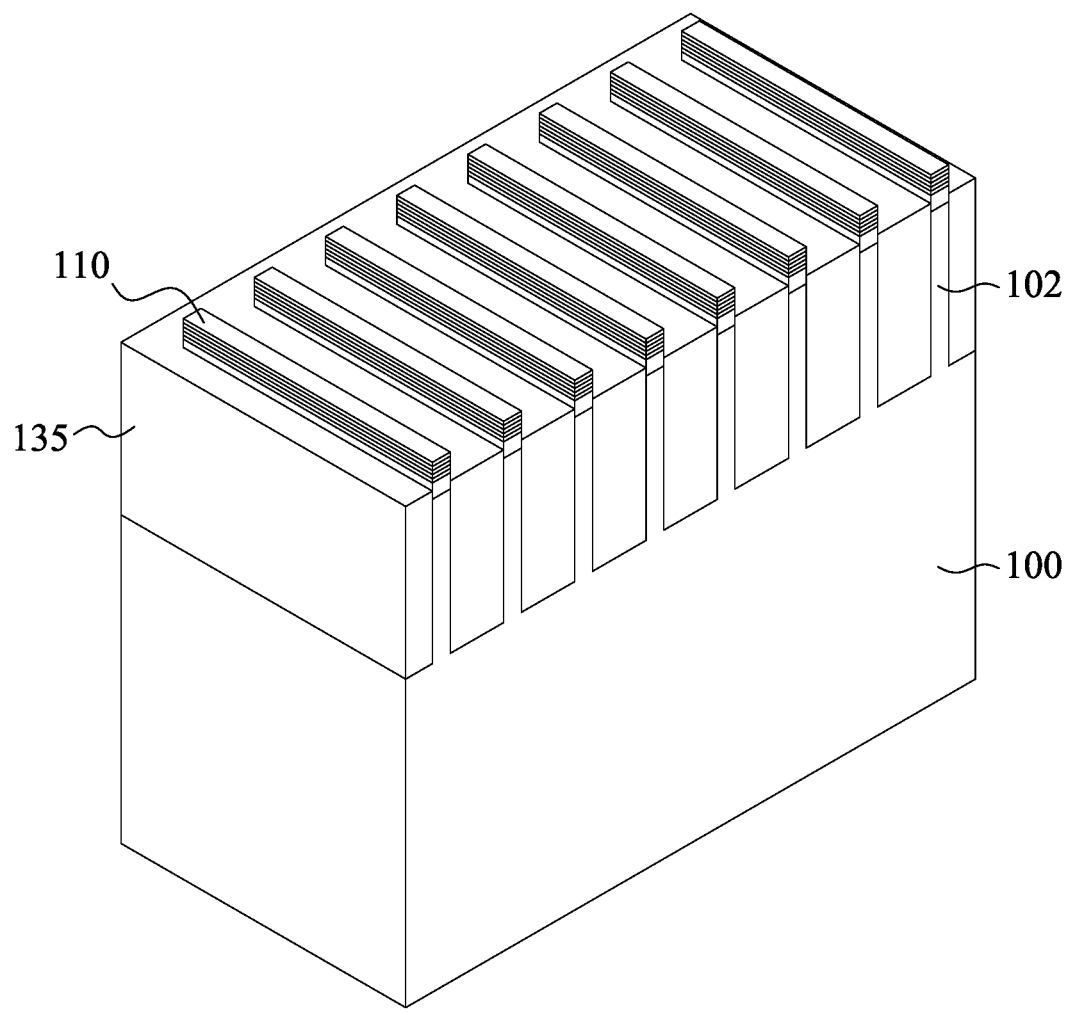
Figure 19C:
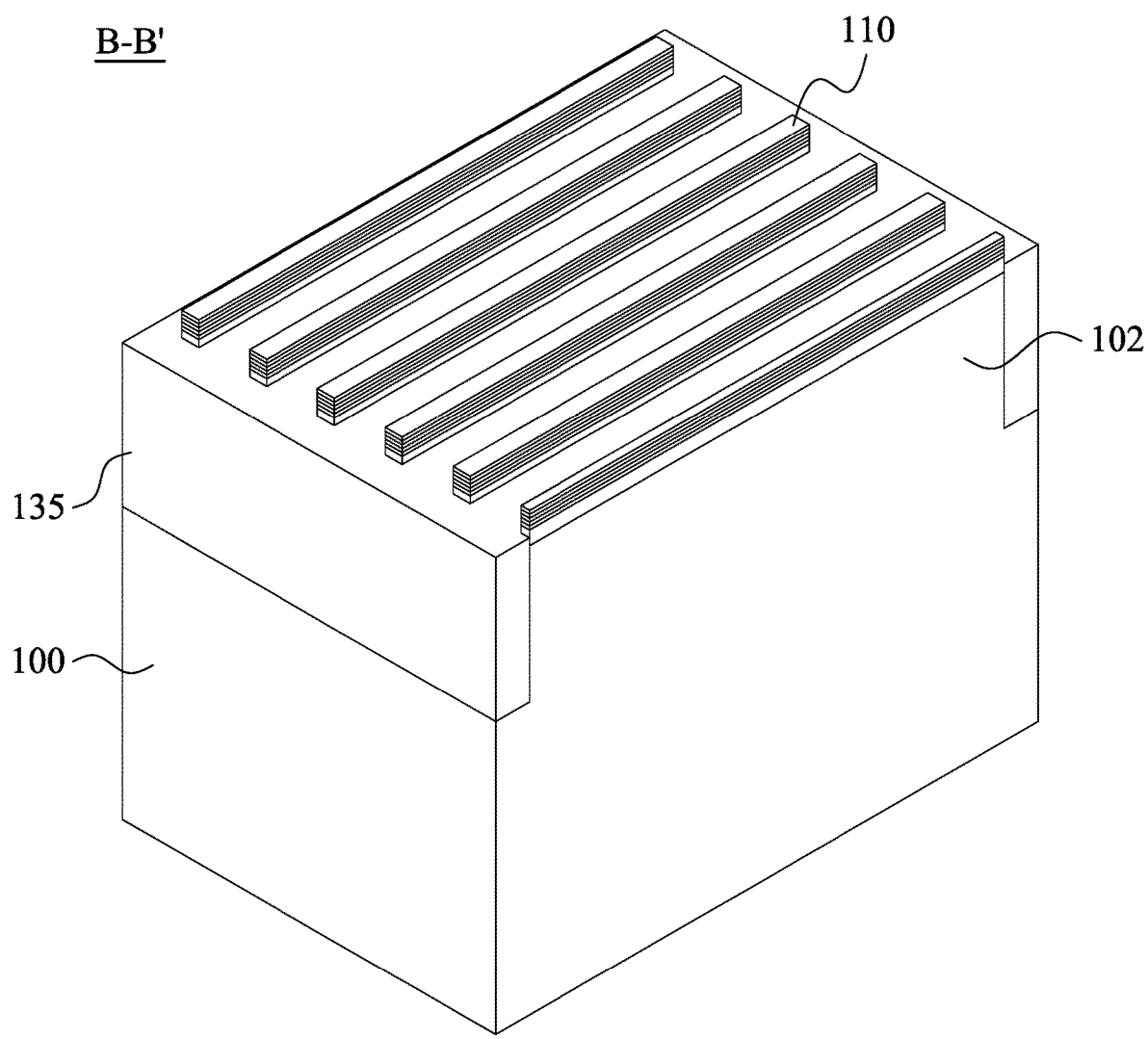

After the fin structures 130 are formed, an insulating material layer 135 including one or more layers of insulating material is formed over the substrate so that the fin structures 130 are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An annealing operation may be performed after the formation of the insulating layer. Then, a planarization operation, such as a chemical mechanical polishing (CMP) method and/or an etch-back method, is performed. Further, the insulating material layer 135 is recessed such that the first semiconductor layer 105 is at least partially exposed from the insulating material layer, thereby forming an isolation insulating layer 135 (e.g., STI), as shown in FIGS. 19A-19C. FIG. 19A is a perspective view, FIG. 19B shows a cross section along line A-A' of FIG. 19A and FIG. 19C shows a cross section along line B-B' of FIG. 19A.

Figure 20A:
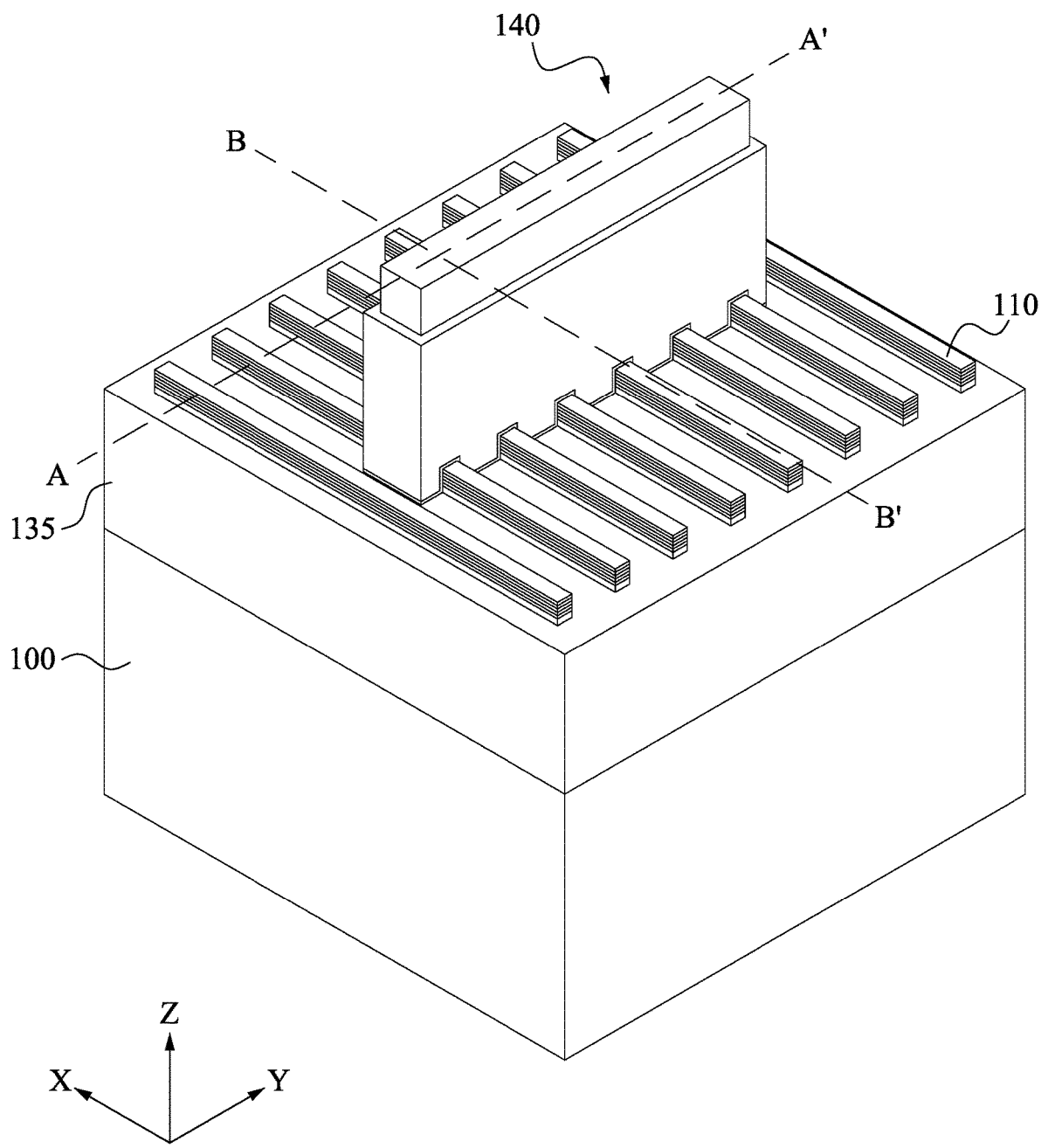
FIGS. 20A, 20B and 20C show one of the various stages of manufacturing a semiconductor FET device according to another embodiment of the present disclosure.
Figure 20B:
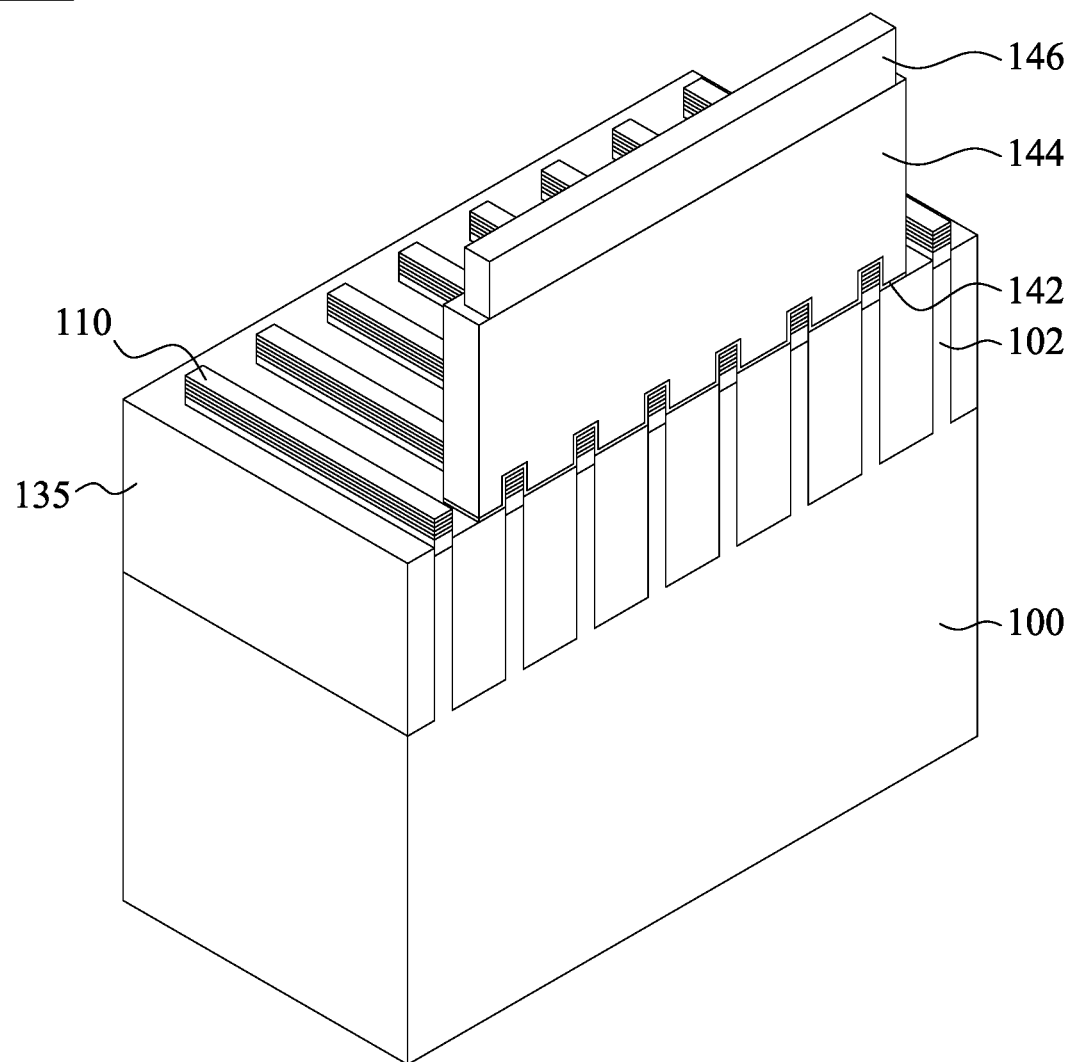
Figure 20C:
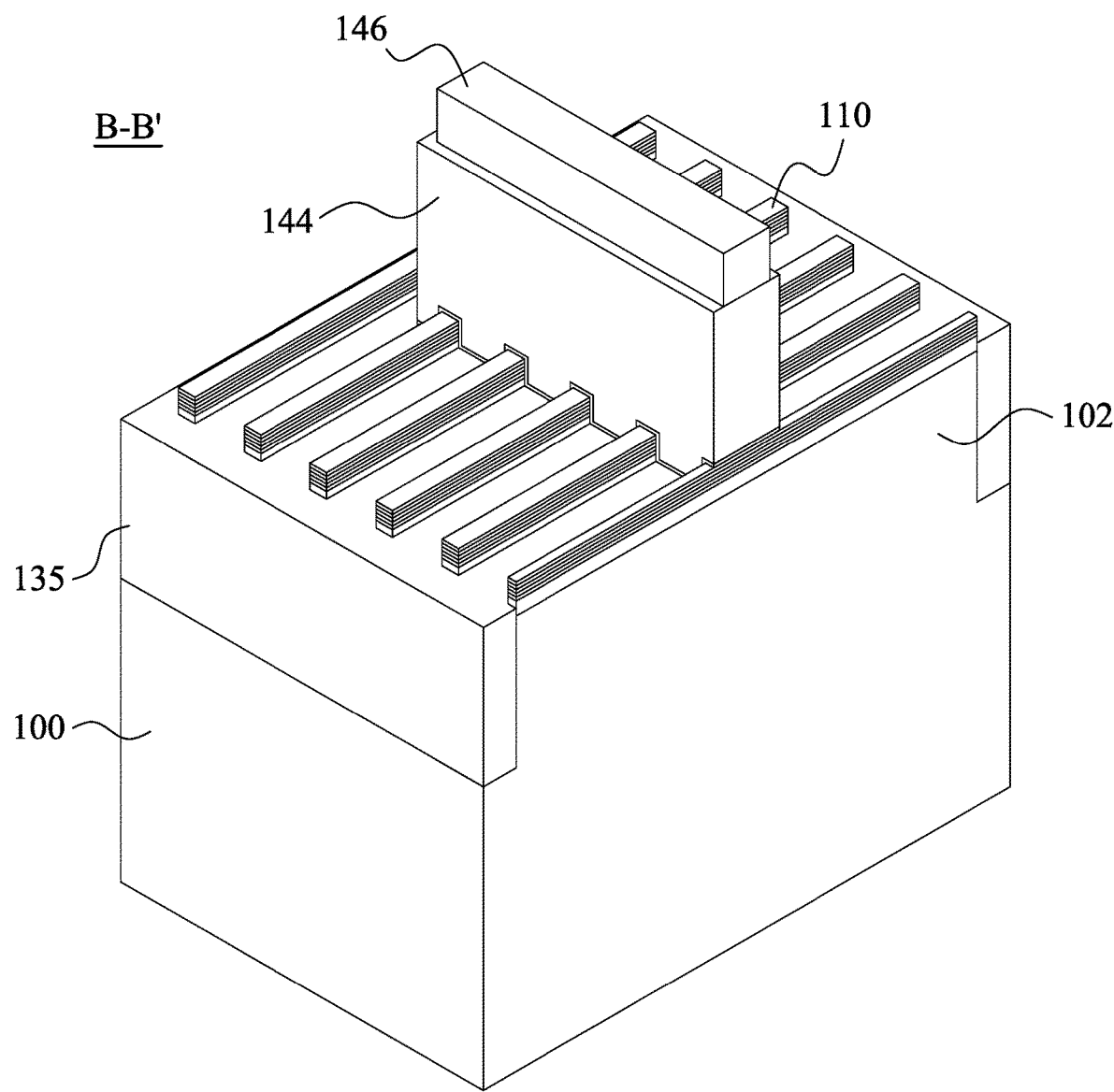

After the isolation insulating layer 135 is formed, a sacrificial (dummy) gate structure 140 is formed, as shown in FIGS. 20A-20C. FIG. 20A is a perspective view, FIG. 20B shows a cross section along line A-A' of FIG. 20A and FIG. 20C shows a cross section along line B-B' of FIG. 20A. The sacrificial gate structure 140 is formed over an upper portion of the fin structures which includes the top single crystal oxide layer 110, the pairs of layers of the single crystal oxide layer 110 and the second semiconductor layer 120 and a part of the first semiconductor layer 105. The sacrificial gate structure 140 includes a sacrificial gate dielectric layer 142 and a sacrificial gate electrode layer 144.

In some embodiments, a residual hard mask layer 146 is formed on the sacrificial gate electrode layer 144. The sacrificial gate dielectric layer 142 includes one or more layers of insulating material, such as a silicon oxide-based material. In one embodiment, silicon oxide formed by CVD is used. The thickness of the sacrificial gate dielectric layer 142 is in a range from about 1 nm to about 5 nm in some embodiments.

The sacrificial gate structure 140 is formed by first blanket depositing the sacrificial gate dielectric layer over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a hard mask layer is formed over the sacrificial gate electrode layer. The mask layer includes a pad SiN layer and a silicon oxide mask layer in some embodiments.

Next, a patterning operation is performed on the mask layer and sacrificial gate electrode layer is patterned into the sacrificial gate structure 140, as shown in FIGS. 20A-20C. The sacrificial gate structure 140 includes the sacrificial gate dielectric layer 142, the sacrificial gate electrode layer 144 (e.g., poly silicon), and the hard mask 146. By patterning the sacrificial gate structure, the stacked fin structures are partially exposed on opposite sides of the sacrificial gate structure 140, thereby defining source/drain (S/D) regions, as shown in FIGS. 20A-20C. In FIGS. 20A-20C, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 21A:
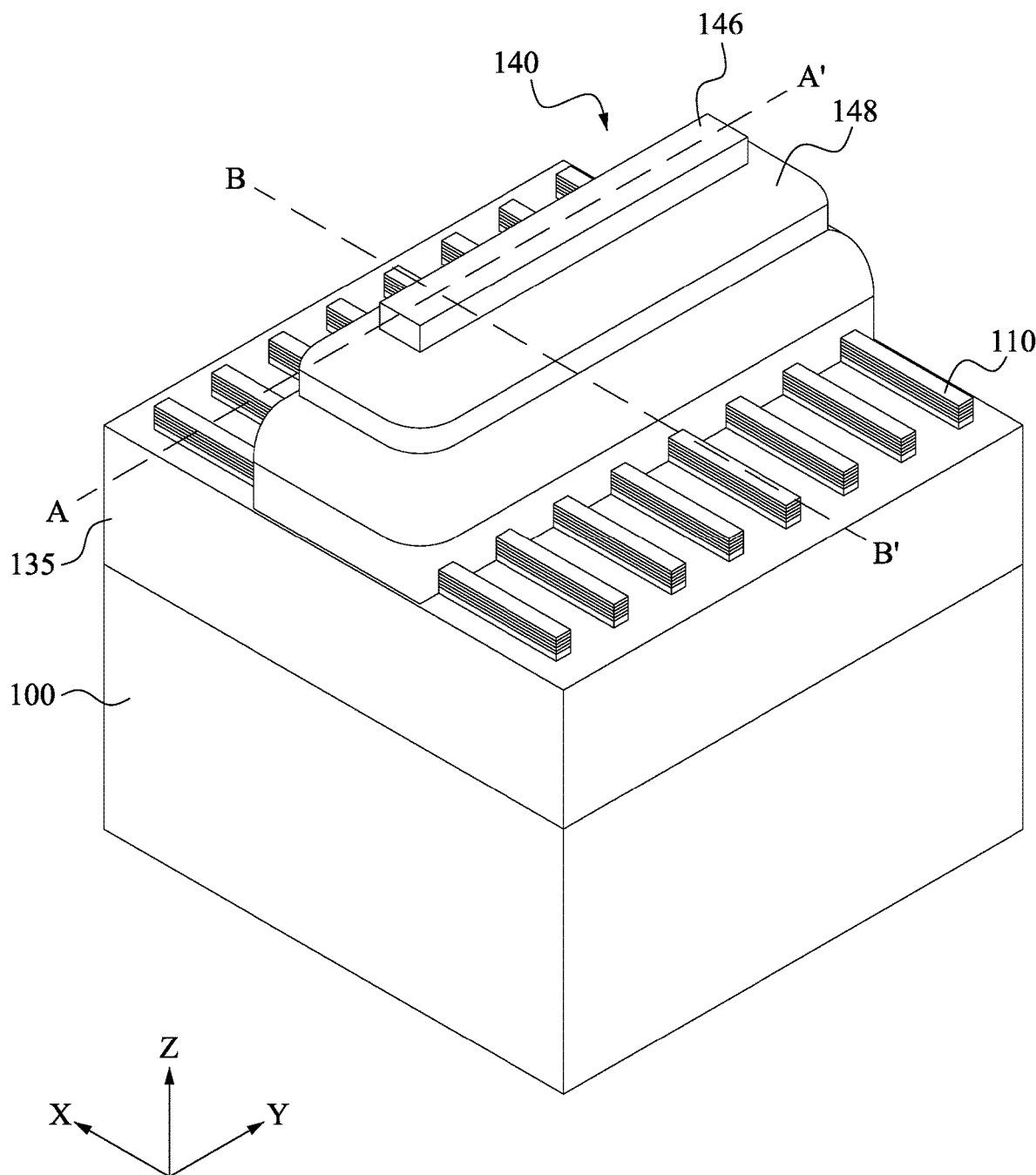
FIGS. 21A, 21B and 21C show one of the various stages of manufacturing a semiconductor FET device according to another embodiment of the present disclosure.
Figure 21B:
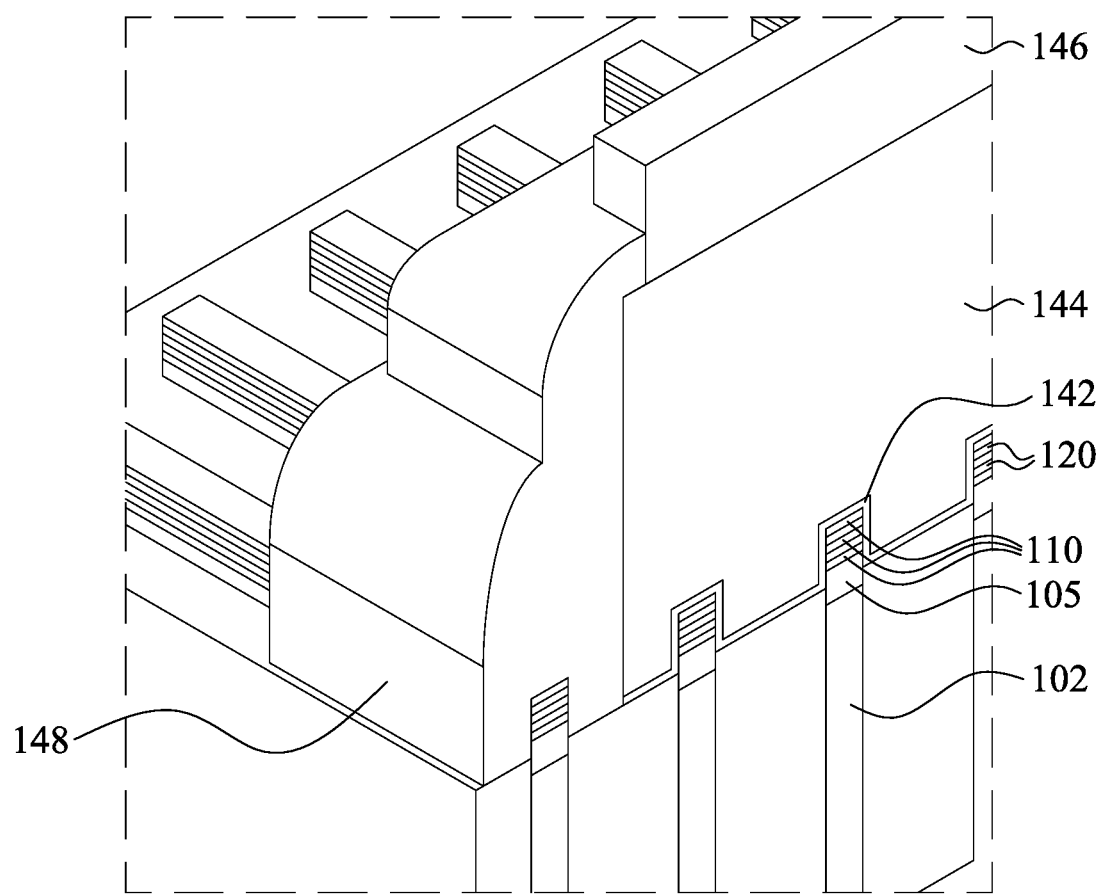
Figure 21C:
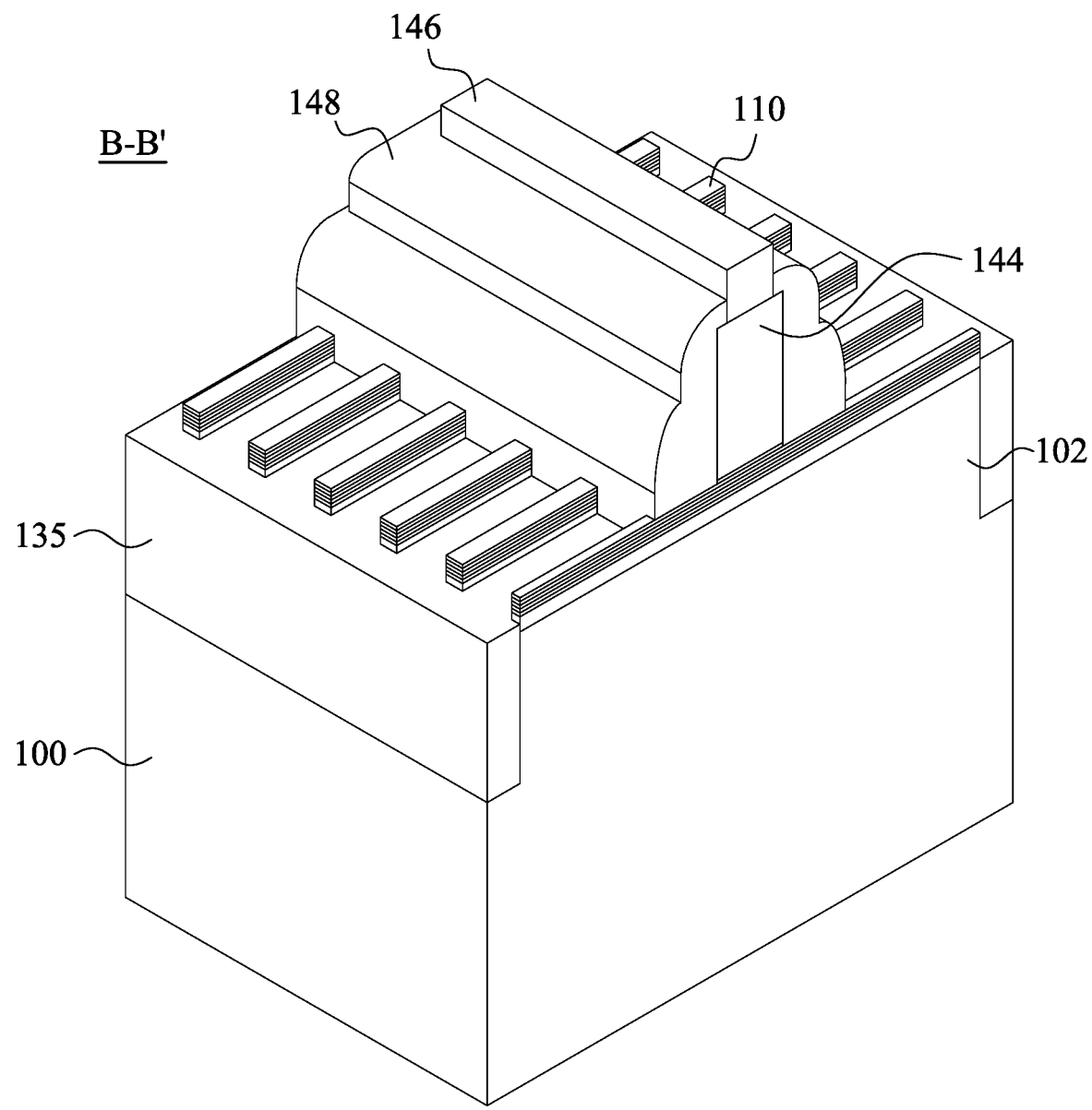

Further, a cover layer for sidewall spacers 148 is formed over the sacrificial gate structure 140. The cover layer is deposited in a conformal manner so that it is formed to have substantially equal thicknesses on vertical surfaces, such as the sidewalls, horizontal surfaces, and the top of the sacrificial gate structure 140, respectively. In some embodiments, the cover layer has a thickness in a range from about 5 nm to about 20 nm. The cover layer includes one or more of SiN, SiON and SiCN or any other suitable dielectric material. The cover layer can be formed by ALD or CVD, or any other suitable method. Next, as shown in FIGS. 21A-21C, bottom portions of the cover layer are removed by anisotropic etching, thereby forming sidewall spacers 148. FIG. 21A is a perspective view, FIG. 21B shows a cross section along line A-A' of FIG. 21A and FIG. 21C shows a cross section along line B-B' of FIG. 21A. In some embodiments, an upper portion of the hard mask layer 146 is exposed. In some embodiments, as shown in FIG. 21B, one of the fin structures is disposed under the sidewall spacer 148. In other embodiments, no fin structure is disposed under the sidewall spacer 148.

Figure 22A:
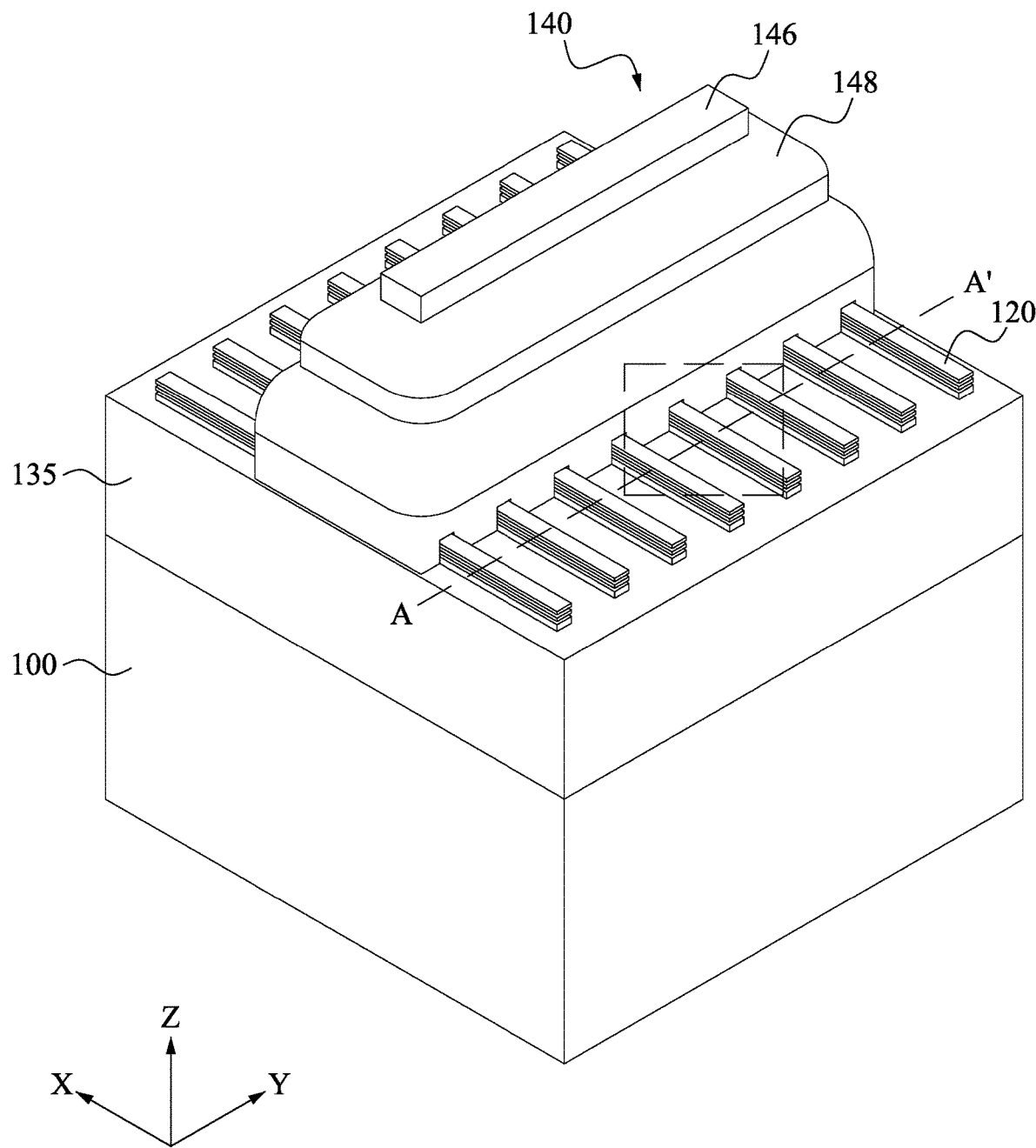
FIGS. 22A and 22B show one of the various stages of manufacturing a semiconductor FET device according to another embodiment of the present disclosure.
Figure 22B:
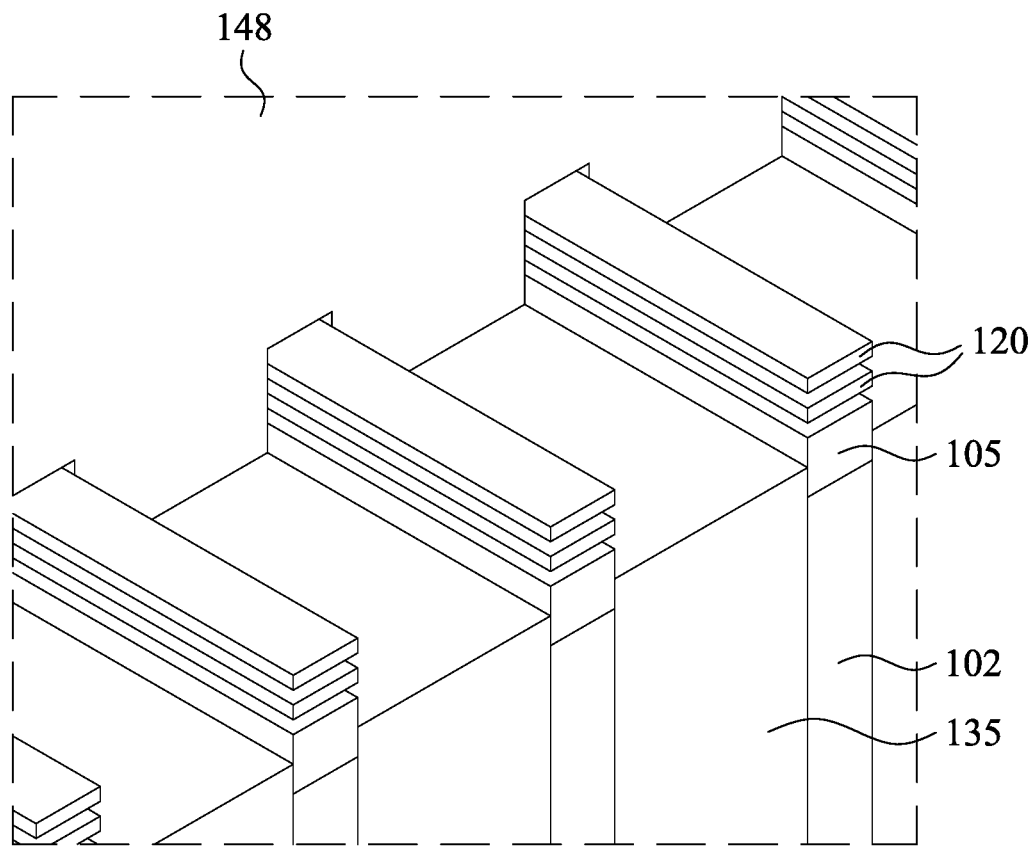

Subsequently, as shown in FIGS. 22A and 22B, the top single crystal oxide layer 110 and the single crystal oxide layer 110 in the pairs of layers are removed by using one or more etching operations. FIG. 22A is a perspective view and FIG. 22B shows a cross section along line A-A' of FIG. 22A. Wet etching and/or dry etching can be employed to remove the crystalline oxide selective to the first and second semiconductor layers 105, 120 and the sidewall spacers 148. Part of the crystalline oxide layers 110 under the sidewall spacers 148 is slightly etched in some embodiments.

Figure 23A:
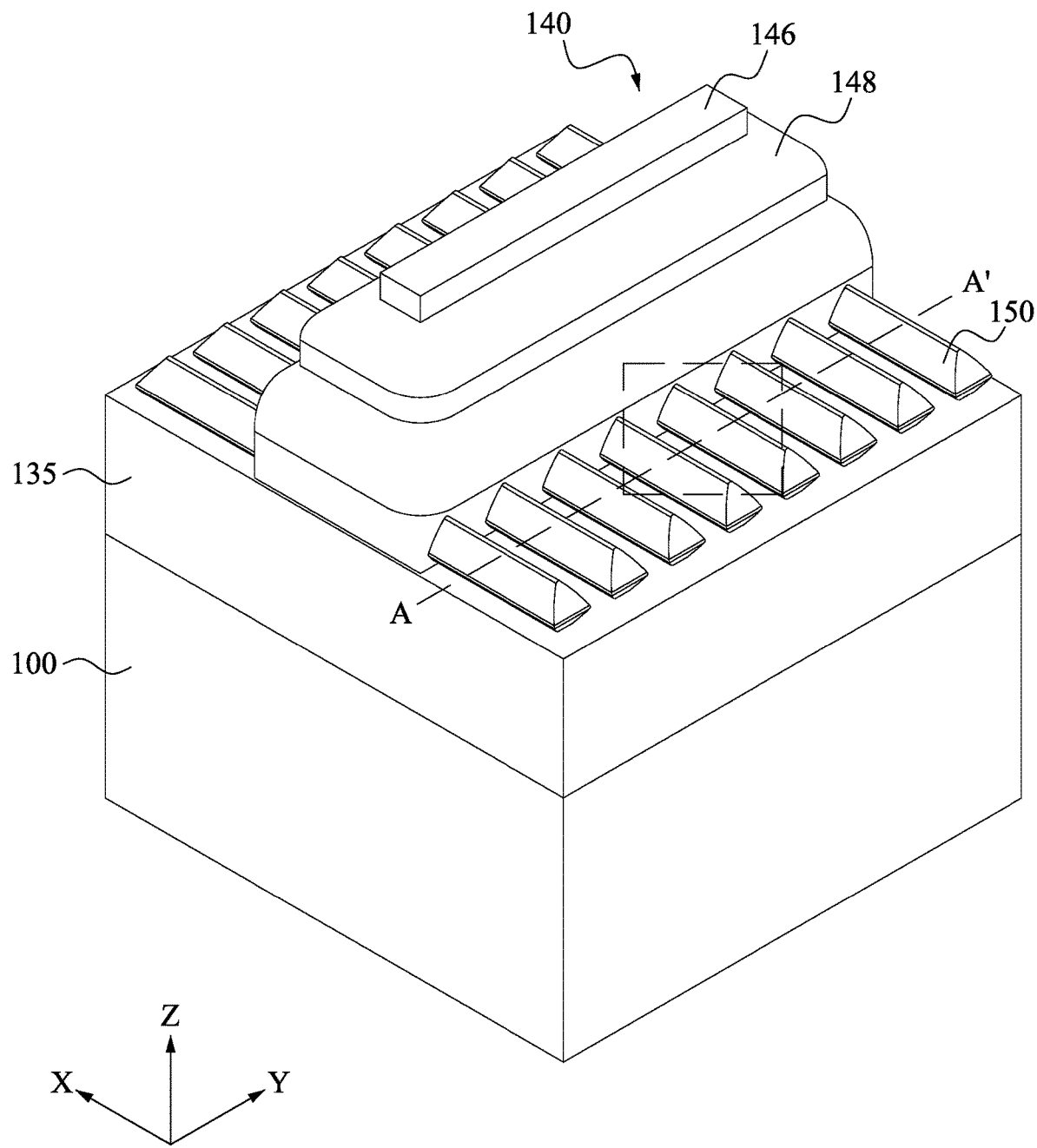
FIGS. 23A and 23B show one of the various stages of manufacturing a semiconductor FET device according to another embodiment of the present disclosure.
Figure 23B:
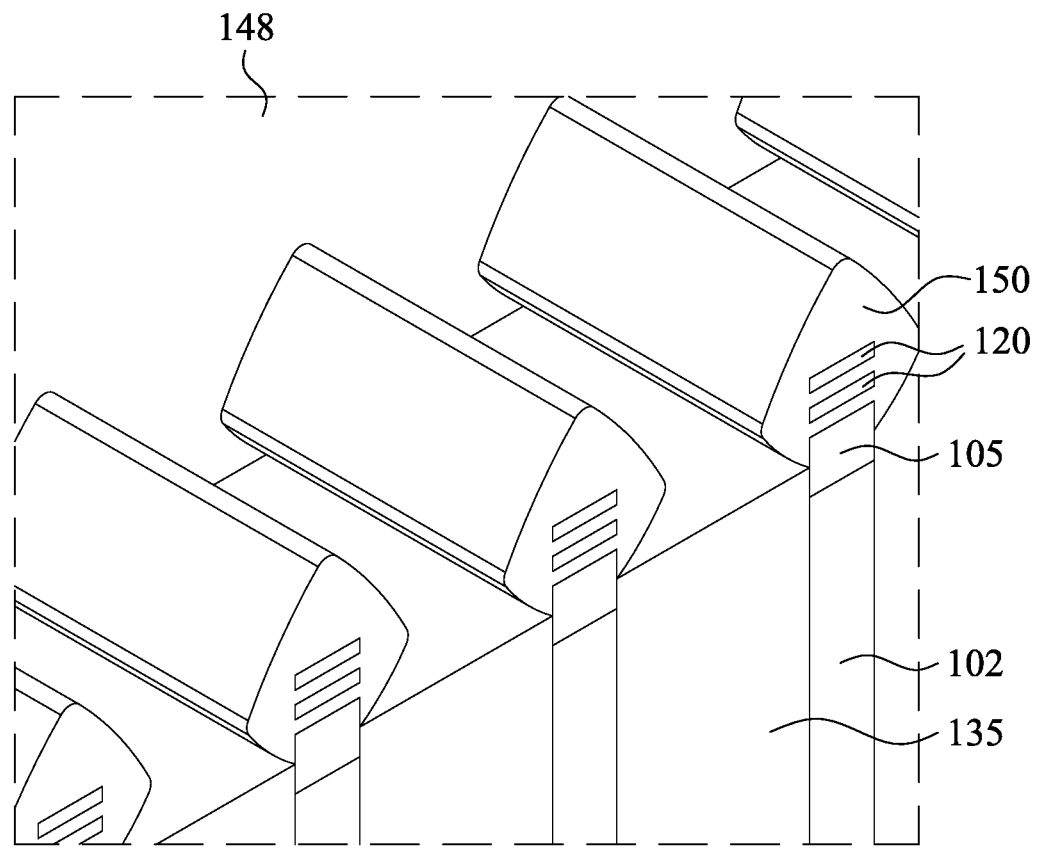

Then, as shown in FIGS. 23A and 23B, a source/drain epitaxial layer 150 is formed. FIG. 23A is a perspective view and FIG. 23B shows a cross section along line A-A' of FIG. 23A. As shown in FIG. 23B, the source/drain epitaxial layer 150 wraps around the second semiconductor layers 120 and covers the exposed upper portion of the first semiconductor layer 105. The source/drain epitaxial layer 150 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layer 150 is formed by an epitaxial growth method using CVD, ALD or molecular beam epitaxy (MBE). As shown in FIG. 23B, the source/drain epitaxial layer 150 is formed over respective source/drain regions separately in some embodiments. In other embodiments, the adjacent source/drain epitaxial layers 150 merge.

Figure 24A:
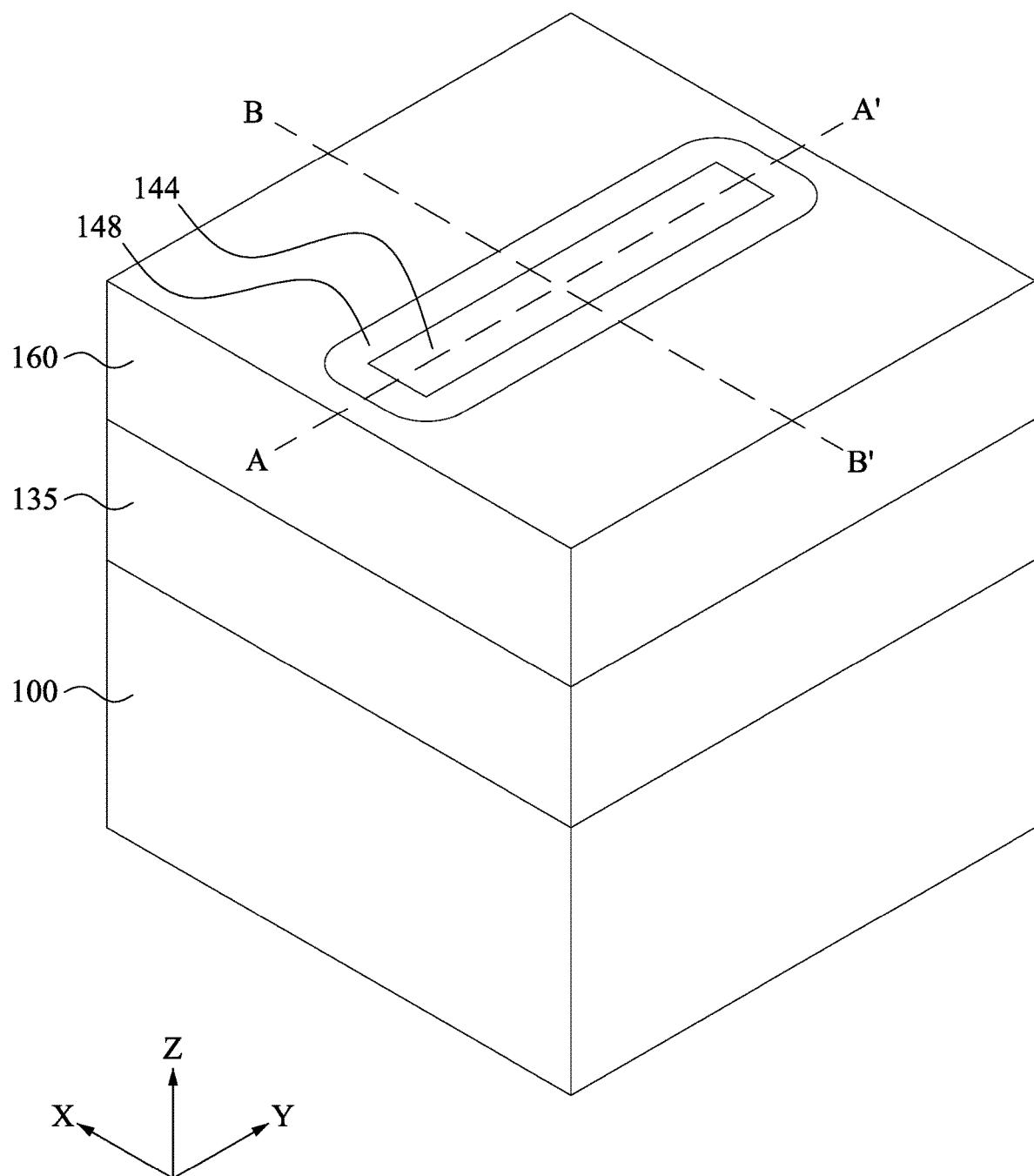
FIGS. 24A, 24B and 24C show one of the various stages of manufacturing a semiconductor FET device according to another embodiment of the present disclosure.
Figure 24B:
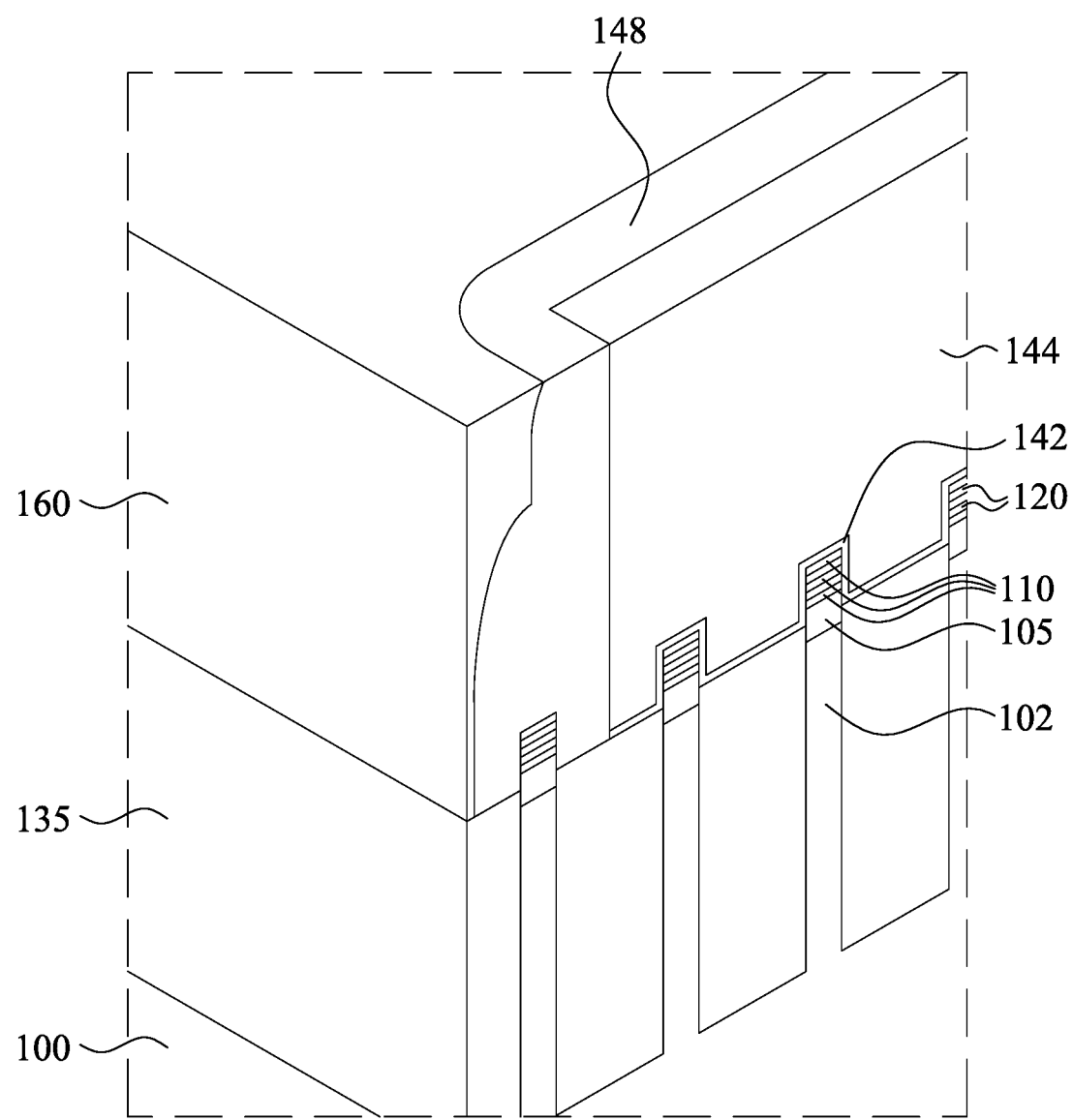
Figure 24C:
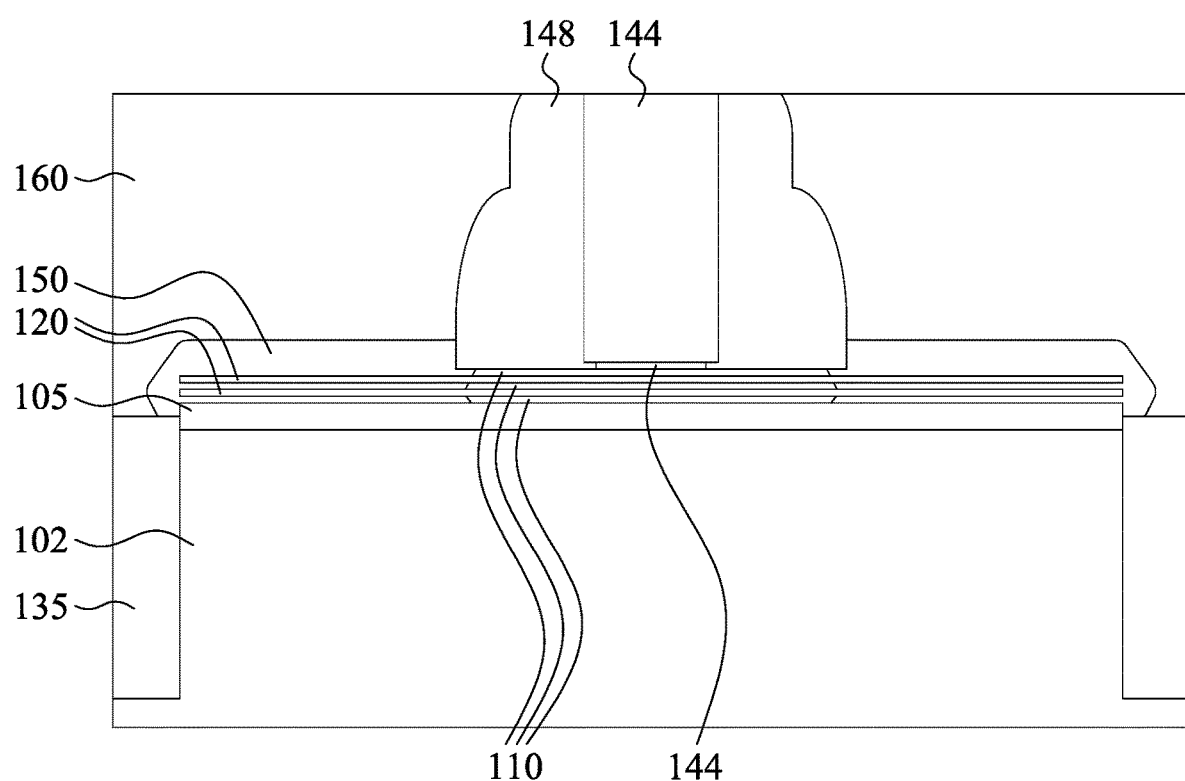

Then, an interlayer dielectric (ILD) layer 160 is formed over the source/drain epitaxial layer 150 and the sacrificial gate structure 140. The materials for the ILD layer 160 include compounds comprising Si, O, C and/or H, such as silicon oxide, SiCOH and SiOC. Organic materials, such as polymers, may be used for the ILD layer 160. After the ILD layer 160 is formed, a planarization operation, such as CMP, is performed, so that the top portion of the sacrificial gate electrode layer 144 is exposed as shown in FIGS. 24A-24C. FIG. 24A is a perspective view, FIG. 24B shows a cross section along line A-A' of FIG. 24A and FIG. 24C is a cross sectional view along line B-B' of FIG. 24A.

Figure 25A:
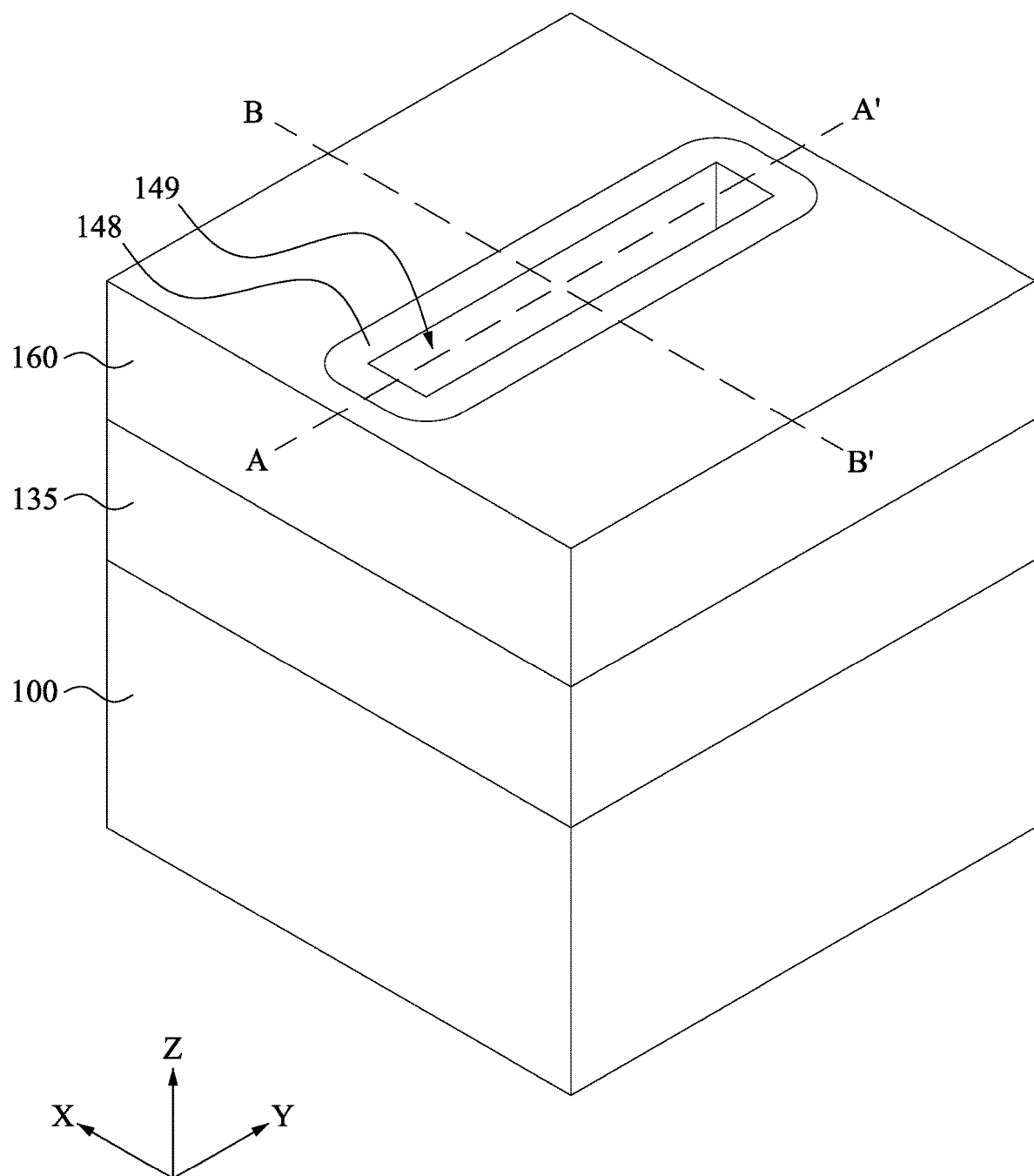
FIGS. 25A and 25B show one of the various stages of manufacturing a semiconductor FET device according to another embodiment of the present disclosure.
Figure 25B:
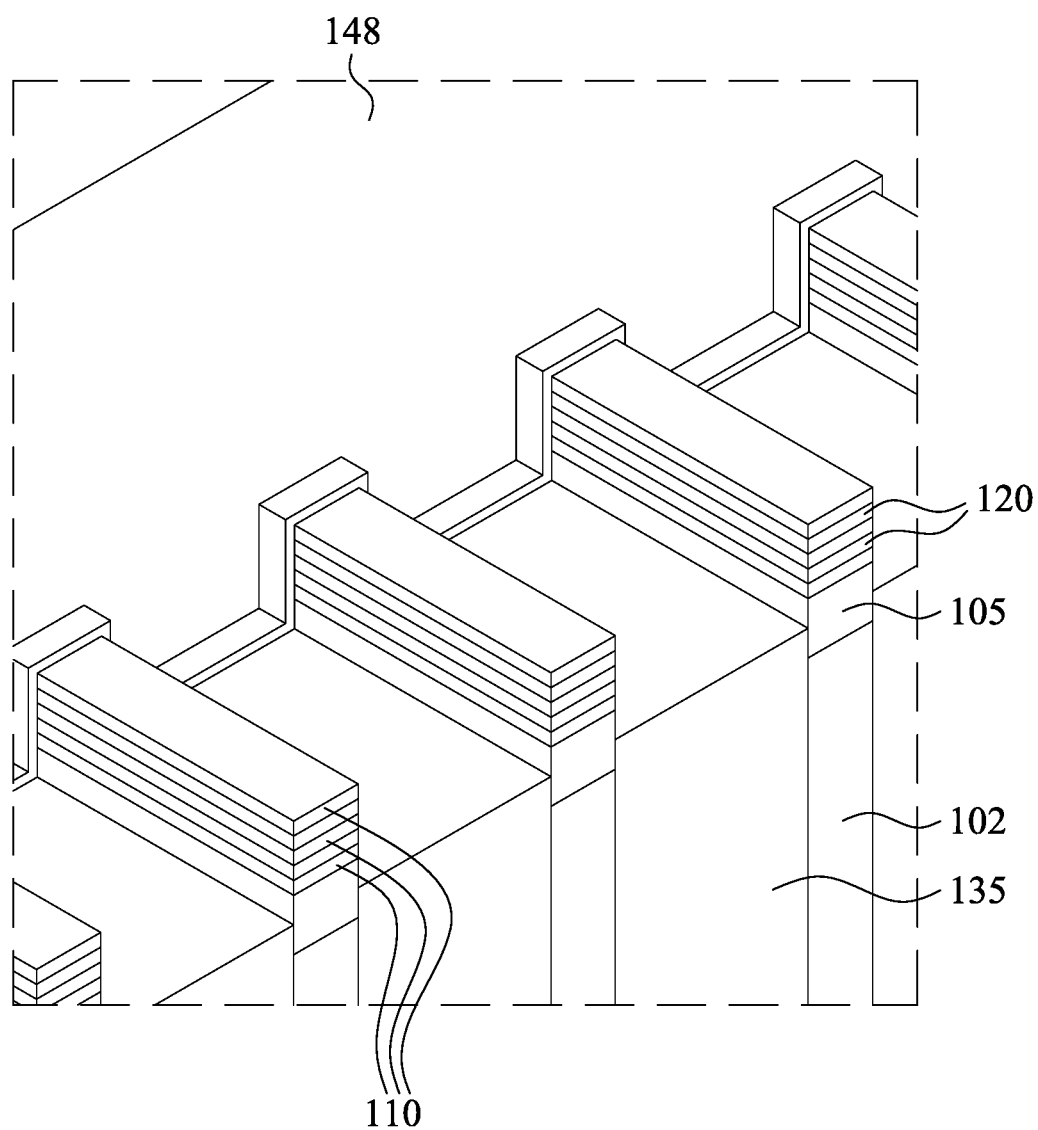

Then, the sacrificial gate structure 140 including the sacrificial electrode layer 144 and sacrificial gate dielectric layer 142 are removed, thereby forming a gate space 149, as shown in FIGS. 25A and 25B. FIG. 25A is a perspective view and FIG. 25B shows a cross sectional view in the gate space 149 along line A-A' of FIG. 25A. The ILD layer 160 protects the source/drain epitaxial layer 150 during the removal of the sacrificial gate structure 140. The sacrificial gate structures can be removed using plasma dry etching and/or wet etching. When the sacrificial gate electrode layer 144 is polysilicon and the ILD layer 160 is silicon oxide, a wet etchant such as a TMAH solution can be used to selectively remove the sacrificial gate electrode layer 144. The sacrificial gate dielectric layer 142 is thereafter removed using plasma dry etching and/or wet etching. In some embodiments, due to lateral etching during the sacrificial gate removal, a horizontal portion of the sidewall spacers 148 may appear.

Figure 26A:
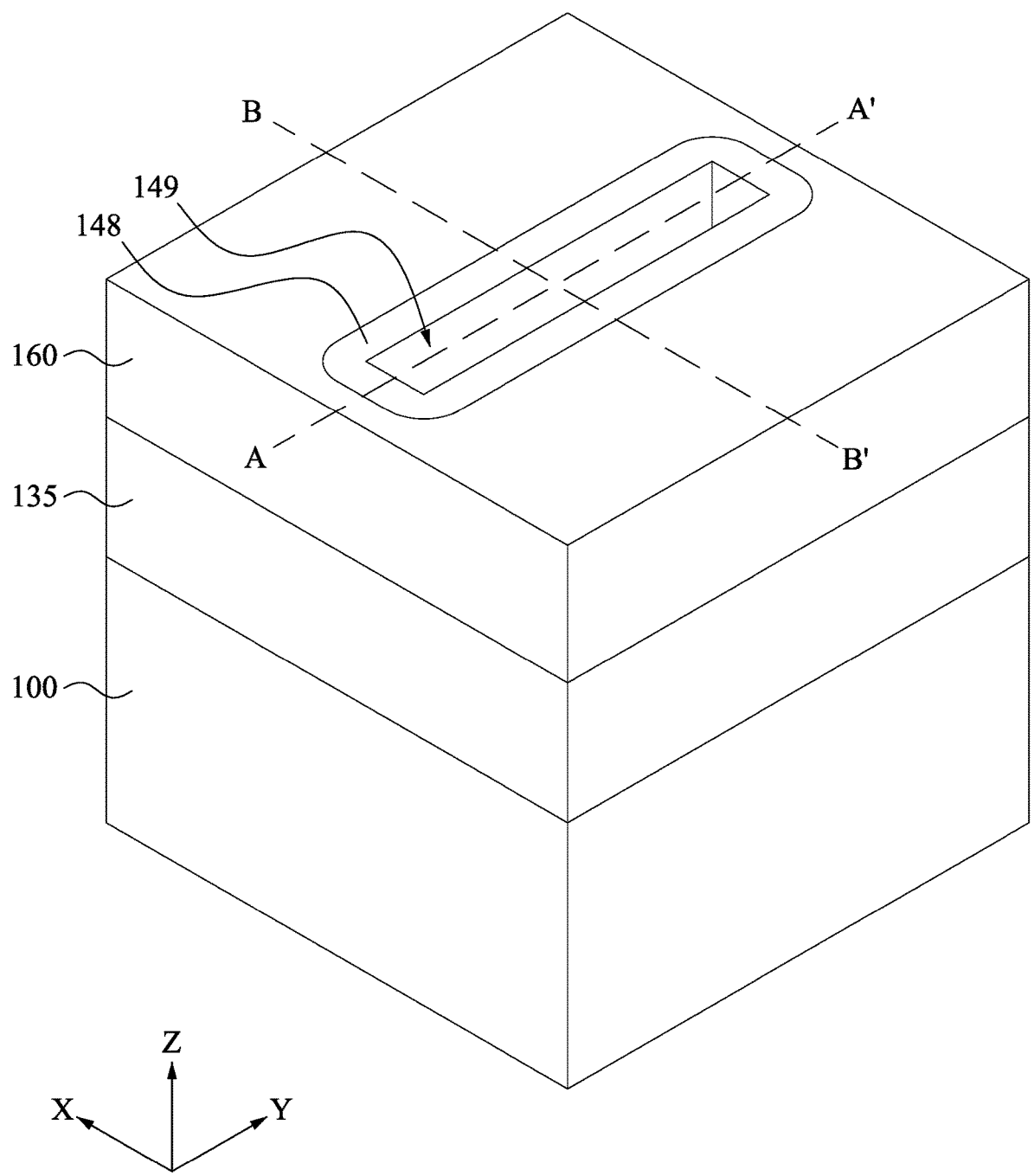
FIGS. 26A and 26B show one of the various stages of manufacturing a semiconductor FET device according to another embodiment of the present disclosure.
Figure 26B:
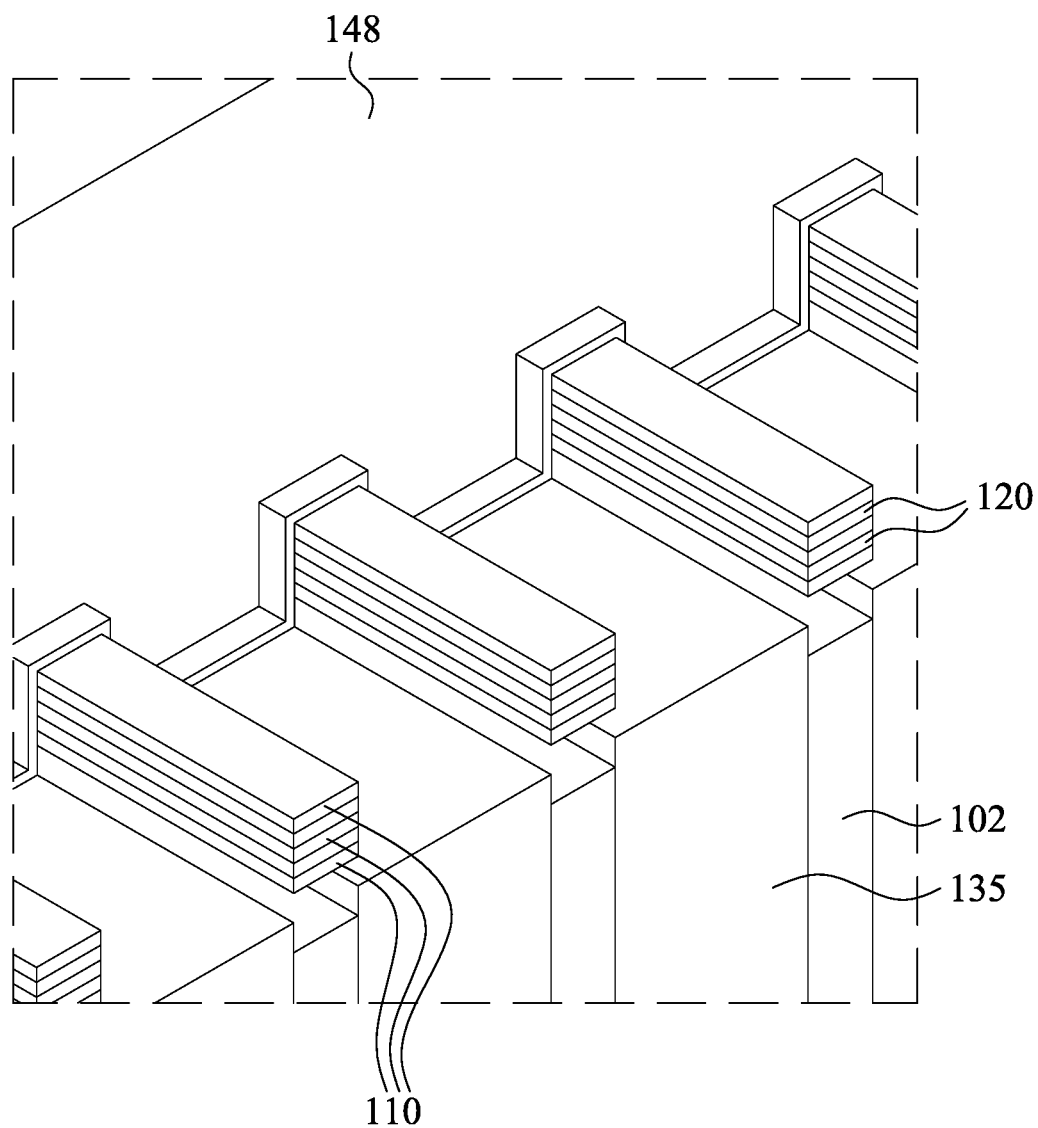

After the sacrificial gate structures are removed, the first semiconductor layer 105 is removed, as shown in FIGS. 26A and 26B. FIG. 26A is a perspective view and FIG. 26B shows a cross sectional view in the gate space 149 along line A-A' of FIG. 26A. Since the first semiconductor layer 105 is made of a different material than the substrate 100 (bottom fin structure 102) and the second semiconductor layers 120, the first semiconductor layer 105 can be selectively removed by a suitable chemical solution. The remaining second semiconductor layers 120 are channel regions of an FET.

Figure 27A:
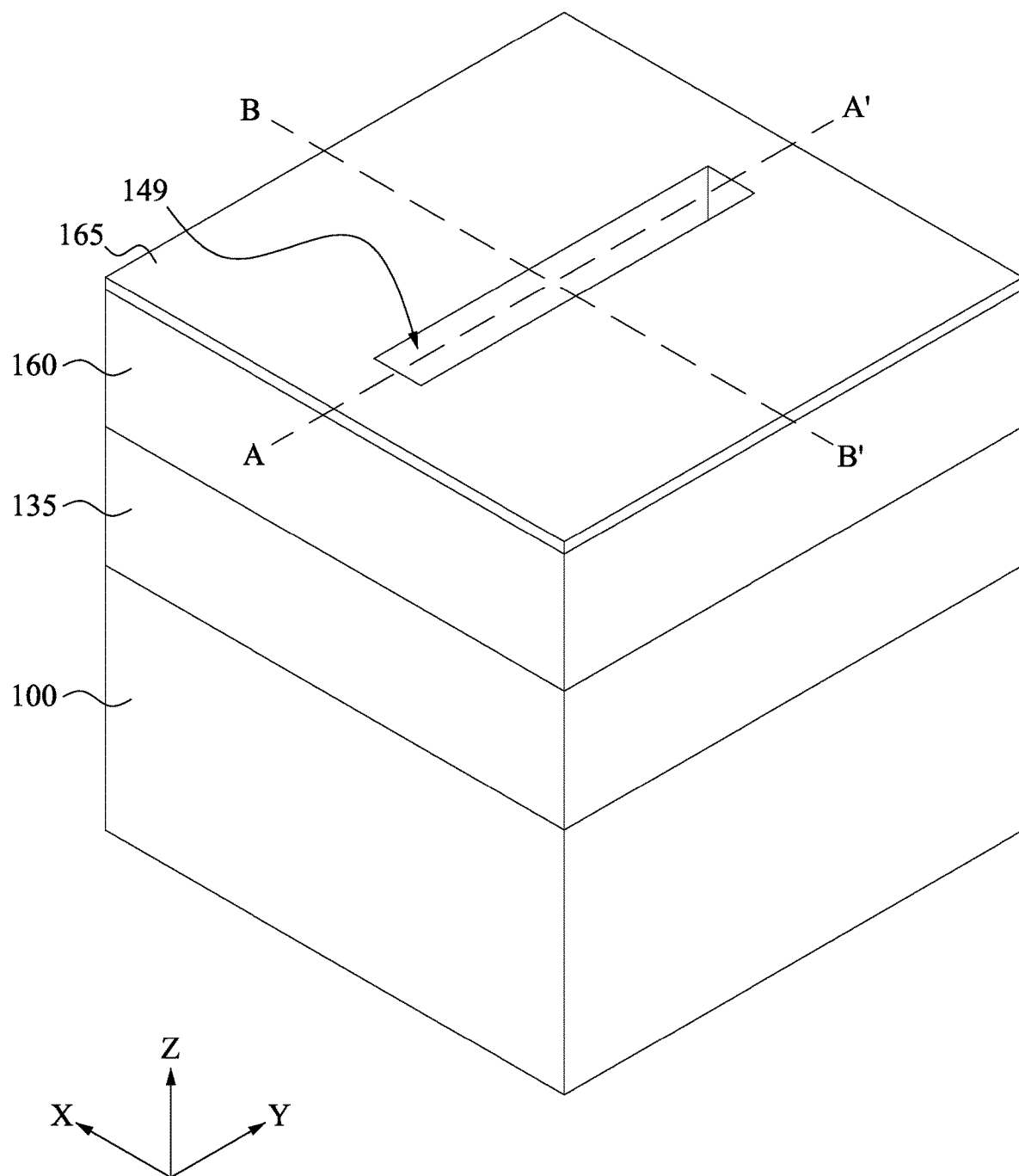
FIGS. 27A and 27B show one of the various stages of manufacturing a semiconductor FET device according to another embodiment of the present disclosure.
Figure 27B:
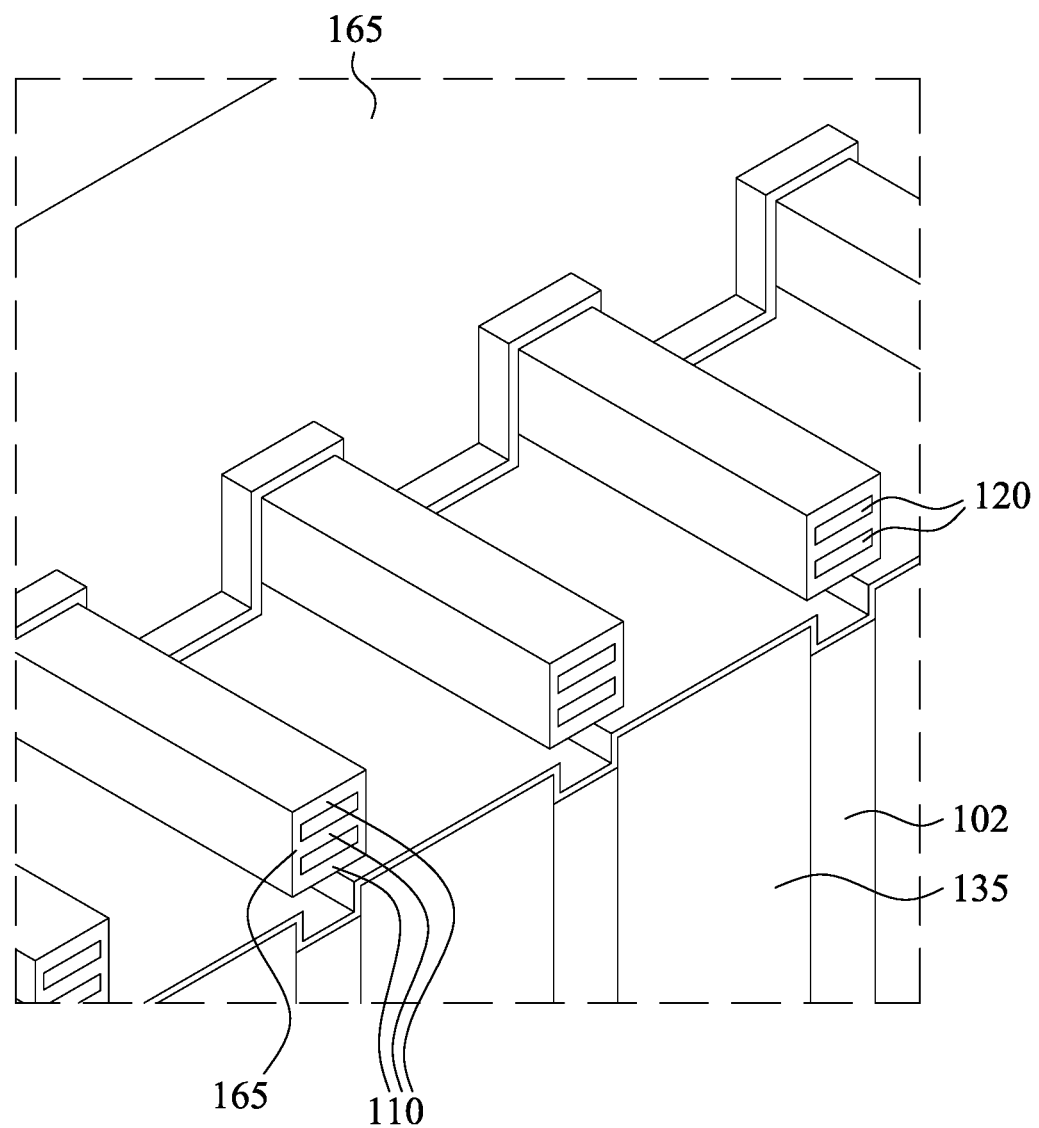

After the first semiconductor layer 105 is removed, a gate dielectric layer 165 is formed as shown in FIGS. 27A and 27B. FIG. 27A is a perspective view and FIG. 27B shows a cross sectional view in the gate space 149 along line A-A' of FIG. 27A. In some embodiments, the gate dielectric layer 165 is made of a same material as the single crystal oxide layer 110. In other embodiments, the gate dielectric layer 165 is made of a different material than the single crystal oxide layer 110. In certain embodiments, the gate dielectric layer 165 includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 165 can be formed by CVD, ALD or any suitable method. In one embodiment, the gate dielectric layer 165 is formed using a highly conformal deposition process such as ALD in order to ensure the formation of a gate dielectric layer having a uniform thickness around each channel region. The thickness of the gate dielectric layer 165 is equal to or smaller than the single crystal oxide layer 110 and is in a range from about 0.5 nm to about 5 nm in one embodiment.

In some embodiments, the gate dielectric layer 165 is amorphous or polycrystalline because of its relatively low deposition temperature, e.g., 300° C. to 500° C. As shown in FIG. 27B, the upper surface and the bottom surface of each of the second semiconductor layer 120 are already covered by the single crystal oxide layer 110. Accordingly, the gate dielectric layer 165 is directly formed on side faces of the second semiconductor layers 120, on the top single crystal oxide layer 110, on the bottom-most single crystal oxide layer 110 and the remaining inner walls of the gate space 149. Thus, the effective thickness of the gate dielectric on the upper and bottom surfaces of the second semiconductor layer 120 (channel region) is greater than the effective thickness of the gate dielectric on the side faces of the second semiconductor layer 120.

In some embodiments, an annealing operation is performed to crystalize the as deposited gate dielectric layer 165. In such a case, the entire gate dielectric is crystalline.

Figure 28A:
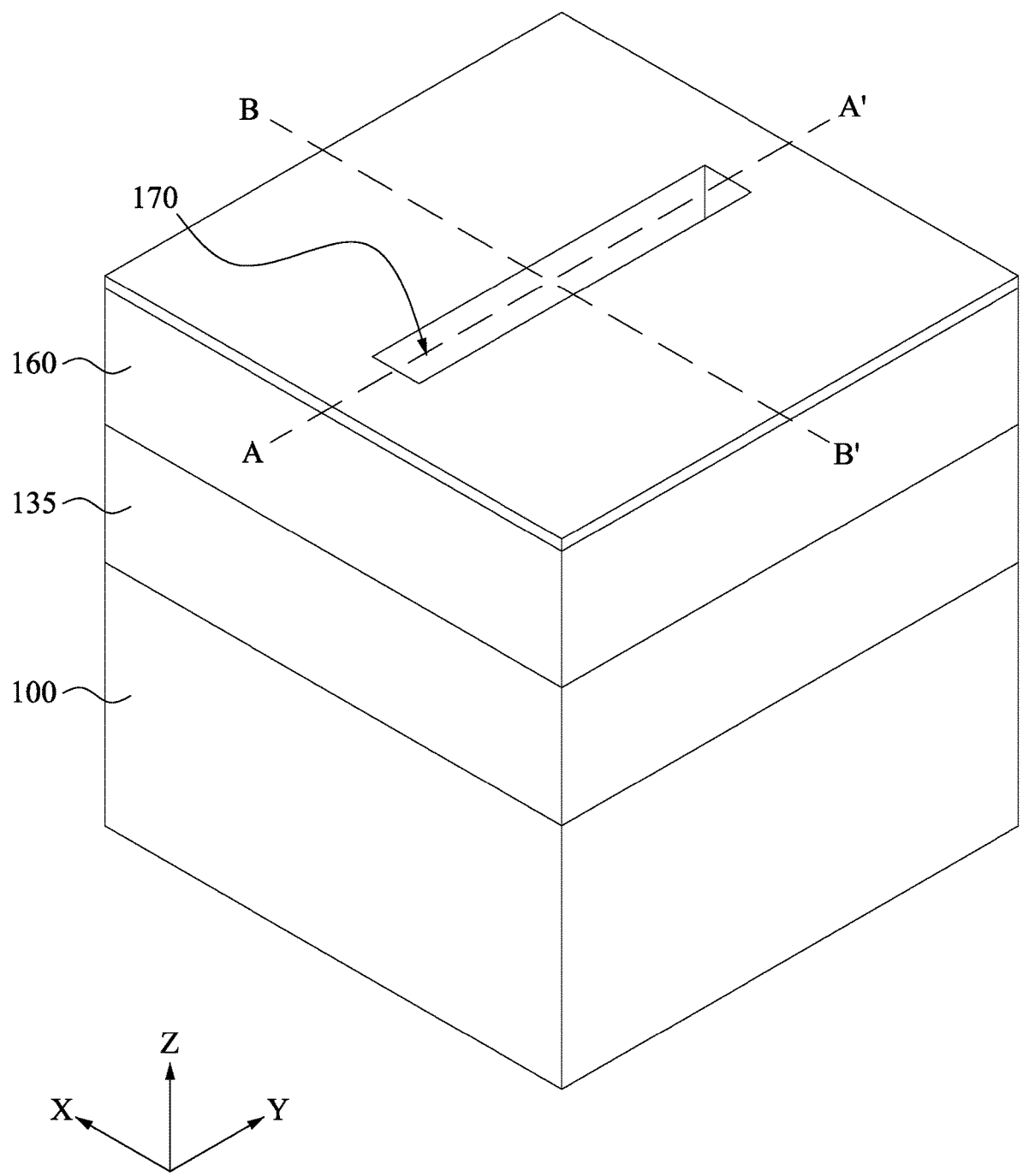
FIGS. 28A, 28B, 28C and 28D show one of the various stages of manufacturing a semiconductor FET device according to another embodiment of the present disclosure.
Figure 28B:
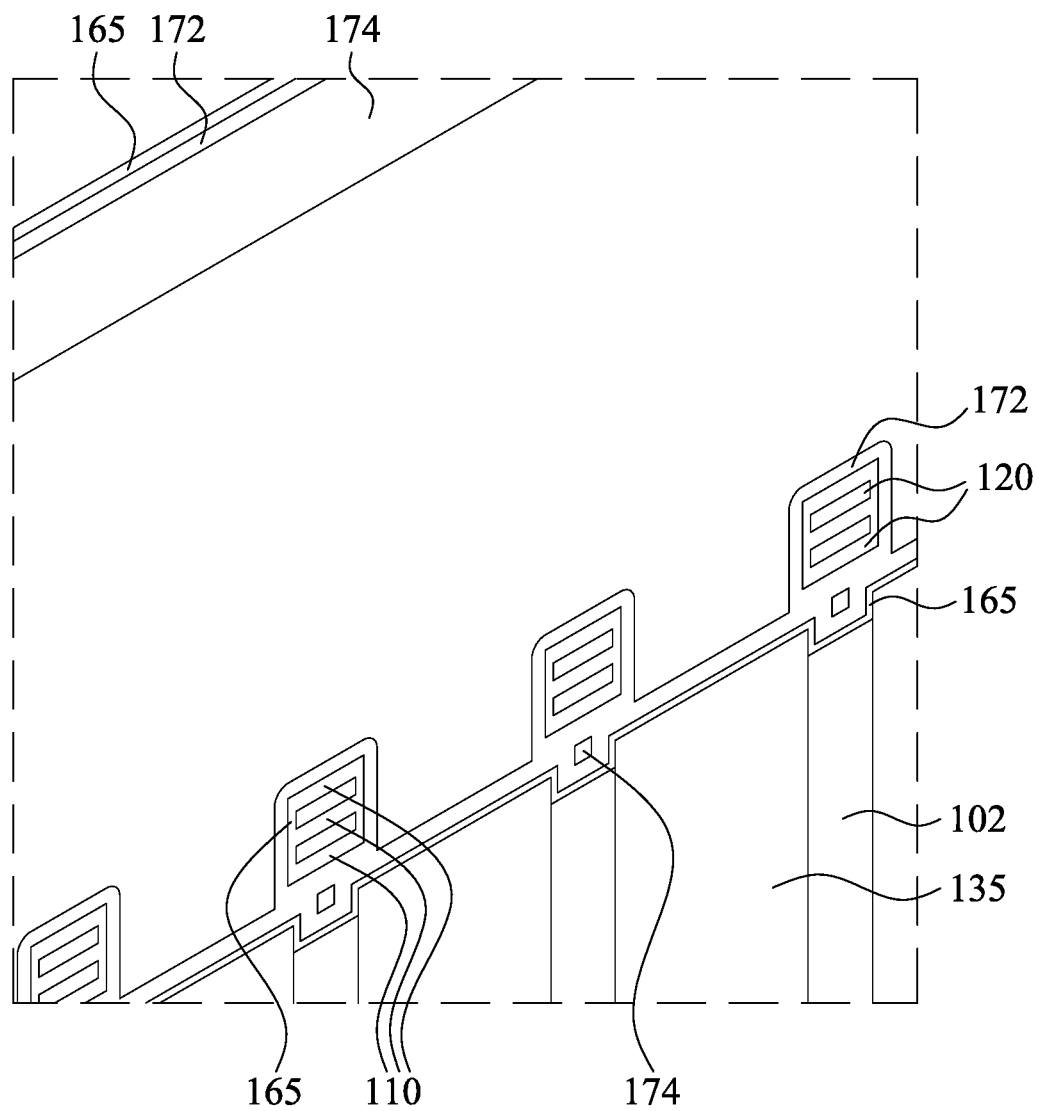

Then, as shown in FIGS. 28A and 28B, a metal gate structure 170 is formed in the gate space 149. FIG. 28A is a perspective view and FIG. 28B shows a cross sectional view in the gate space 149 along line A-A' of FIG. 28A. The metal gate structure 170 includes one or more layers of work function adjustment material 172 and a body gate electrode layer 174.

The work function adjustment layers 172 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer 172 may be formed by ALD, PVD, CVD, e-beam evaporation, or other suitable process. Further, the work function adjustment layer 172 may be formed separately for the n-channel FET and the p-channel FET which may use different metal layers.

The body gate electrode layer 174 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The body gate electrode layer 174 may be formed by CVD, ALD, electroplating, or other suitable method. The metal gate electrode layer is also deposited over the upper surface of the ILD layer 160. The metal gate electrode layer formed over the ILD layer 160 is then planarized by using, for example, CMP, until the top surface of the ILD layer 160 is revealed. In some embodiments, after the planarization operation, the metal gate electrode layer 170 is recessed and a cap insulating layer (not shown) is formed over the recessed gate electrode layer. The cap insulating layer includes one or more layers of a silicon nitride-based material, such as SiN. The cap insulating layer can be formed by depositing an insulating material followed by a planarization operation.

It is understood that the GAA FETs undergoes further CMOS processes to form various features such as contacts/vias, interconnect metal layers, dielectric layers, passivation layers, etc.

Figure 28C:
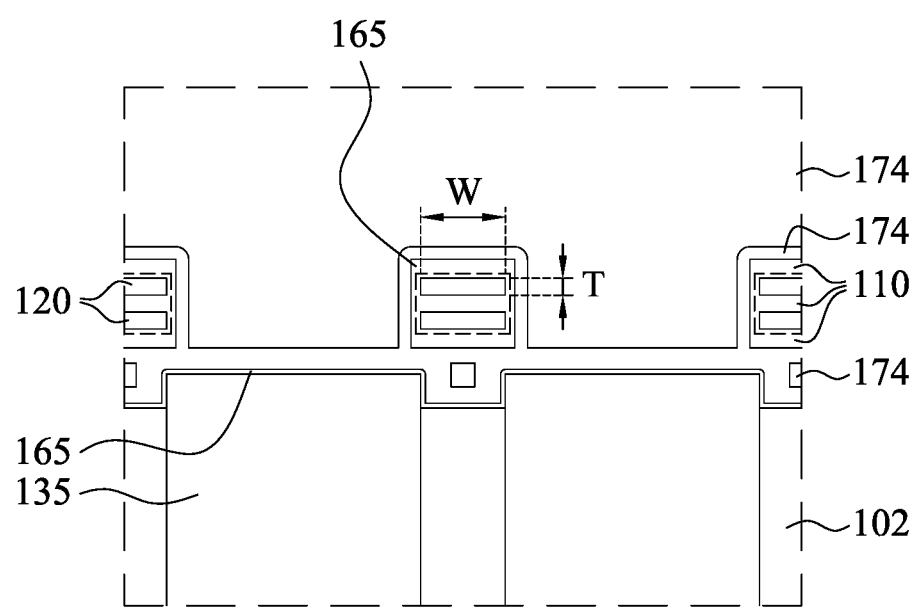
Figure 28D:
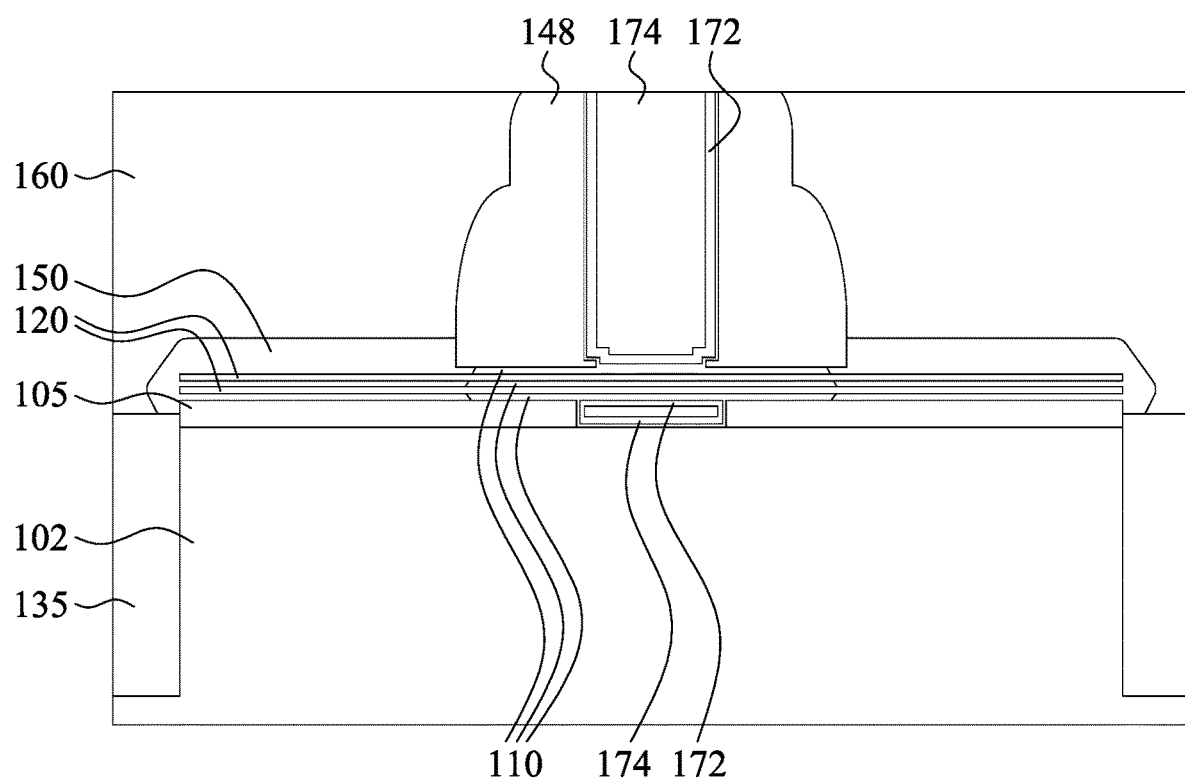

FIG. 28C is a cross sectional view along line A-A' of FIG. 28A and FIG. 28D is a cross sectional view along B-B' of FIG. 28A. As shown in FIG. 28C, the gate dielectric wraps around each of the second semiconductor layers 120. The gate dielectric includes side portions (made of the gate dielectric layer 165) disposed on side surfaces of the channel region of the second semiconductor layer (as a wire) and the crystalline oxide layers 110 disposed on the upper and bottom surfaces of the second semiconductor layers 120. In some embodiments, no work function adjustment layer 172 is disposed between adjacent channel regions of the second semiconductor layers 120. In other words, a space between two adjacent channel regions of the second semiconductor layers 120 is fully filled by the gate dielectric. In some embodiments, wherein a width W and a thickness T of the channel region of the second semiconductor layer 120 satisfy 1<W/T≤20. In other embodiments, 2<W/T≤10.

As shown in FIG. 28D, in the source/drain region, the first semiconductor layer 105 remains between the source/drain region of the second semiconductor layer 120 and the bottom fin structure 102. No single crystal oxide layer is disposed in the source/drain region of the second semiconductor layer 120. In contrast, the first semiconductor layer 105 and the crystalline oxide layers 110 are disposed between bottoms of the sidewall spacers 148 and the bottom fin structure 102.

In the foregoing embodiments, a first semiconductor layer 105 as a sacrificial layer or an intermediate layer is formed. In other embodiments, no first semiconductor layer 105 is formed and one or more pairs of the single crystal oxide layer 110 and the second semiconductor layer 120 are directly formed on the substrate 100.

In the foregoing embodiments, the thicknesses of the top single crystal oxide layer and the bottom-most single crystal oxide layer are adjusted in consideration of the deposition of the gate dielectric layer 165 so that the thickness of the gate dielectric wrapping around the second semiconductor layer 120 is substantially uniform (e.g., ±10%)

FIGS. 29A-32C show various stages of manufacturing a semiconductor FET device according to another embodiment of the present disclosure. It is understood that additional operations can be provided before, during, and after processes shown by FIGS. 29A-32C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-28D may be employed in the embodiment of FIGS. 29A-32C, and detailed explanation thereof may be omitted.

Figure 29A:
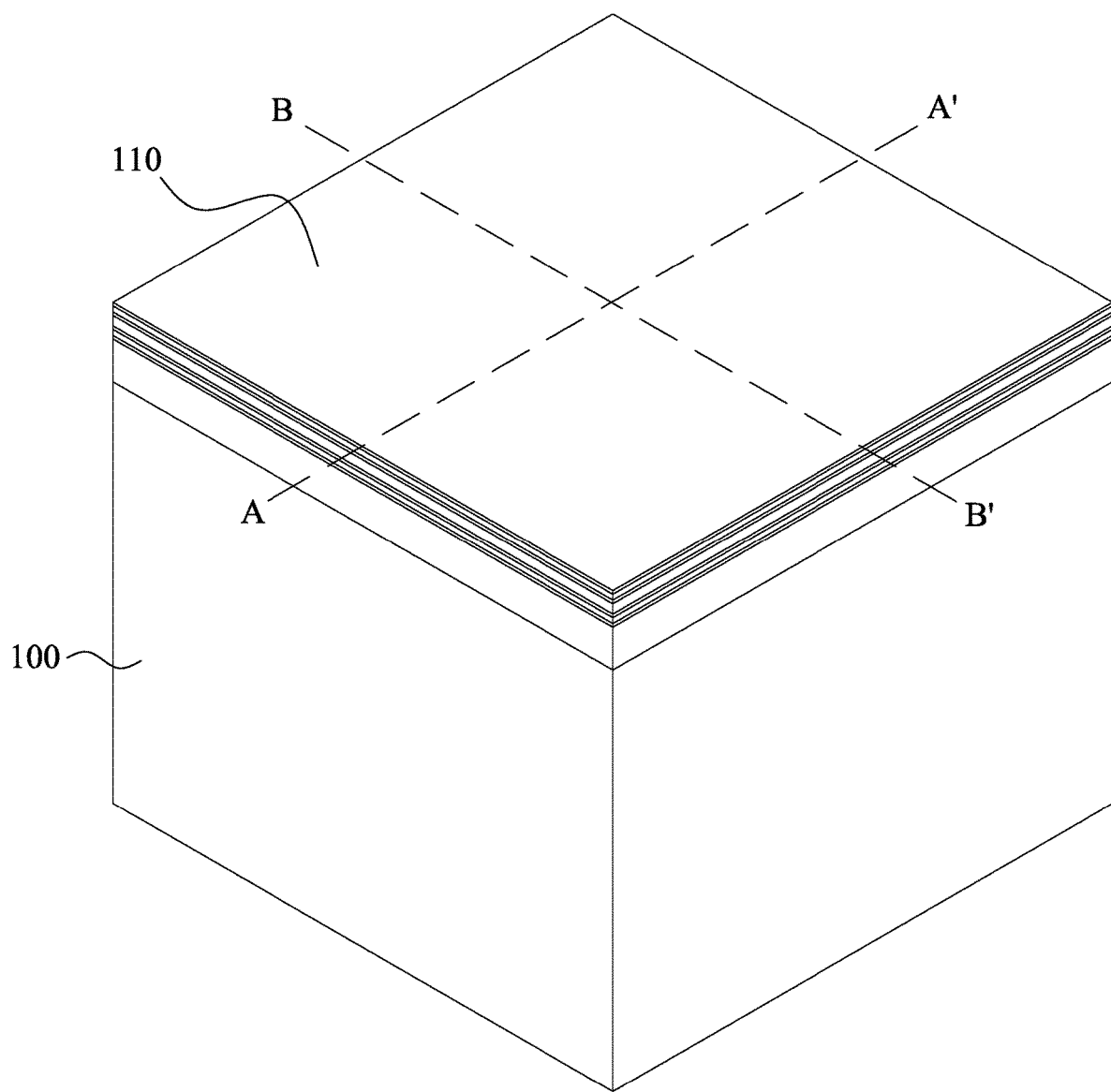
FIGS. 29A and 29B show one of the various stages of manufacturing a semiconductor FET device according to another embodiment of the present disclosure.
Figure 29B:
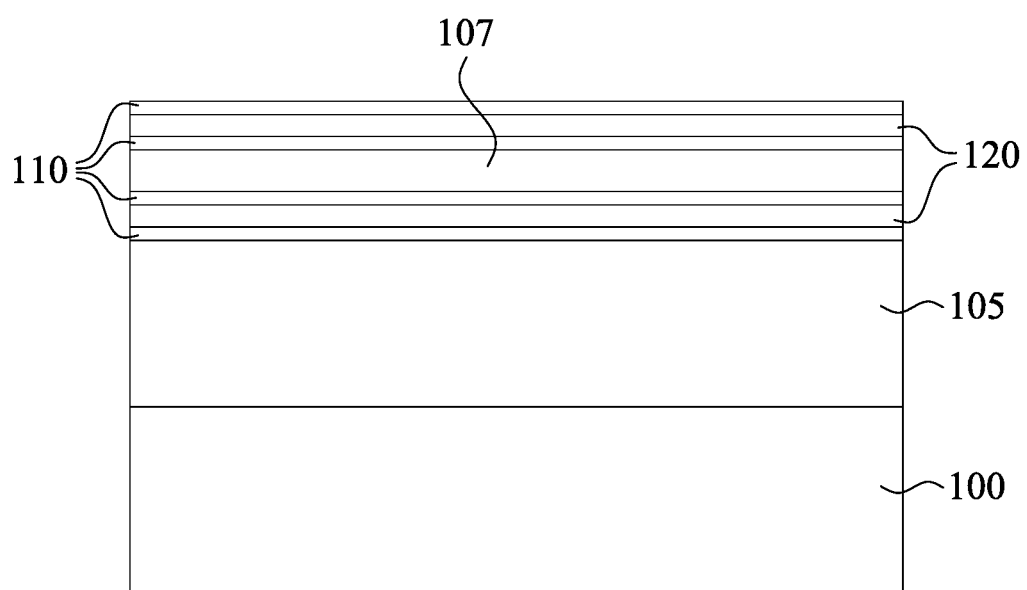

FIG. 29A shows a perspective view of one of the various stages of manufacturing a semiconductor FET device and FIG. 29B shows a cross sectional view along A-A' of FIG. 29A. In this embodiments, after a first semiconductor layer 105 is formed over a semiconductor substrate, one or more stacked structures are formed on the first semiconductor layer 105. Each of the stacked structures includes a bottom single crystal oxide layer 110, a second semiconductor layer 120 on the bottom single crystal oxide layer 110 and a top single crystal oxide layer 110. Further, the one or more stacked structures and one or more third semiconductor layers 107 are alternately formed over the first semiconductor layer 105. In some embodiments, the third semiconductor layer 107 is made of a different material than the substrate 100 and the second semiconductor layer 120. In some embodiments, the third semiconductor layer 107 is made of the same material as the first semiconductor layer 105.

In FIGS. 29A and 29B, two pairs of the stacked structures sandwiching one third semiconductor layer 107 are formed. However, the number of the stacked structures is not limited thereto, and it can be one or more than two. In some embodiments, the number of the stacked structures is up to 20. When the number of stacked structures is N (a natural number), the number of third semiconductor layers is N−1.

Figure 30A:
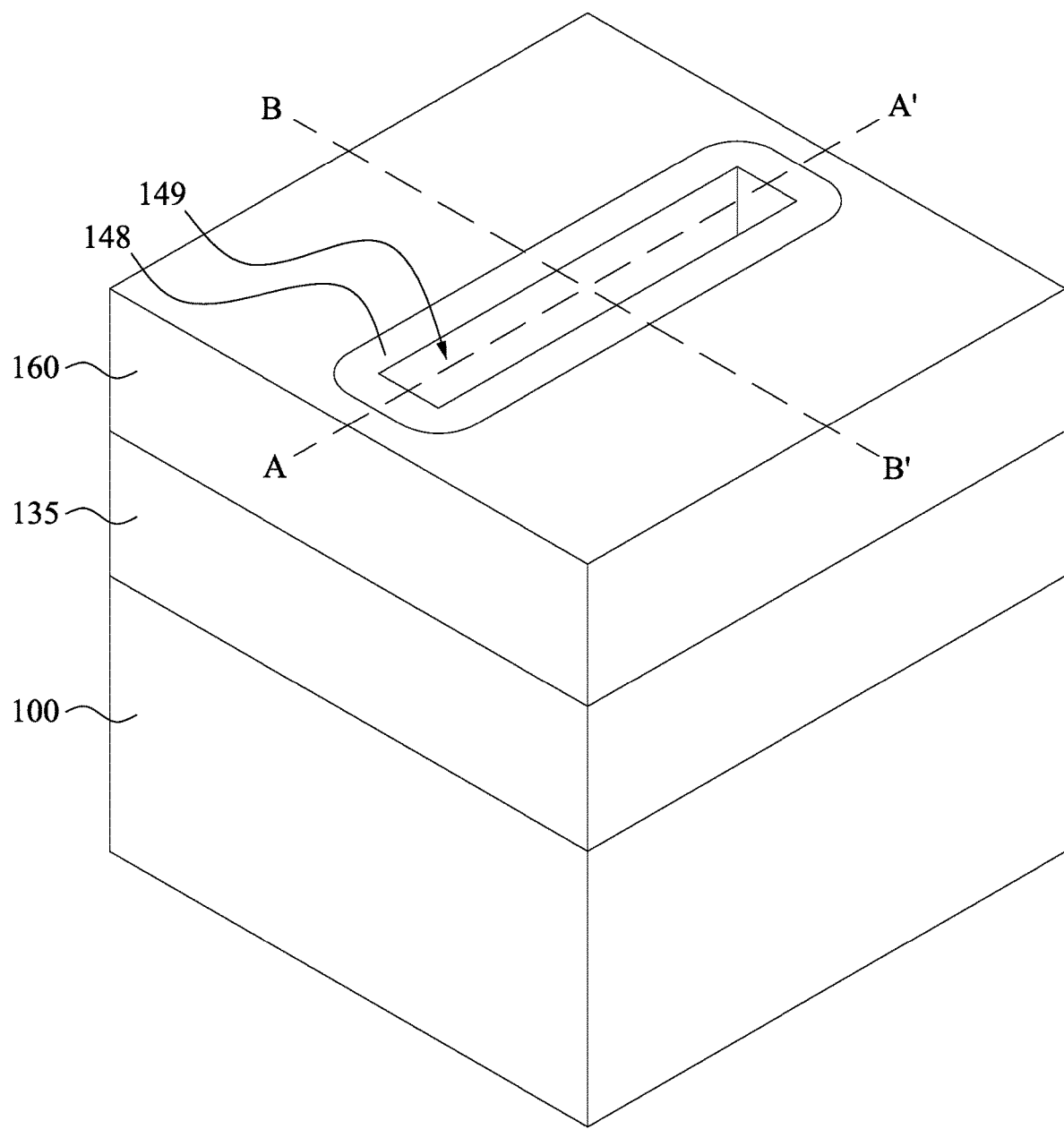
FIGS. 30A, 30B and 30C show one of the various stages of manufacturing a semiconductor FET device according to another embodiment of the present disclosure.
Figure 30B:
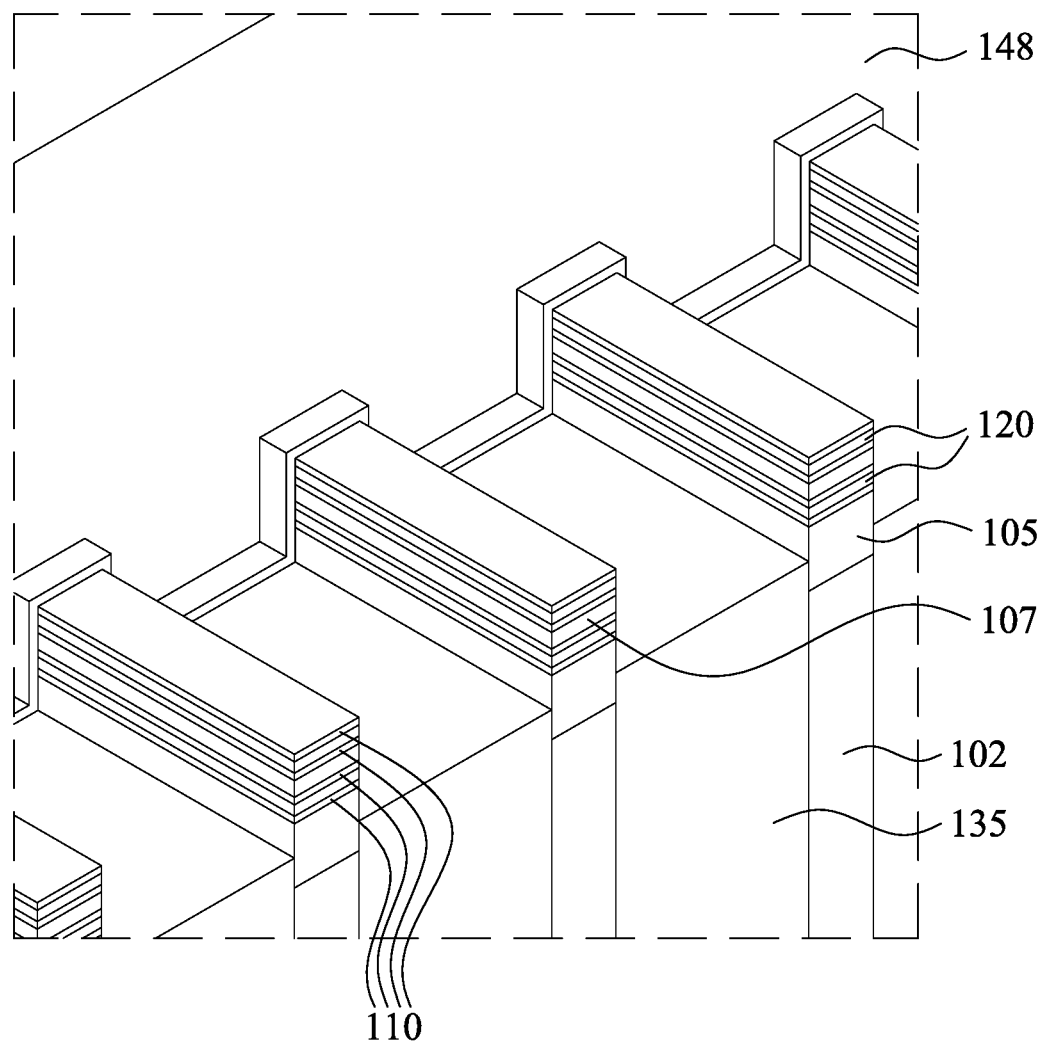
Figure 30C:
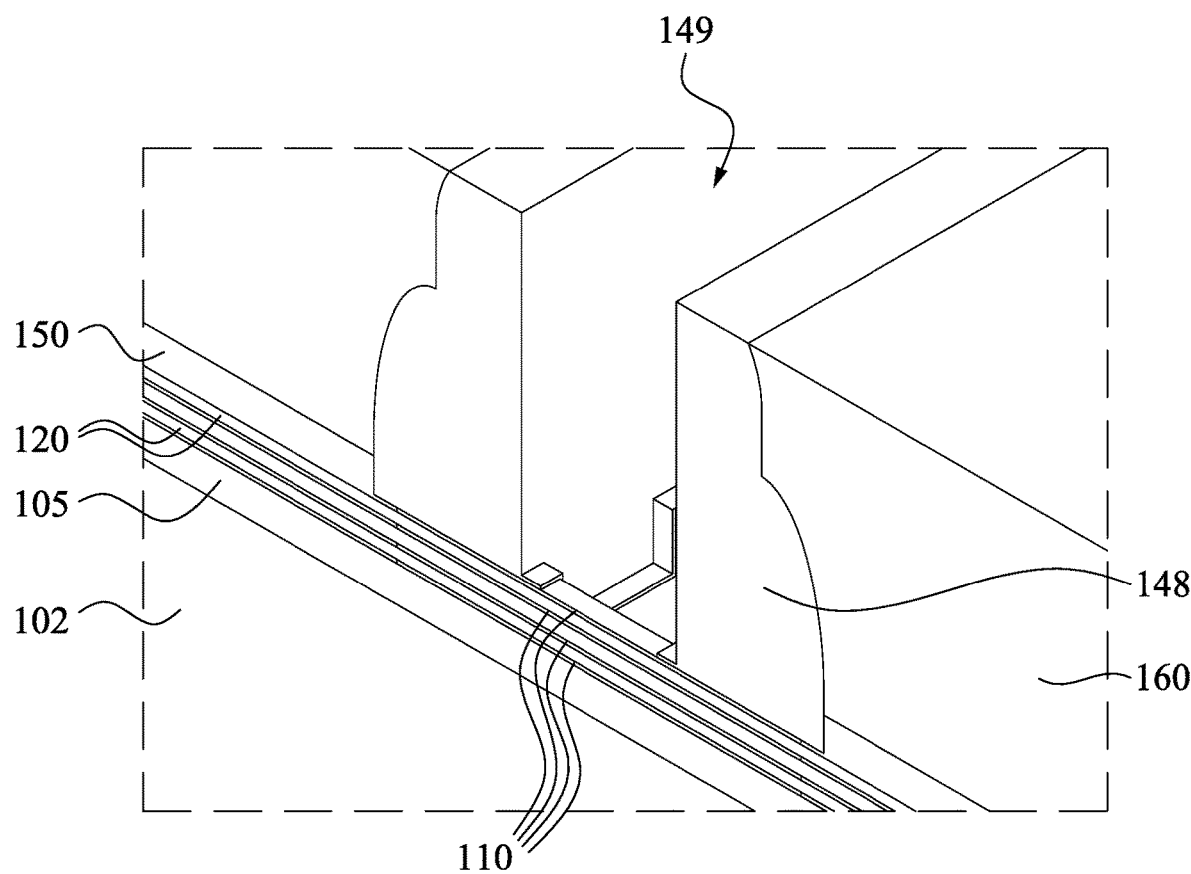
Figure 31A:
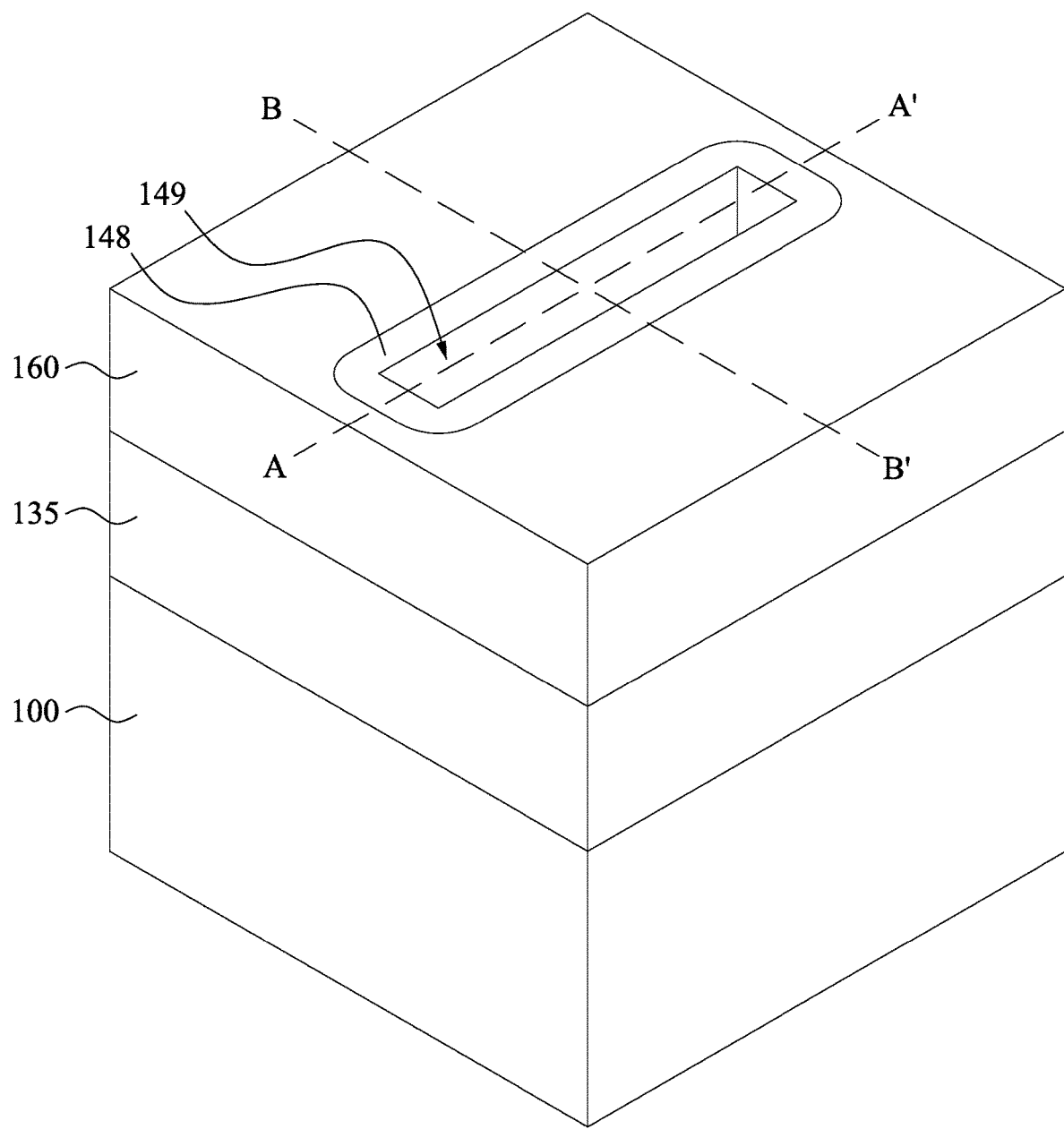
FIGS. 31A, 31B and 31C show one of the various stages of manufacturing a semiconductor FET device according to another embodiment of the present disclosure.
Figure 31B:
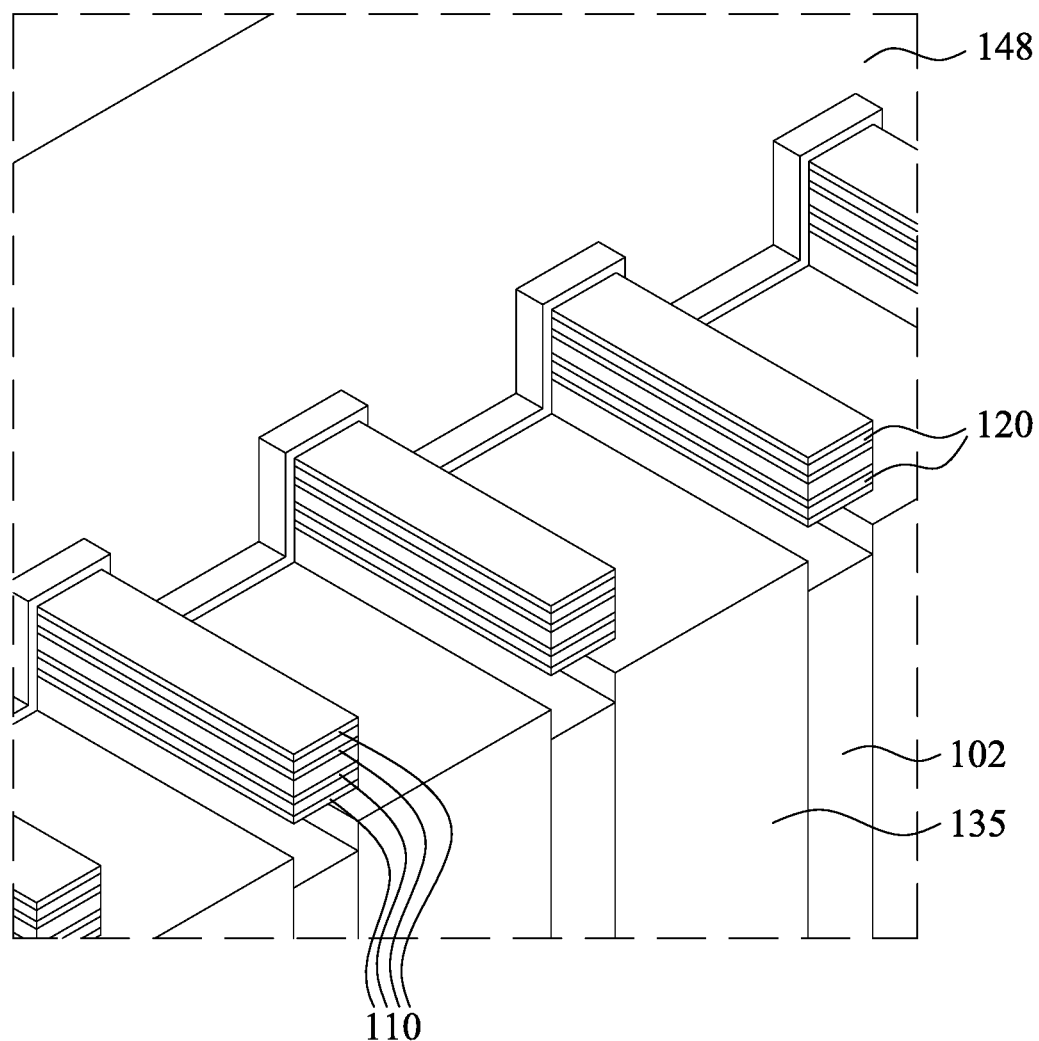
Figure 31C:
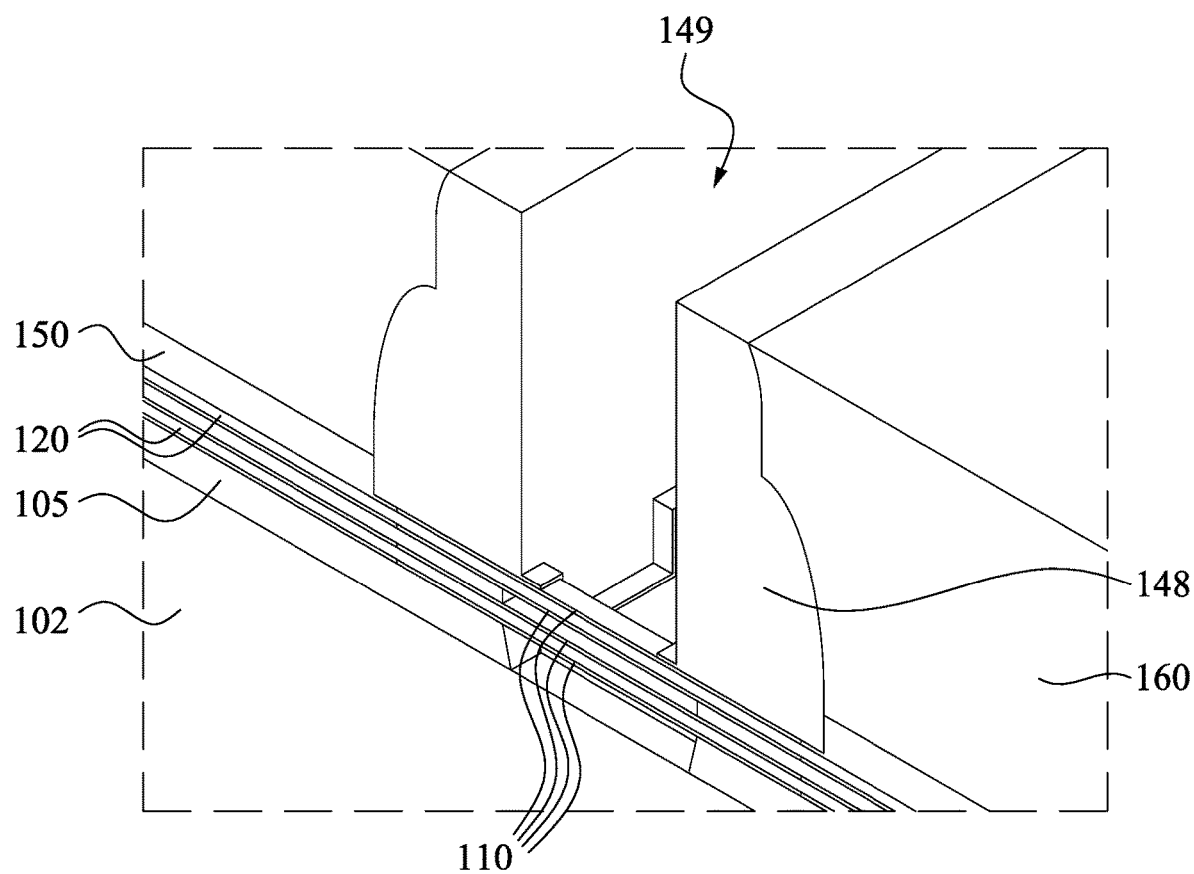

Then, manufacturing operations the same as or similar to those as described with FIGS. 18-25B are performed, and a gate space 149 is formed as shown in FIGS. 30A-30C. FIG. 30A is a perspective view, FIG. 30B shows a cross sectional view in the gate space 149 along line A-A' of FIG. 30A and FIG. 30C shows a cross sectional view along line B-B' of FIG. 30A. After the sacrificial gate structures are removed, the first semiconductor layer 105 and the third semiconductor layer 107 is removed, as shown in FIGS. 31A-31C. FIG. 31A is a perspective view, FIG. 31B shows a cross sectional view in the gate space 149 along line A-A' of FIG. 31A, and FIG. 31C shows a cross sectional view along line B-B' of FIG. 31A. When the first semiconductor layer 105 and the third semiconductor layer 107 are made of a different material than the substrate 100 (bottom fin structure 102) and the second semiconductor layers 120, the first and third semiconductor layers can be selectively removed by a suitable chemical solution. The remaining second semiconductor layers 120 are channel regions of an FET.

Figure 32A:
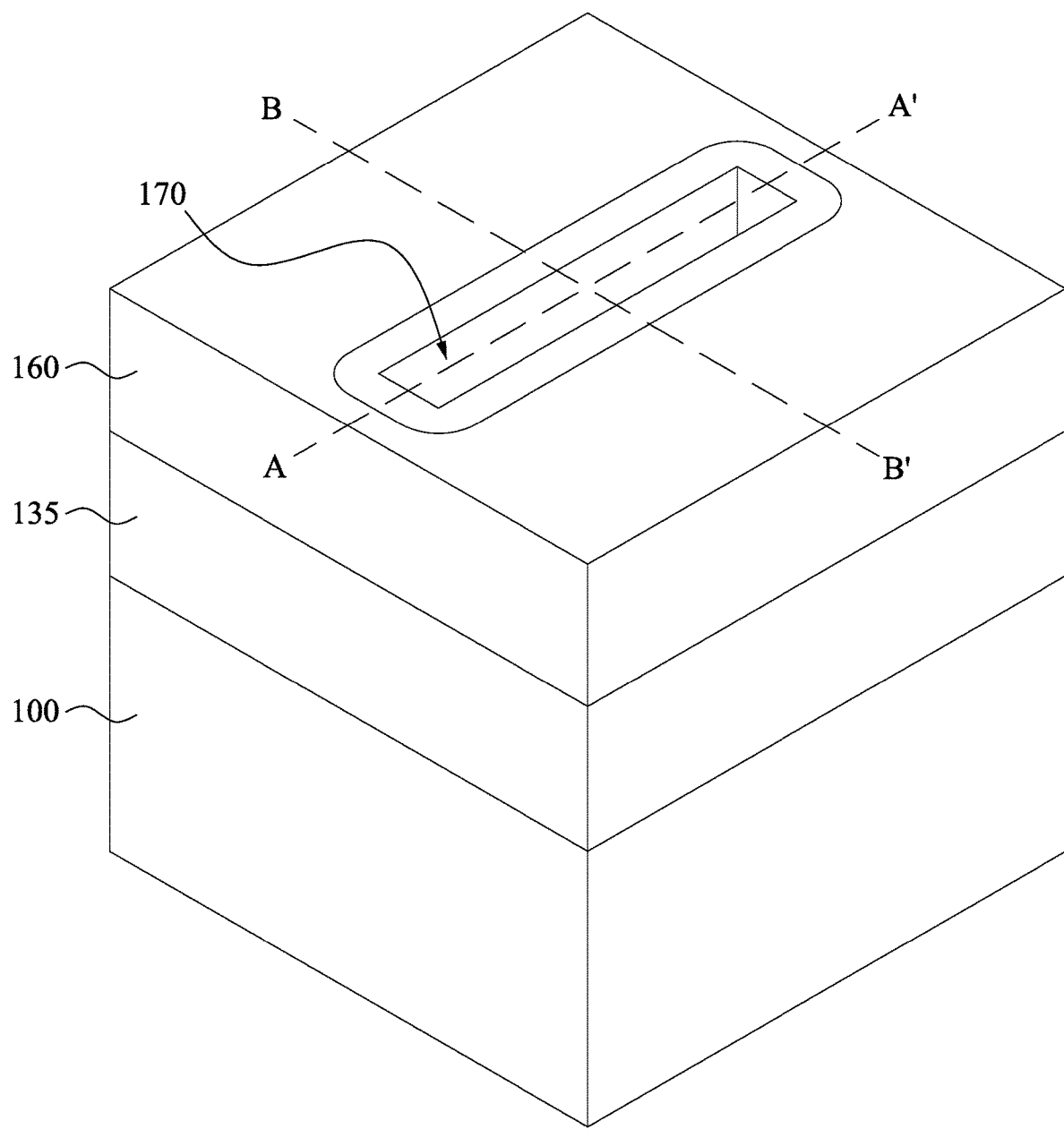
FIGS. 32A, 32B, 32C and 32D show one of the various stages of manufacturing a semiconductor FET device according to another embodiment of the present disclosure.
Figure 32B:
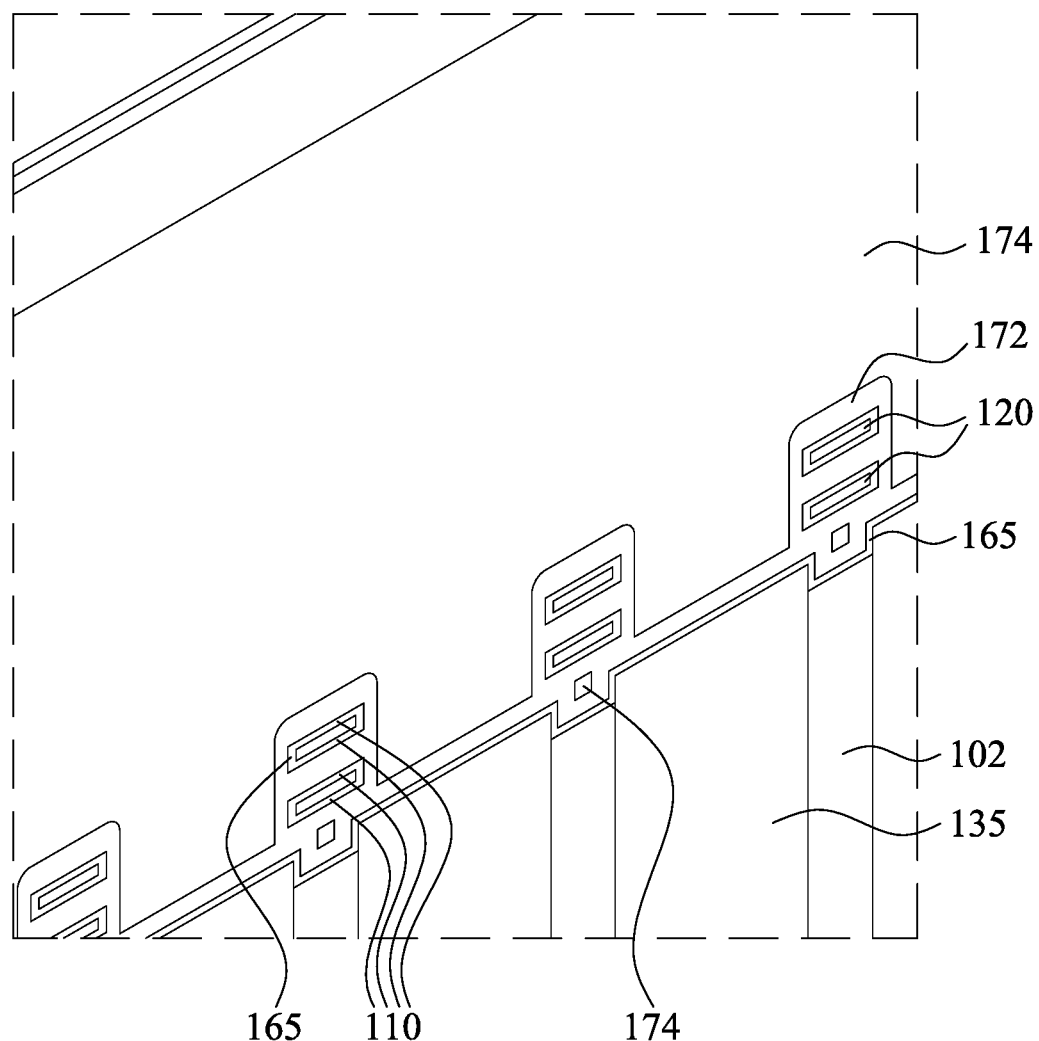
Figure 32C:
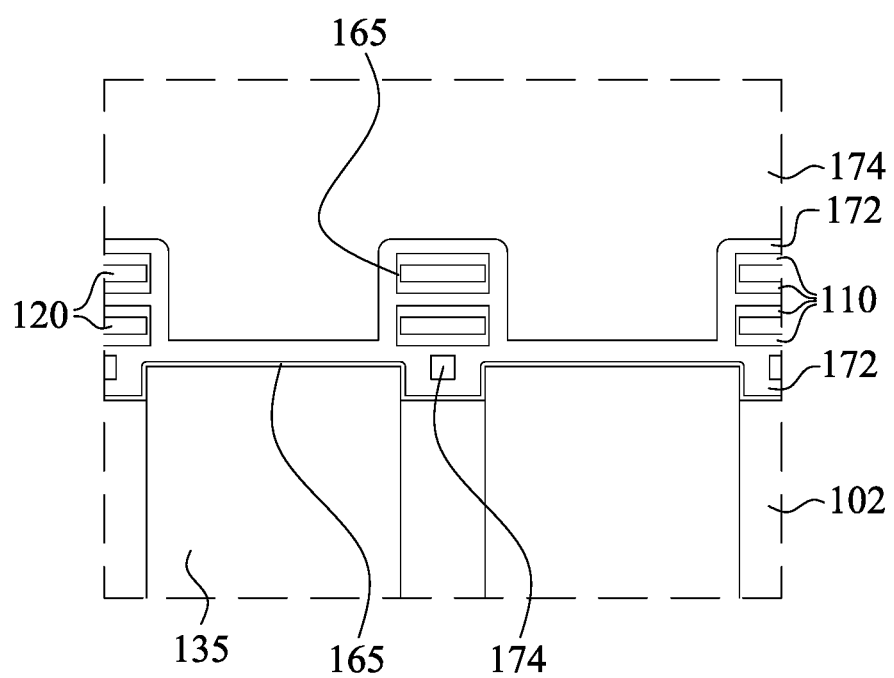
Figure 32D:
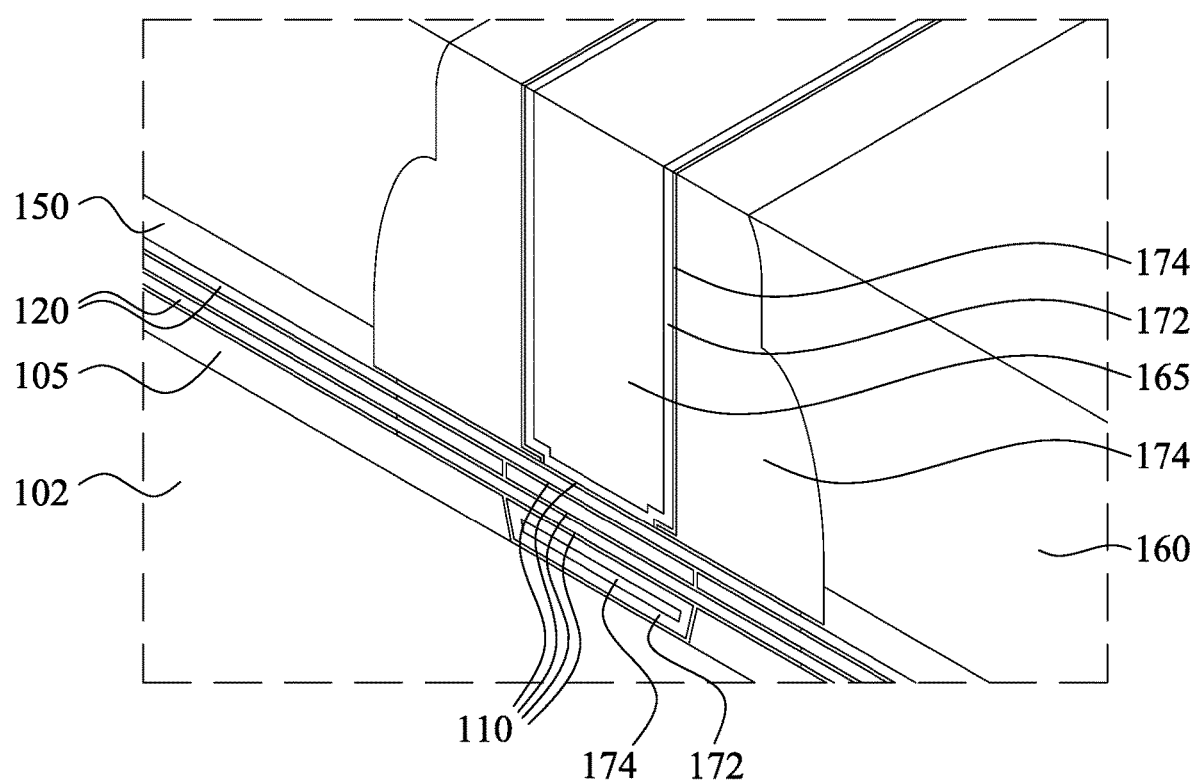

Then, manufacturing operations the same as or similar to those as described with FIGS. 27A-28D are performed, a gate dielectric layer 165 and a metal gate structure 170 are formed in the gate space 149, as shown in FIGS. 32A-32D. FIG. 32A is a perspective view, FIGS. 32B and 32C show cross sectional views in the gate space 149 along line A-A' of FIG. 32A, and FIG. 32D shows a cross sectional view along line B-B' of FIG. 32A. As shown in FIG. 32C, in this embodiments, each of the second semiconductor layers 120 (channel regions) is wrapped around by a gate dielectric (single crystalline oxide layers 110 and gate dielectric layer 165) and at least the work function metal layer 172. In some embodiments, no body metal gate electrode 174 is disposed between the channel regions, and in other embodiments, at least a part of the body metal gate electrode 174 is disposed between the channel regions. The single crystal oxide layer 110 are disposed under the sidewall spacers 148, but are not present in the source/drain regions.

Figure 33C:
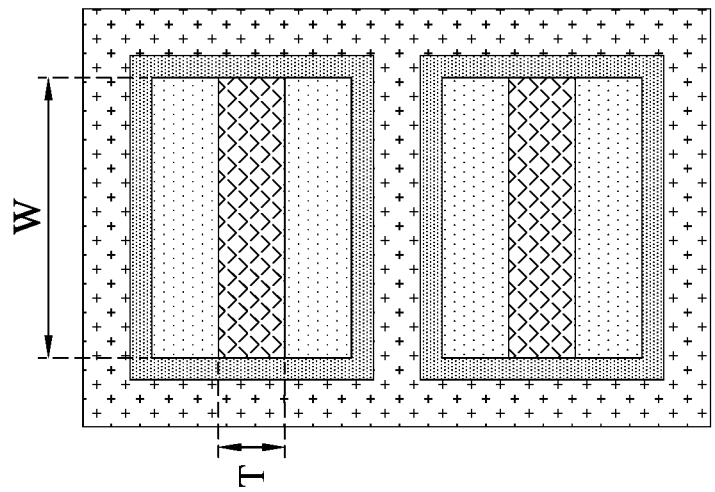
FIGS. 33A, 33B and 33C show various gate structures for semiconductor FET devices according to embodiments of the present disclosure.
Figure 33B:
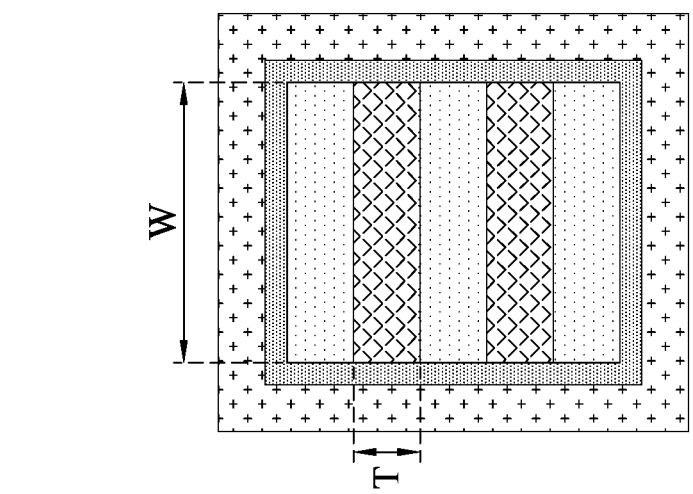
Figure 33A:
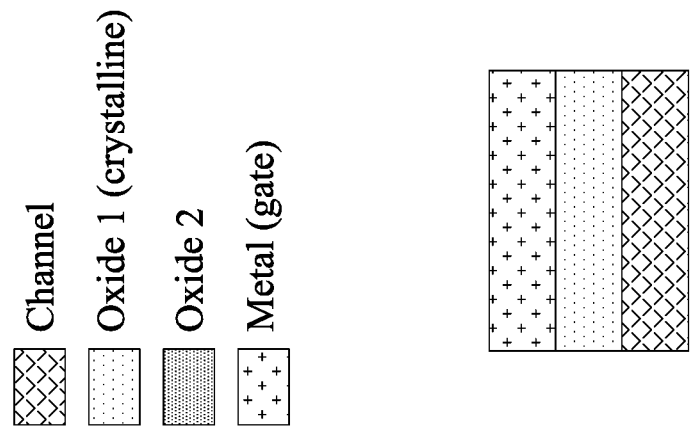

FIGS. 33A-33C show various gate structures according to the embodiments of the present disclosure.

FIG. 33A corresponds to the FET of FIG. 14, FIG. 33B corresponds to the GAA FET of FIGS. 28A-28D and FIG. 33C corresponds to the GAA FET of FIGS. 32A-32D. "Oxide 1" is the single crystal oxide layer and the "Oxide 2" is one of a crystalline, amorphous or polycrystalline oxide layer. In some embodiments, wherein a width W and a thickness T of the channel region satisfy 1<W/T≤20. In other embodiments, 2<W/T≤10. In some embodiments, T is in a range from about 2 nm to about 10 nm and W is in a range from about 5 nm to about 20 nm.

The various embodiments or examples described herein offer several advantages over the existing art. For example, in the present disclosure, a single crystal oxide layer is formed on a flat surface in a device region on which no patterning operation has been performed. This deposition method allows a precise deposition control on an atomic level resulting in single crystal oxide growth on a semiconductor substrate with targeted crystallinity. In some embodiments, the single crystal oxide can be obtained without any additional annealing process. In addition, since the single crystal oxide layer is formed at an early manufacturing stage, once a full crystallinity is achieved for the oxide, any subsequent thermal treatment will not change the crystallinity as long as the process temperature is below the melting point of the oxides (e.g., 2758° C. for $HfO_2$). By using a single crystal oxide layer as gate dielectric, it is possible to obtain an abrupt interface with the channel with no transition regions, and to enable gate length scaling.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a single crystal oxide layer is formed over a substrate. After the single crystal oxide layer is formed, an isolation structure to define an active region is formed. A gate structure is formed over the single crystal oxide layer in the active region. A source/drain structure is formed. In one or more of the foregoing and the following embodiments, the single crystal oxide layer is made of one selected from the group consisting of $HfO_2$, $La_2Hf_2O_7$, $Y_2O_3$, $SrTiO_3$ and $HfZrO_2$. In one or more of the foregoing and the following embodiments, after the gate structure is formed, the single crystal oxide layer formed on a source/drain region is removed. In one or more of the foregoing and the following embodiments, the forming the source/drain structure includes epitaxially forming a source/drain semiconductor epitaxial layer on the source/drain region from which the single crystal oxide layer is removed. In one or more of the foregoing and the following embodiments, the gate structure includes a work function adjustment layer, a gate electrode layer and sidewall spacers, and the single crystal oxide layer is disposed between bottoms of the sidewall spacers and the substrate. In one or more of the foregoing and the following embodiments, the work function adjustment layer is in contact with the sidewall spacers. In one or more of the foregoing and the following embodiments, the single crystal oxide layer is formed at a temperature in a range from 650° C. to 1000° C. In one or more of the foregoing and the following embodiments, further an annealing operation is performed after the single crystal oxide layer is formed at a temperature in a range from 650° C. to 1000° C.

In accordance with another aspect of the present disclosure, in method of manufacturing a semiconductor device, a first semiconductor layer is formed over a semiconductor substrate. One or more pairs of layers of a single crystal oxide layer and a second semiconductor layer on the single crystal oxide layer are formed, followed by forming a top crystalline oxide layer. A fin structure is formed by etching the top crystalline oxide layer, the one or more pairs of layers, the first semiconductor layer and a part of the semiconductor substrate. An isolation insulating layer is formed. A sacrificial gate structure is formed over the fin structure. The top single crystal oxide layer and the single crystal oxide layer in the one or more pair layer are removed in a source/drain region. A source/drain epitaxial layer is formed in the source/drain region. An interlayer dielectric layer is formed. The sacrificial gate structure is removed, thereby forming a gate space. The first semiconductor layer in the one or more pairs of layers is removed in the gate space. A gate dielectric layer is formed in the gate space. A gate electrode structure is formed in the gate space. In one or more of the foregoing and the following embodiments, the single crystal oxide layer and the top single crystal oxide layer are made of one selected from the group consisting of $HfO_2$, $La_2Hf_2O_7$, $Y_2O_3$, $SrTiO_3$ and $HgrO_2$. In one or more of the foregoing and the following embodiments, the first semiconductor layer is made of $Si_xGe_{1-x}$ and the second semiconductor layer is made of $Si_yGe_{1-y}$, where x<y≤1. In one or more of the foregoing and the following embodiments, sidewall spacers are formed on opposite side faces of the sacrificial gate structure. The top single crystal oxide layer and the one or more pairs of layers are present under the sidewall spacers. In one or more of the foregoing and the following embodiments, the gate dielectric layer is made of a same material as the top single crystal oxide layer and the single crystal oxide layer in the one or more pairs of layers. In one or more of the foregoing and the following embodiments, the gate dielectric layer is amorphous. In one or more of the foregoing and the following embodiments, a thickness of the gate dielectric layer is smaller than a thickness of at least one of the top single crystal oxide layer and the single crystal oxide layer in the one or more pairs of layers. In one or more of the foregoing and the following embodiments, a thickness of the top single crystal oxide layer is different from at least one single crystal oxide layer in the one or more pairs of layers. In one or more of the foregoing and the following embodiments, a width W of the second semiconductor layer and a thickness T of the second semiconductor layer satisfy 2<W/T≤10.

In accordance with another aspect of the present disclosure, in method of manufacturing a semiconductor device, a first semiconductor layer is formed over a semiconductor substrate. Stacked structures and one or more third semiconductor layers are alternately formed. Each of the stacked structures includes a bottom crystalline oxide layer, a second semiconductor layer on the bottom single crystal oxide layer and a top crystalline oxide layer. A fin structure is formed by etching the stacked structures, the one or more third semiconductor layers, the first semiconductor layer and a part of the semiconductor substrate. An isolation insulating layer is formed. A sacrificial gate structure is formed over the fin structure. The top single crystal oxide layer and the bottom single crystal oxide layer in the stacked structures are removed in a source/drain region. A source/drain epitaxial layer is formed in the source/drain region. An interlayer dielectric layer is formed. The sacrificial gate structure is removed, thereby forming a gate space. The first semiconductor layer and the one or more third semiconductor layers are removed in the gate space. A gate dielectric layer is formed in the gate space. A gate electrode structure is formed in the gate space. In one or more of the foregoing and the following embodiments, the top and bottom crystalline oxide layers are made of one selected from the group consisting of $HfO_2$, $La_2Hf_2O_7$, $Y_2O_3$, $SrTiO_3$ and $HfZrO_2$. In one or more of the foregoing and the following embodiments, a part of the gate electrode structure is disposed between the bottom single crystal oxide layer in one of the stacked structures and the top single crystal oxide layer in adjacent one of the stacked structures.

In accordance with one aspect of the present disclosure, a semiconductor device includes a channel, a gate dielectric layer disposed over the channel, a gate electrode layer disposed over the gate dielectric layer, sidewall spacers disposed on opposite side faces of the gate electrode layer, and a source and a drain. The gate dielectric layer includes a crystalline oxide and extends below the sidewall spacers. In one or more of the foregoing and the following embodiments, the crystalline oxide is one selected from the group consisting of $HfO_2$, $La_2Hf_2O_7$, $Y_2O_3$, $SrTiO_3$ and $HfZrO_2$. In one or more of the foregoing and the following embodiments, the gate electrode layer includes a work function adjustment layer and a metal gate electrode layer, and the work function adjustment layer is in contact with the sidewall spacers.

In accordance with another aspect of the present disclosure, a gate-all-around field effect transistor (GAA FET) includes a semiconductor wire disposed over a bottom fin structure and including a channel region, a gate dielectric layer wrapping around the channel region, and a gate electrode disposed over the gate dielectric layer. The gate dielectric layer includes a single crystal oxide layer disposed on an upper surface and a bottom surface of the channel region of the semiconductor wire. In one or more of the foregoing and the following embodiments, the single crystal oxide layer is one selected from the group consisting of $HfO_2$, $La_2Hf_2O_7$, $Y_2O_3$, $SrTiO_3$ and $HfZrO_2$. In one or more of the foregoing and the following embodiments, the gate dielectric layer includes side portions disposed on side surfaces of the channel region of the semiconductor wire and made of a same material as the crystalline oxide layer. In one or more of the foregoing and the following embodiments, the side portions of the gate dielectric layer are amorphous. In one or more of the foregoing and the following embodiments, a thickness of the single crystal oxide layer is different from a thickness of the side portions of the gate dielectric layer. In one or more of the foregoing and the following embodiments, the GAA FET further includes a source/drain epitaxial layer wrapping around a source/drain region of the semiconductor wire and disposed over the bottom fin structure. In one or more of the foregoing and the following embodiments, the GAA FET further includes an intermediate semiconductor layer disposed between the source/drain region of the semiconductor wire and the bottom fin structure. In one or more of the foregoing and the following embodiments, the GAA FET further includes sidewall spacers disposed on opposite side faces of the gate electrode. The intermediate layer and the single crystal oxide layer are disposed between bottoms of the sidewall spacers and the bottom fin structure. In one or more of the foregoing and the following embodiments, no single crystal oxide layer is disposed on the source/drain region of the semiconductor wire. In one or more of the foregoing and the following embodiments, the GAA FET further includes one or more additional semiconductor wires, each including a channel region and a source/drain region. The gate dielectric layer wraps around the channel region of each of the one or more additional semiconductor wires. In one or more of the foregoing and the following embodiments, the gate electrode includes a work function adjustment layer and a metal gate electrode layer, and no work function adjustment layer is disposed between adjacent channel regions among the semiconductor wire and the one or more additional semiconductor wires. In one or more of the foregoing and the following embodiments, a width W and a thickness T of the channel region of the semiconductor wire satisfy $2<W/T\le10$.

In accordance with another aspect of the present disclosure, a gate-all-around field effect transistor (GAA FET) includes a first semiconductor wire and a second semiconductor wire disposed over a bottom fin structure and each including a channel region and a source/drain region, a first gate dielectric layer wrapping around the channel region of the first semiconductor layer, a second gate dielectric layer wrapping around the channel region of the second semiconductor layer, and a gate electrode disposed over the first and second gate dielectric layers. Each of the first and second gate dielectric layers includes a single crystal oxide layer disposed on an upper surface and a bottom surface of the channel region. A part of the gate electrode layer is disposed between the channel region of the first semiconductor wire and the channel region of the second semiconductor layer. In one or more of the foregoing and the following embodiments, the single crystal oxide layer is one selected from the group consisting of $HfO_2$, $La_2Hf_2O_7$, $Y_2O_3$, $SrTiO_3$ and $HfZrO_2$. In one or more of the foregoing and the following embodiments, the gate dielectric layer includes side portions disposed on side surfaces of the channel region of the semiconductor wire and made of an amorphous layer of a same material as the crystalline oxide layer. In one or more of the foregoing and the following embodiments, the GAA FET further includes a first intermediate semiconductor layer disposed between the source/drain region of the first semiconductor wire and the bottom fin structure, and a second intermediate semiconductor layer disposed between the source/drain region of the second semiconductor wire and the source/drain region of the first semiconductor layer. In one or more of the foregoing and the following embodiments, a width W and a thickness T of the channel region of each of the first and second semiconductor wires satisfy $2<W/T\le10$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
  a channel;
  a gate dielectric layer disposed over the channel;
  a gate electrode layer disposed over the gate dielectric layer;
  sidewall spacers disposed on opposite side faces of the gate electrode layer; and
  a source and a drain, wherein:
  the gate dielectric layer includes a crystalline oxide that extends below the sidewall spacers and is in contact with bottoms of the sidewall spacers.

2. The semiconductor device of claim 1, wherein the crystalline oxide is one selected from the group consisting of $HfO_2$, $La_2Hf_2O_7$, $Y_2O_3$, $SrTiO_3$ and $HfZrO_2$.

3. The semiconductor device of claim 1, wherein:
the gate electrode layer includes a work function adjustment layer and a metal gate electrode layer, and
the work function adjustment layer is in contact with the sidewall spacers.

4. The semiconductor device of claim 1, wherein the crystalline oxide is disposed on a (100) surface of the channel.

5. A gate-all-around field effect transistor (GAA FET), comprising:
a semiconductor wire disposed over a bottom fin structure and including a channel region;
a gate dielectric layer wrapping around the channel region; and
a gate electrode disposed over the gate dielectric layer,
wherein the gate dielectric layer includes a crystalline oxide layer disposed on and in contact with an upper surface and a bottom surface of the channel region of the semiconductor wire, and an amorphous layer in contact with the channel region.

6. The GAA FET of claim 5, wherein the crystalline oxide layer is one selected from the group consisting of $HfO_2$, $La_2Hf_2O_7$, $Y_2O_3$, $SrTiO_3$ and $HfZrO_2$.

7. The GAA FET of claim 5, wherein the gate dielectric layer includes side portions disposed on side surfaces of the channel region of the semiconductor wire and made of a same material as the crystalline oxide layer.

8. The GAA FET of claim 7, wherein the side portions of the gate dielectric layer are amorphous.

9. The GA FET of claim 7, wherein a thickness of the crystalline oxide layer is different from a thickness of the side portions of the gate dielectric layer.

10. The GAA FET of claim 5, further comprising a source/drain epitaxial layer wrapping around a source/drain region of the semiconductor wire and disposed over the bottom fin structure.

11. The GAA FET of claim 10, further comprising an intermediate semiconductor layer disposed between the source/drain region of the semiconductor wire and the bottom fin structure.

12. The GAA FET of claim 11, further comprising sidewall spacers disposed on opposite side faces of the gate electrode,
wherein the intermediate layer and the crystalline oxide layer are disposed between bottoms of the sidewall spacers and the bottom fin structure.

13. The GAA FET of claim 12, wherein no crystalline oxide layer is disposed on the source/drain region of the semiconductor wire.

14. The GAA FET of claim 5, further comprising one or more additional semiconductor wires, each including a channel region and a source/drain region, wherein:
the gate dielectric layer wraps around the channel region of each of the one or more additional semiconductor wires.

15. The GAA FET of claim 14, wherein:
the gate electrode includes a work function adjustment layer and a metal gate electrode layer, and
no work function adjustment layer is disposed between adjacent channel regions among the semiconductor wire and the one or more additional semiconductor wires.

16. The GAA FET of claim 5, wherein a width W and a thickness T of the channel region of the semiconductor wire satisfy $2<W/T\leq 10$.

17. A gate-all-around field effect transistor (GAA FET), comprising:
a first semiconductor wire and a second semiconductor wire disposed over a bottom fin structure and each including a channel region and a source/drain region;
a gate dielectric layer disposed over the channel region of each of the first and second semiconductor wires; and
a gate electrode disposed over the gate dielectric layer, wherein:
the gate dielectric layer includes a single crystal oxide layer disposed on an upper surface of the channel region of the second semiconductor wire, a bottom surface of the channel region of the first and second semiconductor wire, and between the channel regions of the first and second semiconductor wires, and side portions disposed on side surfaces of the channel region of each of the first and second semiconductor wires and made of an amorphous layer of a same material as the single crystal oxide layer.

18. The GAA FET of claim 17, wherein no part of the gate electrode layer is disposed between the channel region of the first semiconductor wire and the channel region of the second semiconductor wire.

19. The GAA FET of claim 17, wherein the single crystal oxide layer is an oxide including Hf.

20. The GAA FET of claim 17, wherein the amorphous layer is also disposed on the bottom fin structure.

* * * * *